(12) United States Patent
Nishimura et al.

(10) Patent No.: US 11,070,752 B2
(45) Date of Patent: Jul. 20, 2021

(54) IMAGING DEVICE INCLUDING FIRST AND SECOND IMAGING CELLS AND CAMERA SYSTEM

(71) Applicant: Panasonic Intellectual Property Management Co., Ltd., Osaka (JP)

(72) Inventors: Kazuko Nishimura, Kyoto (JP); Sanshiro Shishido, Osaka (JP); Hidenari Kanehara, Kyoto (JP); Takayoshi Yamada, Hyogo (JP); Masashi Murakami, Kyoto (JP); Yasunori Inoue, Osaka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 0 days.

(21) Appl. No.: 15/867,986

(22) Filed: Jan. 11, 2018

(65) Prior Publication Data

US 2018/0205896 A1   Jul. 19, 2018

(30) Foreign Application Priority Data

Jan. 19, 2017   (JP) .............................. JP2017-007736

(51) Int. Cl.
  *H04N 5/355*     (2011.01)
  *H01L 27/146*   (2006.01)
  (Continued)

(52) U.S. Cl.
  CPC ... *H04N 5/35518* (2013.01); *H01L 27/14665* (2013.01); *H04N 5/355* (2013.01);
  (Continued)

(58) Field of Classification Search
  CPC .......... H04N 5/35563; H04N 5/35518; H04N 5/355; H04N 5/378; H04N 5/363;
  (Continued)

(56) References Cited

U.S. PATENT DOCUMENTS

| 4,647,975 A | 3/1987 | Alston et al. |
| 2003/0034434 A1 | 2/2003 | Simony |

(Continued)

FOREIGN PATENT DOCUMENTS

| JP | 62-108678 | 5/1987 |
| JP | 7-115643 | 5/1995 |

(Continued)

*Primary Examiner* — Albert H Cutler
(74) *Attorney, Agent, or Firm* — McDermott Will & Emery LLP

(57) ABSTRACT

An imaging device includes: a first imaging cell including a first photoelectric converter that generates a first signal by photoelectric conversion, and a first signal processing circuit that is electrically connected to the first photoelectric converter and detects the first signal; and a second imaging cell including a second photoelectric converter that generates a second signal by photoelectric conversion, and a second signal processing circuit that is electrically connected to the second photoelectric converter and detects the second signal. Sensitivity of the first imaging cell is higher than sensitivity of the second imaging cell. The first signal processing circuit has a circuit configuration different from the second signal processing circuit. An operation frequency of the first signal processing circuit is different from an operation frequency of the second signal processing circuit.

21 Claims, 74 Drawing Sheets

(51) Int. Cl.
*H04N 5/363* (2011.01)
*H04N 5/378* (2011.01)
*H01L 29/423* (2006.01)
*H04N 5/225* (2006.01)
*H04N 5/235* (2006.01)
*H04N 5/335* (2011.01)

(52) U.S. Cl.
CPC ......... *H04N 5/35563* (2013.01); *H04N 5/363* (2013.01); *H04N 5/378* (2013.01); *H01L 27/14643* (2013.01); *H01L 29/42372* (2013.01)

(58) Field of Classification Search
CPC ............ H04N 5/3696; H01L 27/14665; H01L 27/14643; H01L 29/42372
USPC ........................................................ 348/308
See application file for complete search history.

(56) References Cited

U.S. PATENT DOCUMENTS

| | | | | |
|---|---|---|---|---|
| 2006/0181627 | A1* | 8/2006 | Farrier | H04N 5/35545 348/308 |
| 2008/0173794 | A1* | 7/2008 | Oike | H04N 5/335 250/208.1 |
| 2008/0297609 | A1* | 12/2008 | Song | H04N 3/155 348/207.99 |
| 2009/0059051 | A1 | 3/2009 | Sakamoto | |
| 2009/0190017 | A1 | 7/2009 | Ono | |
| 2009/0244348 | A1* | 10/2009 | Moholt | H04N 5/3728 348/308 |
| 2011/0049591 | A1* | 3/2011 | Nakatani | H04N 5/363 257/292 |
| 2011/0074995 | A1* | 3/2011 | Rafferty | H04N 5/35563 348/308 |
| 2011/0199106 | A1 | 8/2011 | Lotto et al. | |
| 2011/0228149 | A1* | 9/2011 | Naruse | H01L 27/14627 348/273 |
| 2011/0242381 | A1* | 10/2011 | Sakakibara | H04N 5/355 348/301 |
| 2013/0033631 | A1 | 2/2013 | Mabuchi | |
| 2013/0107094 | A1 | 5/2013 | Yamamoto et al. | |
| 2013/0182173 | A1* | 7/2013 | Murata | H01L 27/14605 348/349 |
| 2014/0346321 | A1 | 11/2014 | Kinugasa | |
| 2015/0109503 | A1 | 4/2015 | Mori et al. | |
| 2016/0006965 | A1* | 1/2016 | Lee | H04N 5/3575 348/308 |
| 2016/0037093 | A1* | 2/2016 | Mandelli | H04N 5/32 348/296 |
| 2016/0105622 | A1 | 4/2016 | Tamaki | |
| 2016/0190187 | A1 | 6/2016 | Nishimura et al. | |
| 2017/0214873 | A1 | 7/2017 | Nishimura et al. | |
| 2018/0020172 | A1* | 1/2018 | Hirota | H01L 27/14605 |
| 2019/0075261 | A1* | 3/2019 | Machida | H04N 5/3745 |
| 2019/0096933 | A1* | 3/2019 | Kido | H01L 27/14607 |

FOREIGN PATENT DOCUMENTS

| | | |
|---|---|---|
| JP | 2003-051986 A | 2/2003 |
| JP | 2007-059465 | 3/2007 |
| JP | 2007-214832 | 8/2007 |
| JP | 2008-099073 | 4/2008 |
| JP | 2009-060342 | 3/2009 |
| JP | 2009-272820 | 11/2009 |
| JP | 2011-166792 | 8/2011 |
| JP | 2012-019167 | 1/2012 |
| JP | 2013-034045 | 2/2013 |
| JP | 2013-145905 A | 7/2013 |
| JP | 2014-230212 | 12/2014 |
| JP | 2016-076921 A | 5/2016 |
| JP | 2016-127593 A | 7/2016 |
| JP | 2017-135696 | 8/2017 |
| WO | 2014/002330 A1 | 1/2014 |

* cited by examiner

IMAGING DEVICE INCLUDING FIRST AND SECOND IMAGING CELLS AND CAMERA SYSTEM

BACKGROUND

1. Technical Field

The present disclosure relates to an imaging device and a camera system.

2. Description of the Related Art

A dynamic range of a subject in nature is wide. Brightness of a subject changes from moment to moment. For example, an on-board imaging device is required to image a bright subject and a dark subject concurrently, i.e., required to have a wide dynamic range. For example, the following methods have been proposed in order to achieve a wide dynamic range.

A silicon photodiode is used in imaging devices disclosed in Japanese Unexamined Patent Application Publication No. 62-108678 and Japanese Unexamined Patent Application Publication No. 2008-99073. In Japanese Unexamined Patent Application Publication No. 62-108678, a wide dynamic range can be obtained by synthesizing images that are different in terms of an exposure period (hereinafter sometimes referred to as an "accumulation period"). This method has been already put into practical use. In Japanese Unexamined Patent Application Publication No. 2008-99073, a dynamic range is widened by synthesizing images obtained from a plurality of imaging cells having different degrees of sensitivity that are disposed in each pixel.

Japanese Unexamined Patent Application Publication No. 2007-59465 proposes a stacked sensor having a photoelectric conversion film instead of a silicon photodiode that hinders a wide dynamic range.

SUMMARY

There are demands for a wider dynamic range.

One non-limiting and exemplary embodiment provides an imaging device and a camera system that allow wide dynamic range imaging.

In one general aspect, the techniques disclosed here feature an imaging device including: a first imaging cell including a first photoelectric converter that generates a first signal by photoelectric conversion, and a first signal processing circuit that is electrically connected to the first photoelectric converter and detects the first signal; and a second imaging cell including a second photoelectric converter that generates a second signal by photoelectric conversion, and a second signal processing circuit that is electrically connected to the second photoelectric converter and detects the second signal. Sensitivity of the first imaging cell is higher than sensitivity of the second imaging cell. The first signal processing circuit has a circuit configuration different from the second signal processing circuit. An operation frequency of the first signal processing circuit is different from an operation frequency of the second signal processing circuit.

It should be noted that general or specific embodiments may be implemented as an element, a device, an apparatus, a system, an integrated circuit, a method, or any selective combination thereof.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

DETAILED DESCRIPTION

First, problems of the conventional arts found by the inventor of the present invention are described below.

In image synthesis disclosed in Japanese Unexamined Patent Application Publication No. 62-108678, a plurality of image data are sequentially acquired. This requires a period that is several times longer than a general imaging period in order to obtain a single synthetic image. Furthermore, since images that are acquired at different times are synthesized, concurrency of the images is impaired. This distorts an image of a moving subject.

In Japanese Unexamined Patent Application Publication No. 2008-99073, a plurality of photodiodes that have the same size are used. The photodiodes are the same in terms of sensitivity and the number of saturation electrons. An on-chip structure having an on-chip top lens that separates amounts of light entering the respective photodiodes into large and small ones is employed. According to this configuration, the plurality of imaging cells appear to have different degrees of effective sensitivity. Since two cells are mounted in each pixel, images can be taken concurrently, and therefore concurrency of the images is secured.

However, since two cells need be disposed in each pixel, the area of each photodiode need to be equal to or smaller than ½ of that of a conventional art. The area of a photodiode is proportional to sensitivity or the number of saturation electrons. Accordingly, in a case where the area of a photodiode is ½ or smaller, the sensitivity and the number of saturation electrons are also equal to or smaller than ½ of those of a conventional art. In order to obtain the same degree of sensitivity as the conventional art, the area of a whole imaging area need to be increased since the same area as a conventional photodiode is needed.

Figure 1:
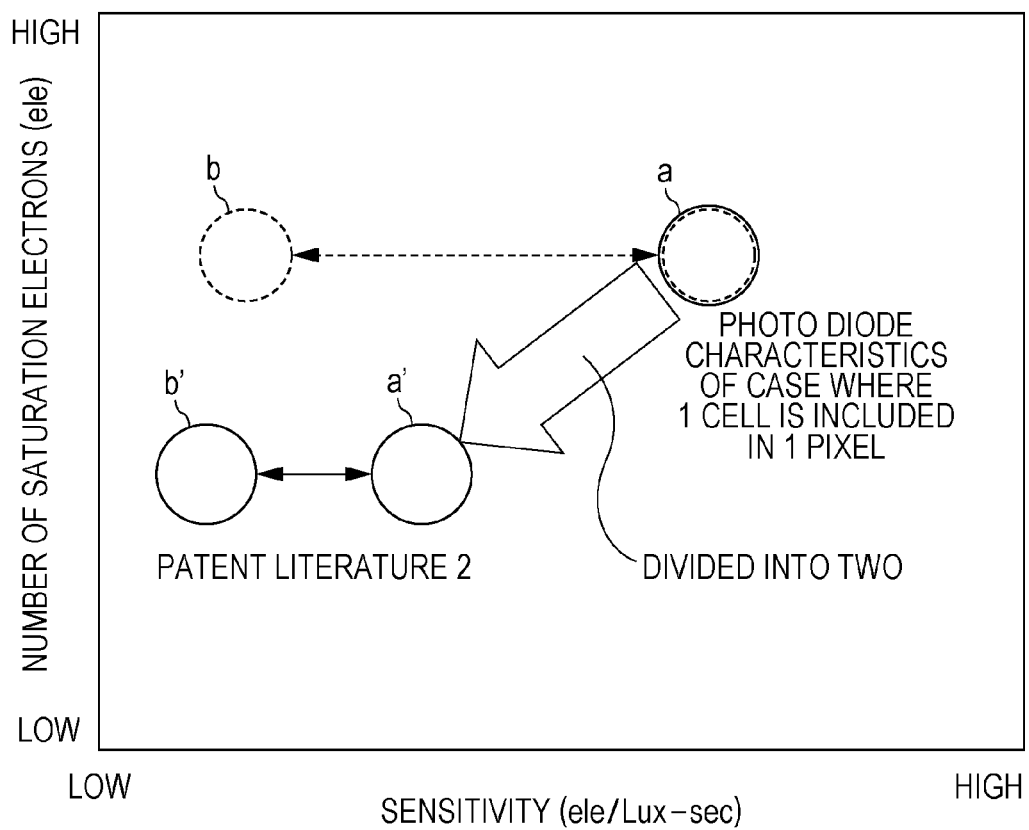
FIG. 1 is a diagram illustrating conventional imaging cell characteristics and desired imaging cell characteristics.

FIG. 1 schematically illustrates conventional imaging cell characteristics and desirable imaging cell characteristics. In FIG. 1, the horizontal axis represents sensitivity, and the vertical axis represents the number of saturation electrons. The "sensitivity" as used herein is one of indices indicative of characteristics of an imaging device and refers to the number of electric charges generated in an imaging cell in response to incident light. A specific example of the imaging device is an image sensor. The electric charges are, in other words, electron-hole pairs. The sensitivity is generally expressed in a unit "ele/Lux-sec". The "number of saturation electrons" as used herein refers to an allowable number of electrons accumulated in an imaging cell and is expressed in a unit "ele". In principle, the sensitivity and the number of saturation electrons are proportional to an effective area of a photoelectric conversion element. The sensitivity also depends on design of a microlens.

A cell having a single imaging cell within a single pixel is hereinafter referred to as a "general cell". In wide dynamic range imaging, it is desirable that two imaging cells within a single pixel have (a) imaging cell characteristics that are in the same level in terms of sensitivity and the number of saturation electrons as the general cell and (b) imaging cell characteristics that are in the same level in terms of the number of saturation electrons as the general cell and are lower in terms of sensitivity than the general cell. The combination of (a) and (b) in FIG. 1 is a desirable combination of two imaging cells.

The combination of a' and b' in FIG. 1 is a combination of two imaging cells in Japanese Unexamined Patent Application Publication No. 2008-99073. As described above, the area of each imaging cell is equal to or smaller than ½ of that of the general cell. Accordingly, the sensitivity of each imaging cell decreases, and the number of saturation electrons also decreases. This means that the imaging cell characteristics are deviated from desirable ones. That is, the imaging cell characteristics in Japanese Unexamined Patent Application Publication No. 2008-99073 are much inferior to requested ones.

Figure 2:
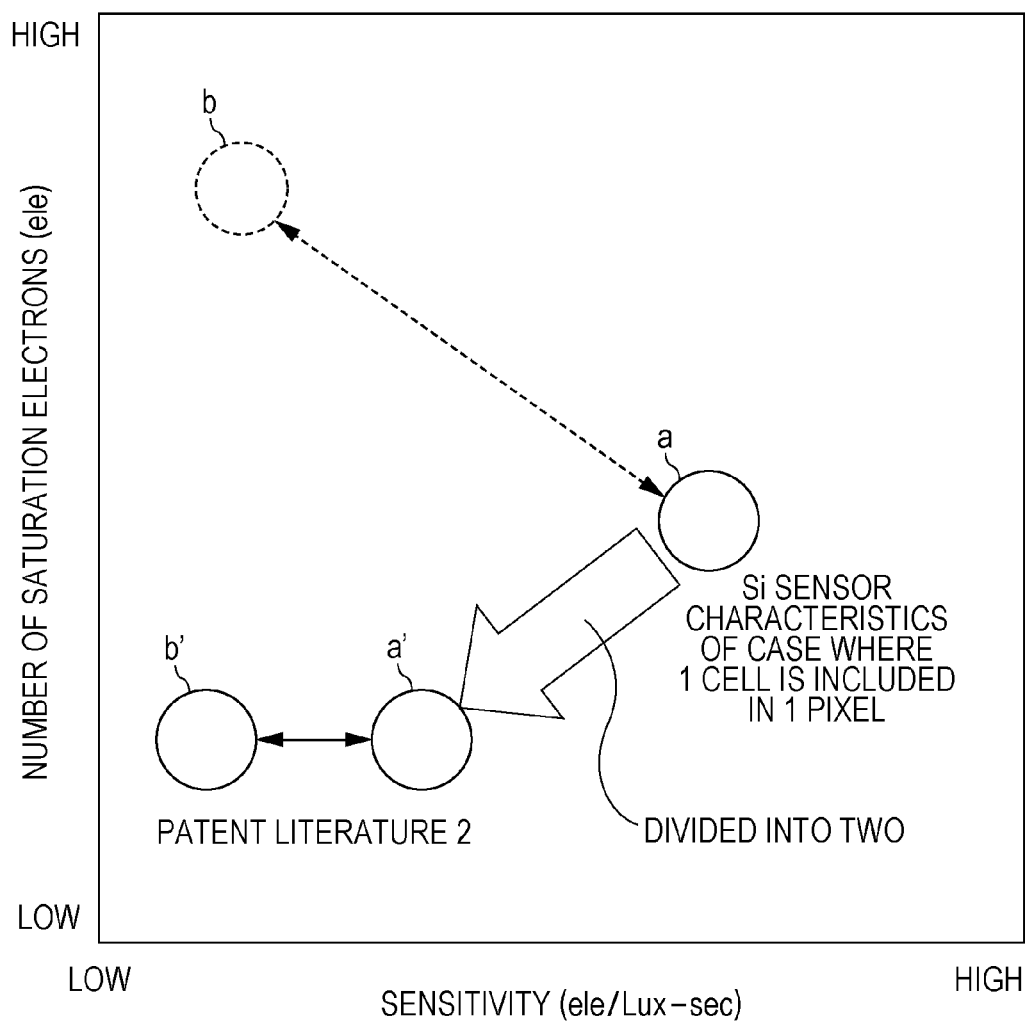
FIG. 2 is a diagram illustrating conventional imaging cell characteristics and more desired imaging cell characteristics.

FIG. 2 schematically illustrates conventional imaging cell characteristics and more desirable imaging cell characteristics. Saturation that can occur in a case where an amount of incident light is large is mitigated by lowering sensitivity. In addition, if the number of saturation electrons can be increased, a dynamic range is further widened.

Table 1 illustrates factors determining element functions and sensor performance while comparing a conventional Si sensor having a photodiode and a stacked sensor having a photoelectric conversion film disclosed in Japanese Unexamined Patent Application Publication No. 2007-59465. As is clear from Table 1, in the conventional Si sensor, both of the sensitivity and the number of saturation electrons are determined by performance of the photodiode. Meanwhile, in the stacked sensor having a photoelectric conversion film, the sensitivity depends on the area of the photoelectric conversion film and quantum efficiency thereof, and the number of saturation electrons depends on the capacity of an electric charge storage node. Accordingly, as the capacity of the electric charge storage node increases, the number of saturation electrons increases. However, an increase in capacity of the electric charge storage node has a large side effect.

TABLE 1

|  |  | Conventional Si sensor | Photoelectric conversion film sensor |
|---|---|---|---|
| Element functions | Photoelectric conversion | Photodiode | Photoelectric conversion film |
|  | Electric charge storage | Photodiode | Electric charge storage node |
|  | Signal readout (gate voltage amplified by Tr) | Floating diffusion | Electric charge storage node |
| Sensor performance | Sensitivity | Depend on quantum efficiency of photodiode | Depend on quantum efficiency of photoelectric conversion film |
|  | Number of saturation electrons | Depend on capacity of photodiode | Depend on capacity of electric charge storage node |

Figure 3:
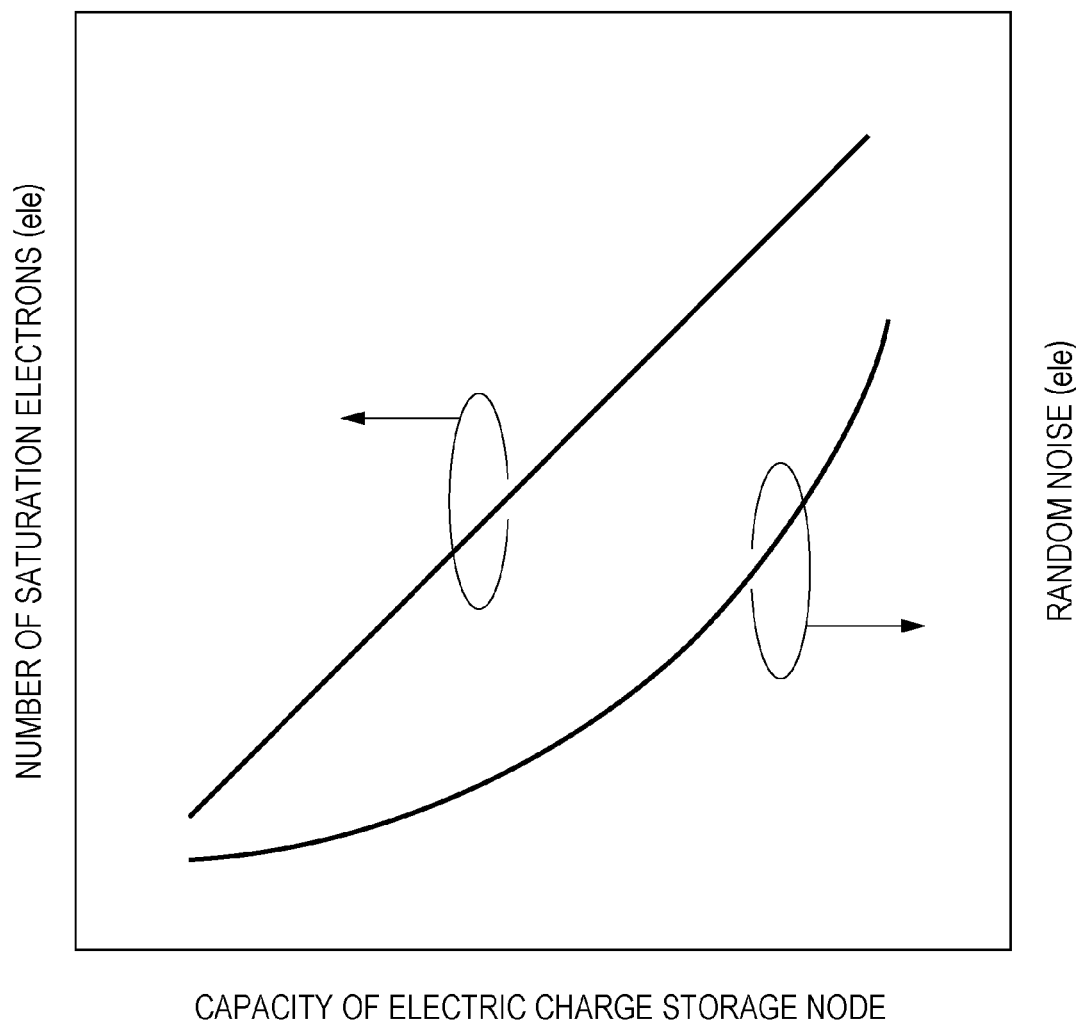
FIG. 3 is a diagram schematically illustrating a relationship among the capacitance of an electric charge storage node, the number of saturation electrons (ele), and random noise (ele)

FIG. 3 schematically illustrates a relationship among the capacity of an electric charge storage node, the number of saturation electrons (ele), and random noise (ele). In FIG. 3, the horizontal axis represents the capacity of an electric charge storage node, and the vertical axis represents the number of saturation electrons and random noise. It is possible to increase the number of saturation electrons by increasing the capacity of an electric charge storage node, but random noise also undesirably increases.

The random noise includes noise that occurs when an electric charge stored in an electric charge storage node is read out (i.e., transferred) by an electric charge sensing circuit and noise (hereinafter referred to as "kTC noise") that occurs when an electric charge stored in the electric charge storage node is reset by the electric charge sensing circuit. In a case where the capacity of the electric charge storage node is increased, the number of saturation electrons can be increased, but a ratio of the amount of change of the voltage of the electric charge storage node to the amount of change of the number of stored electric charges per unit volume decreases. Noise that occurs in the electric charge sensing circuit is voltage noise, and as a result, noise converted into the number of electric charges undesirably increases.

In a sensor using a silicon photodiode for photoelectric conversion, complete electric charge transfer is achieved, and therefore correlated double sampling (CDS) is effective for suppression of kTC noise. Meanwhile, in the stacked sensor using a photoelectric conversion film, complete electric charge transfer cannot be achieved, and therefore kTC noise cannot be cancelled by using CDS. This requires noise cancelling using feedback proposed, for example, in Japanese Unexamined Patent Application Publication No. 2012-19167. However, since a ratio of the amount of change of the voltage of the electric charge storage node to the amount of change of the number of stored electric charges per unit volume decreases in a case where the capacity of the electric charge storage node is increased as described above, an effect of sufficiently suppressing kTC noise by using feedback cannot be obtained.

In view of such problems, the inventor of the present invention attained a novel imaging device. One aspect of the present disclosure is outlined as the following items.

[Item 1]
An imaging device including:
a first imaging cell including
a first photoelectric converter that generates a first signal by photoelectric conversion, and
a first signal processing circuit that is electrically connected to the first photoelectric converter and detects the first signal; and
a second imaging cell including
a second photoelectric converter that generates a second signal by photoelectric conversion, and
a second signal processing circuit that is electrically connected to the second photoelectric converter and detects the second signal, wherein
sensitivity of the first imaging cell is higher than sensitivity of the second imaging cell,
the first signal processing circuit has a circuit configuration different from the second signal processing circuit, and
an operation frequency of the first signal processing circuit is different from an operation frequency of the second signal processing circuit.

[Item 2]
The imaging device according to Item 1, wherein the first signal processing circuit is configured to reduce random noise more than the second signal processing circuit.

[Item 3]
The imaging device according to Item 1 or 2, wherein a number of transistors included in the first signal processing circuit is larger than a number of transistors included in the second signal processing circuit.

[Item 4]
The imaging device according to any one of Items 1 through 3, wherein a number of capacitors included in the first signal processing circuit is larger than a number of capacitors included in the second signal processing circuit.

[Item 5]
The imaging device according to any one of Items 1 through 4, wherein
the first photoelectric converter includes a first pixel electrode and a first photoelectric conversion region on the first pixel electrode,
the second photoelectric converter includes a second pixel electrode and a second photoelectric conversion region on the second pixel electrode,
the first signal processing circuit includes a first amplifier transistor that detects the first signal, a gate of the first amplifier transistor being electrically connected to the first pixel electrode,
the second signal processing circuit includes a second amplifier transistor that detects the second signal, a gate of the second amplifier transistor being electrically connected to the second pixel electrode, and
a gate width of the first amplifier transistor is larger than a gate width of the second amplifier transistor.

[Item 6]
The imaging device according to any one of Items 1 through 5, wherein
the first photoelectric converter includes a first pixel electrode and a first photoelectric conversion region on the first pixel electrode,
the second photoelectric converter includes a second pixel electrode and a second photoelectric conversion region on the second pixel electrode,
the first signal processing circuit includes a first reset transistor that resets the first signal, one of a source and a drain of the first reset transistor being electrically connected to the first pixel electrode,
the second signal processing circuit includes a second reset transistor that resets the second signal, one of a source and a drain of the second reset transistor being electrically connected to the second pixel electrode, and a gate length of the first reset transistor is larger than a gate length of the second reset transistor.

[Item 7]

The imaging device according to any one of Items 1 through 6, wherein the second photoelectric converter includes a second pixel electrode and a second photoelectric conversion region on the second pixel electrode, and the second signal processing circuit includes a first capacitor that is electrically connected to the second pixel electrode, the first capacitor accumulating the second signal.

[Item 8]

The imaging device according to any one of Items 1 through 7, further including a first feedback circuit including an inverting amplifier, wherein the first photoelectric converter includes a first pixel electrode and a first photoelectric conversion region on the first pixel electrode, the first signal processing circuit includes a first amplifier transistor that detects the first signal and a first reset transistor that resets the first signal, a gate of the first amplifier transistor being electrically connected to the first pixel electrode, one of a source and a drain of the first reset transistor being electrically connected to the first pixel electrode, and the first feedback circuit forms a feedback path for negatively feeding back an electric potential of the first pixel electrode via the first amplifier transistor, the inverting amplifier, and the first reset transistor.

[Item 9]

The imaging device according to Item 8, wherein the first signal processing circuit further includes a first capacitor, a second capacitor having a capacitance value larger than the first capacitor, and a first bandwidth control transistor; one end of the first capacitor being electrically connected to the first pixel electrode, one end of the second capacitor being electrically connected to the other end of the first capacitor, the other end of the second capacitor being set to a reference electric potential, one of a source and a drain of the first bandwidth control transistor being electrically connected to the other end of the first capacitor, and the first feedback circuit forms a feedback path for negatively feeding back an electric potential of the first pixel electrode via the first amplifier transistor, the inverting amplifier, the first bandwidth control transistor, and the first capacitor.

[Item 10]

The imaging device according to Item 9, wherein the other one of the source and the drain of the first reset transistor is electrically connected to the one of the source and the drain of the first bandwidth control transistor.

[Item 11]

The imaging device according to Item 9, wherein the other one of the source and the drain of the first reset transistor is electrically connected to the other one of the source and the drain of the first bandwidth control transistor.

[Item 12]

The imaging device according to any one of Items 1 through 7, further including a first feedback circuit, wherein the first photoelectric converter includes a first pixel electrode and a first photoelectric conversion region on the first pixel electrode, the first signal processing circuit includes a first amplifier transistor that detects the first signal, a first reset transistor that resets the first signal, a first capacitor, a second capacitor having a larger capacitance value than the first capacitor, and a first bandwidth control transistor, a gate of the first amplifier transistor being electrically connected to the first pixel electrode, one of a source and a drain of the first reset transistor being electrically connected to the first pixel electrode, one end of the first capacitor being electrically connected to the first pixel electrode, one end of the second capacitor being electrically connected to the other end of the first capacitor, the other one of the second capacitor being set to a reference electric potential, one of a source and a drain of the first bandwidth control transistor being electrically connected to the other end of the first capacitor, one of a source and a drain of the first amplifier transistor is electrically connected to the other one of the source and the drain of the first bandwidth control transistor, and the first feedback circuit forms a feedback path for negatively feeding back an electric potential of the first pixel electrode via the first amplifier transistor, the first bandwidth control transistor, and the first capacitor.

[Item 13]

The imaging device according to Item 12, wherein the other one of the source and the drain of the first reset transistor is electrically connected to the one of the source and the drain of the first bandwidth control transistor.

[Item 14]

The imaging device according to Item 12, wherein the other one of the source and the drain of the first reset transistor is electrically connected to the other one of the source and the drain of the first bandwidth control transistor.

[Item 15]

The imaging device according to any one of Items 1 through 7, further including a first feedback circuit, wherein the first photoelectric converter includes a first pixel electrode and a first photoelectric conversion region on the first pixel electrode, the first signal processing circuit includes a first amplifier transistor that detects the first signal, a first reset transistor that resets the first signal, a first capacitor, a second capacitor having a larger capacitance value than the first capacitor, a first bandwidth control transistor, and a first selection transistor, a gate of the first amplifier transistor being electrically connected to the first pixel electrode, one of a source and a drain of the first reset transistor being electrically connected to the first pixel electrode, one end of the first capacitor being electrically connected to the first pixel electrode, one end of the second capacitor being electrically connected to the other end of the first capacitor, the other end of the second capacitor being set to a reference electric potential, one of a source and a drain of the first bandwidth control transistor being electrically connected to the other end of the first capacitor, one of a source and a drain of the first selection transistor being electrically connected to one of a source and a drain of the first amplifier transistor, the other one of the source and the drain of the first selection transistor being electrically connected to the other one of the source and the drain of the first bandwidth control transistor, and the first feedback circuit forms a feedback path for negatively feeding back an electric potential of the first pixel electrode via the first amplifier transistor, the first selection transistor, the first bandwidth control transistor, and the first capacitor.

[Item 16]

The imaging device according to Item 15, wherein the other one of the source and the drain of the first reset transistor is electrically connected to the one of the source and the drain of the first bandwidth control transistor.

[Item 17]

The imaging device according to Item 15, wherein the other one of the source and the drain of the first reset transistor is electrically connected to the other one of the source and the drain of the first bandwidth control transistor.

[Item 18]

The imaging device according to any one of Items 1 through 7, wherein the first photoelectric converter includes a first pixel electrode and a first photoelectric conversion region on the first pixel electrode, the first signal processing circuit includes a first amplifier transistor that detects the first signal, a first reset transistor that resets the first signal, a first capacitor, a second capacitor having a larger capacitance value than the first capacitor, a first bandwidth control transistor, and a first feedback circuit, a gate of the first amplifier transistor being electrically connected to the first pixel electrode, one of a source and a drain of the first reset transistor being electrically connected to the first pixel electrode, one end of the first capacitor being electrically connected to the first pixel electrode, one end of the second capacitor being electrically connected to the other end of the first capacitor, the other end of the second capacitor being set to a reference electric potential, one of a source and a drain of the first bandwidth control transistor being electrically connected to the other end of the first capacitor, a gate of the first bandwidth control transistor being electrically connected to the first pixel electrode, and the first feedback circuit forms a feedback path for negatively feeding back an electric potential of the first pixel electrode via the first bandwidth control transistor and the first capacitor.

[Item 19]

The imaging device according to Item 18, wherein the other end of the source and the drain of the first reset transistor is electrically connected to the one of the source and the drain of the first bandwidth control transistor.

[Item 20]

The imaging device according to Item 18, wherein the other end of the source and the drain of the first reset transistor is electrically connected to the other one of the source and the drain of the first bandwidth control transistor.

[Item 21]

The imaging device according to any one of Items 1 through 20, wherein the operation frequency of the first signal processing circuit is higher than the operation frequency of the second signal processing circuit.

[Item 22]

The imaging device according to any one of Items 1 through 20, wherein a number of saturation electrons of the second imaging cell is larger than a number of saturation electrons of the first imaging cell, and the operation frequency of the first signal processing circuit is higher than the operation frequency of the second signal processing circuit.

[Item 23]

The imaging device according to any one of Items 1 through 20, wherein a number of saturation electrons of the second imaging cell is larger than a number of saturation electrons of the first imaging cell, and the operation frequency of the first signal processing circuit is lower than the operation frequency of the second signal processing circuit.

[Item 24]

The imaging device according to Item 22, wherein a specific subject is detected from an image acquired by the second imaging cell; and sensing using data acquired by the first imaging cell is started in response to detection of the specific subject.

[Item 25]

The imaging device according to Item 23, wherein a specific subject is detected from an image acquired by the first imaging cell, and sensing using data acquired by the second imaging cell is started in response to detection of the specific subject.

One aspect of the present disclosure is outlined by the following items.

[Item 1]

An imaging device having a plurality of pixels:

each of the pixels including a first imaging cell including a first photoelectric converter that generates a first signal by photoelectric conversion, and a first signal processing circuit that is electrically connected to the first photoelectric converter and detects the first signal; and a second imaging cell including a second photoelectric converter that generates a second signal by photoelectric conversion, and a second signal processing circuit that is electrically connected to the second photoelectric converter and detects the second signal, an operation frequency of the first signal processing circuit being different from an operation frequency of the second signal processing circuit.

According to the imaging device according to Item 1, optimum sensing data can be acquired.

[Item 2]

The imaging device according to Item 1, wherein the operation frequency of the first signal processing circuit is higher than the operation frequency of the second signal processing circuit.

[Item 3]

The imaging device according to Item 1, wherein the first imaging cell is an imaging cell for high sensitivity, and the second imaging cell is an imaging cell for high saturation; and the operation frequency of the first signal processing circuit is higher than the operation frequency of the second signal processing circuit.

According to the imaging device according to Item 3, high-sensitivity image data imaged at a high frame rate that is necessary for sensing can be acquired. A load on signal processing in a later step is reduced. As a result, electric power consumption in a signal processing circuit in a later step can be kept small.

[Item 4]

The imaging device according to Item 1, wherein the first imaging cell is an imaging cell for high sensitivity, and the second imaging cell is an imaging cell for high saturation; and the operation frequency of the first signal processing circuit is lower than the operation frequency of the second signal processing circuit.

According to the imaging device according to Item 4, data of a high-saturation image imaged at a high frame rate that is necessary for sensing can be acquired. A load on signal processing in a later step is reduced. As a result, electric power consumption in a signal processing circuit in a later step can be kept small.

[Item 5]

The imaging device according to Item 2 or 3, wherein a specific subject is detected from an image acquired by the second imaging cell; and sensing using data acquired by the first imaging cell is started in response to detection of the specific subject.

According to the imaging device according to Item 5, sensing can be started in response to detection of a specific subject. A load on signal processing in a later step is reduced. As a result, electric power consumption in a signal processing circuit in a later step can be kept small.

[Item 6]

The imaging device according to Item 4, wherein
a specific subject is detected from an image acquired by the first imaging cell; and
sensing using data acquired by the second imaging cell is started in response to detection of the specific subject.

According to the imaging device according to Item 6, sensing can be started in response to detection of a specific subject. A load on signal processing in a later step is reduced. As a result, electric power consumption in a signal processing circuit in a later step can be kept small.

[Item 7]

An imaging device having a plurality of pixels:
each of the pixels including
a first imaging cell including
a first photoelectric converter that generates a first signal by photoelectric conversion, and
a first signal processing circuit that is electrically connected to the first photoelectric converter and detects the first signal; and
a second imaging cell including
a second photoelectric converter that generates a second signal by photoelectric conversion, and
a second signal processing circuit that is electrically connected to the second photoelectric converter and detects the second signal,
the second signal processing circuit having a circuit configuration different from the first signal processing circuit,
sensitivity of the first imaging cell being different from that of the second imaging cell, and
an operation frequency of the first signal processing circuit being different from an operation frequency of the second signal processing circuit.

According to the imaging device according to Item 7, optimum sensing data can be acquired.

[Item 8]

The imaging device according to Item 7, wherein
the sensitivity of the first imaging cell is higher than that of the second imaging cell; and
the operation frequency of the first signal processing circuit is higher than the operation frequency of the second signal processing circuit.

According to the imaging device according to Item 8, high-sensitivity image data imaged at a high frame rate that is necessary for sensing can be acquired. A load on signal processing in a later step is reduced. As a result, electric power consumption in a signal processing circuit in a later step can be kept small.

[Item 9]

The imaging device according to Item 7, wherein
the sensitivity of the first imaging cell is higher than that of the second imaging cell; and
the operation frequency of the first signal processing circuit is lower than the operation frequency of the second signal processing circuit.

According to the imaging device according to Item 9, data of a high-saturation image imaged at a high frame rate that is necessary for sensing can be acquired. A load on signal processing in a later step is reduced. As a result, electric power consumption in a signal processing circuit in a later step can be kept small.

[Item 10]

An imaging device having a plurality of pixels:
each of the pixels including
a first imaging cell including
a first photoelectric converter that generates a first signal by photoelectric conversion, and
a first signal processing circuit that is electrically connected to the first photoelectric converter and detects the first signal; and
a second imaging cell including
a second photoelectric converter that generates a second signal by photoelectric conversion, and
a second signal processing circuit that is electrically connected to the second photoelectric converter and detects the second signal,
the second signal processing circuit having a circuit configuration different from the first signal processing circuit,
sensitivity of the first imaging cell being different from that of the second imaging cell, and
the number of times the first signal is read out by the first signal processing circuit being different from the number of times the second signal is read out by the second signal processing circuit.

According to the imaging device according to Item 10, an SN ratio can be improved while keeping noise small.

[Item 11]

The imaging device according to Item 10, wherein
the sensitivity of the first imaging cell is higher than that of the second imaging cell; and
the number of times the first signal is read out by the first signal processing circuit is larger than the number of times the second signal is read out by the second signal processing circuit.

According to the imaging device according to Item 11, more low-noise high-sensitivity images can be acquired by the first imaging cell for a longer imaging period. An SN ratio can be improved while keeping noise small by integrating a series of acquired image data.

[Item 12]

The imaging device according to Item 11, wherein the number of times the first signal is read out by the first signal processing circuit is two or more, and the number of times the second signal is read out by the second signal processing circuit is one.

[Item 13]

An imaging device having a plurality of pixels:
each of the pixels including
a first imaging cell including
a first photoelectric converter that generates a first signal by photoelectric conversion, and
a first signal processing circuit that is electrically connected to the first photoelectric converter and detects the first signal; and
a second imaging cell including
a second photoelectric converter that generates a second signal by photoelectric conversion, and
a second signal processing circuit that is electrically connected to the second photoelectric converter and detects the second signal,
the second signal processing circuit having a circuit configuration different from the first signal processing circuit, sensitivity of the first imaging cell being different from that of the second imaging cell, and an exposure period of the first imaging cell being different from that of the second imaging cell.

According to the imaging device according to Item 13, a dynamic range can be further widened.

[Item 14]

The imaging device according to Item 13, wherein the sensitivity of the first imaging cell is higher than that of the second imaging cell; and the exposure period of the first imaging cell is longer than that of the second imaging cell.

According to the imaging device according to Item 14, a higher-sensitivity image can be acquired by performing low-noise high-sensitivity imaging for a longer exposure period by the first imaging cell. As a result, a dynamic range can be further widened.

[Item 15]

A camera system including an imaging device according to any one of Items 1 through 14.

According to the camera system according to Item 15, a camera system that can acquire optimum sensing data is provided.

According to one aspect of the present disclosure, two imaging cells having different circuit configurations and different operation conditions can be provided in each pixel. The different operation conditions are, for example, different operation frequencies. A first imaging cell functions as a low-noise high-sensitivity imaging cell, and a second imaging cell functions as a high-saturation low-sensitivity imaging cell. It is therefore possible to image even a subject having a larger difference in brightness without blown out highlights and blocked up shadows than a conventional art. That is, more desirable imaging cell characteristics as illustrated in FIG. 2 can be achieved. Furthermore, according to the present configuration, high-sensitivity imaging and low-sensitivity imaging are concurrently achieved by two imaging cells. It is therefore possible to prevent a time lag between the high-sensitivity imaging and the low-sensitivity imaging. Furthermore, output data can be optimized, and a total amount of output data can be kept small by making an operation condition of an electric charge sensing circuit in the first imaging cell different from an operation condition of an electric charge sensing circuit in the second imaging cell. The different operation conditions are, for example, different operation frequencies. This makes it possible to speed up output and processing in a later stage.

An imaging device according to one aspect of the present disclosure is suitably used, for example, for an on-board camera for sensing. For example, sensing data can be acquired at a high speed by causing the first imaging cell and the second imaging cell to operate at different frame rates.

Embodiments of the present disclosure are described below in detail with reference to the drawings. Each of the embodiments described below illustrates a general or specific example. Numerical values, shapes, materials, constituent elements, ways in which the constituent elements are arranged and connected, steps, the order of steps, and the like in the embodiments below are examples and do not limit the present disclosure. Various aspects described herein can be combined as long as no contradiction occurs. Among constituent elements in the embodiments described below, constituent elements that are not described in independent claims that indicate the highest concepts are described as optional constituent elements. In the following description, constituent elements having substantially the same functions are given identical reference signs, and description thereof is sometimes omitted.

First Embodiment

A structure of an imaging device 100 according to the present embodiment is described below with reference to FIGS. 4 through 6B. The following describes an example of a structure using a p-type silicon substrate as a semiconductor substrate. An example in which a hole is used as a signal electric charge is illustrated below. Note that an electron may be used as a signal electric charge.

Structure of Imaging Device 100

Figure 4:
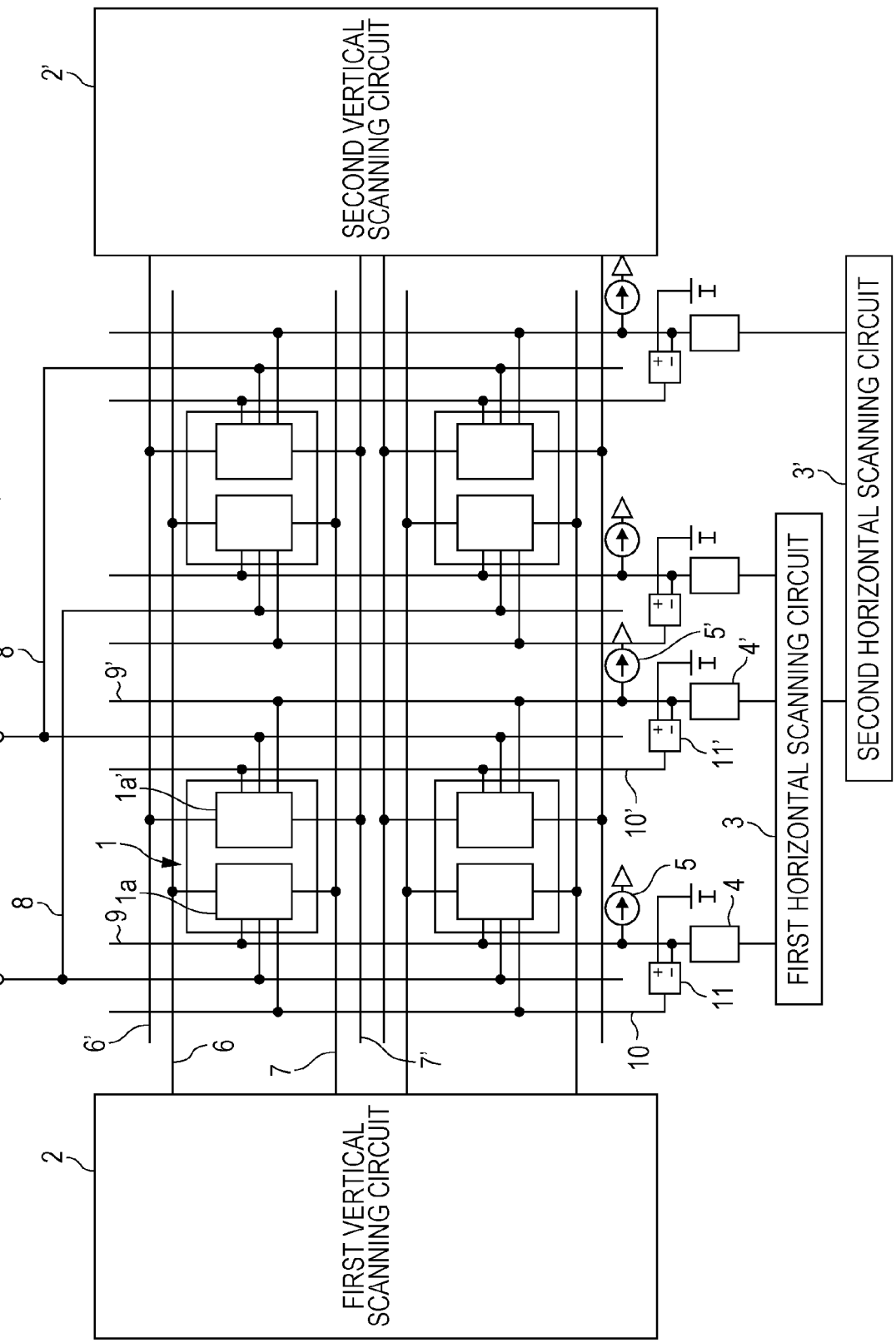
FIG. 4 is a block diagram schematically illustrating an example of a structure of an imaging device.

FIG. 4 schematically illustrates an example of the structure of the imaging device 100. The imaging device 100 includes a plurality of unit pixels 1 that are two-dimensionally arranged. Millions of unit pixels 1 can be two-dimensionally arranged actually, but FIG. 4 illustrates only unit pixels 1 that are arranged in a 2×2 matrix. The imaging device 100 may be a line sensor. In this case, the plurality of unit pixels 1 may be arranged one-dimensionally (e. g., in a row direction or a column direction).

Each of the unit pixels 1 includes a first imaging cell 1*a* and a second imaging cell 1*a'*. The first imaging cell 1*a* is an imaging cell that copes with low noise, and the second imaging cell 1*a'* is an imaging cell that copes with high saturation. Typically, the first imaging cell 1*a* functions as an imaging cell for high sensitivity, and the second imaging cell 1*a'* functions as an imaging cell for low sensitivity. That is, the sensitivity of the first imaging cell 1*a* is different from the sensitivity of the second imaging cell 1*a'*. Sensitivity of an imaging cell as used herein means mainly light reception sensitivity or readout sensitivity of a signal processing circuit. The light reception sensitivity depends on a pixel electrode, a waveguide, a microlens, and light shielding. For example, the light reception sensitivity can be increased by increasing the area of a pixel electrode. The readout sensitivity depends on conversion gain of a pixel unit, a saturation capacity, and gain of an amplifier transistor.

The imaging device 100 includes, for the first imaging cell 1*a*, a plurality of reset signal lines 6 and a plurality of address signal lines 7 that are disposed in respective rows and a plurality of vertical signal lines 9, a power source wire 8, and a plurality of feedback signal lines 10 that are disposed in respective columns. Furthermore, the imaging device 100 includes, for the second imaging cell 1*a'*, a plurality of reset signal lines 6' and a plurality of address signal lines 7' that are disposed in the respective rows and a plurality of vertical signal lines 9', a power source wire 8', and a plurality of feedback signal lines 10' that are disposed in the respective columns.

In the imaging device 100, a first peripheral circuit that processes a signal from the first imaging cell 1*a* and a second peripheral circuit that processes a signal from the second imaging cell 1*a'* are separately provided. The first peripheral circuit includes a first vertical scanning circuit 2, a first horizontal scanning circuit 3, a first inverting amplifier 11, a first column AD conversion circuit 4, and an electric current source 5, and the second peripheral circuit includes a second vertical scanning circuit 2', a second horizontal scanning circuit 3', a second inverting amplifier 11', a second column AD conversion circuit 4', and a second electric current source 5'.

As to the first imaging cell 1*a*, the first vertical scanning circuit 2 controls the plurality of reset signal lines 6 and the plurality of address signal lines 7. The vertical signal lines 9 are connected to the first horizontal scanning circuit 3 and transmit a pixel signal to the first horizontal scanning circuit 3. The power source wire 8 supplies a power source voltage to the first imaging cells 1a of all of the unit pixels 1. The power source voltage is, for example, VDD. The feedback signal lines 10 transmit a feedback signal from the inverting amplifier 11 that will be described later, to the first imaging cells 1a of the unit pixels 1. As for the second imaging cell 1a', various signal lines are arranged and controlled by the circuits in a manner similar to the first imaging cell 1a. Note, however, that the reset signal lines 6 and 6' and the address signal lines 7 and 7' of the first imaging cell 1a and the second imaging cell 1a' can be replaced with a reset signal line and an address signal line that are shared by the first imaging cell 1a and the second imaging cell 1a' depending on the pixel configuration. Furthermore, the feedback signal lines 10 and 10' and the first inverting amplifier 11 and the second inverting amplifier 11' can be replaced with a feedback signal line and an inverting amplifier that are shared by the first imaging cell 1a and the second imaging cell 1a' or can be omitted depending on the pixel configuration. Furthermore, the first vertical scanning circuit 2 and the second vertical scanning circuit 2' and the first horizontal scanning circuit 3 and the second horizontal scanning circuit 3' can also be replaced with a vertical scanning circuit and a horizontal scanning circuit that are shared by the first imaging cell 1a and the second imaging cell 1a' accordingly depending on the pixel configuration. An inverting amplifier may be provided for each column. Furthermore, an inverting amplifier may be provided in each pixel or a single inverting amplifier may be provided for a plurality of pixels.

Circuit Configuration of First and Second Imaging Cells 1a and 1a'

Next, examples of a circuit configuration of the first and second imaging cells 1a and 1a' (i. e., the unit pixel 1) are described with reference to FIGS. 5, 6A, and 6B. In the present disclosure, the circuit configuration of the unit pixel 1 has various variations. Hereinafter, representative circuit configurations among the variations are mainly described. Other circuit configurations are sometimes illustrated only in the drawings, and detailed description thereof is omitted.

Figure 6A:
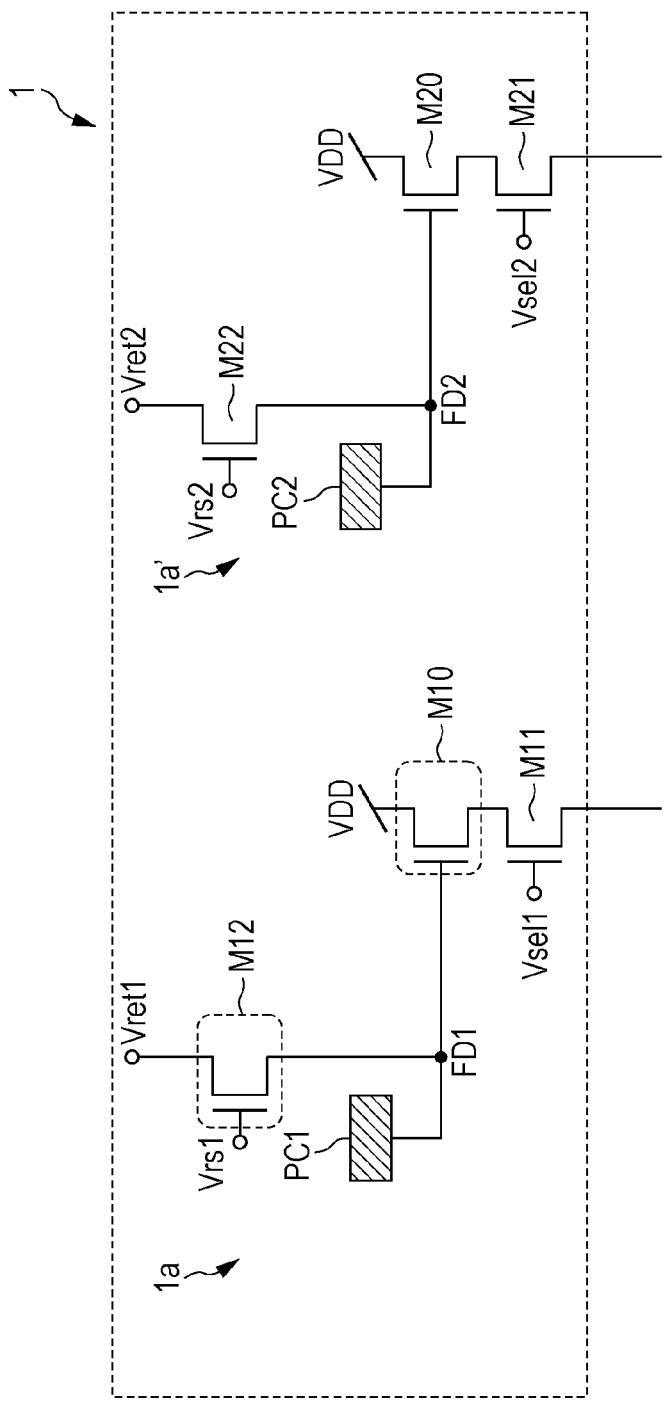
FIG. 6A is a schematic view illustrating a circuit configuration of a unit pixel according to exemplary First Embodiment.
Figure 6B:
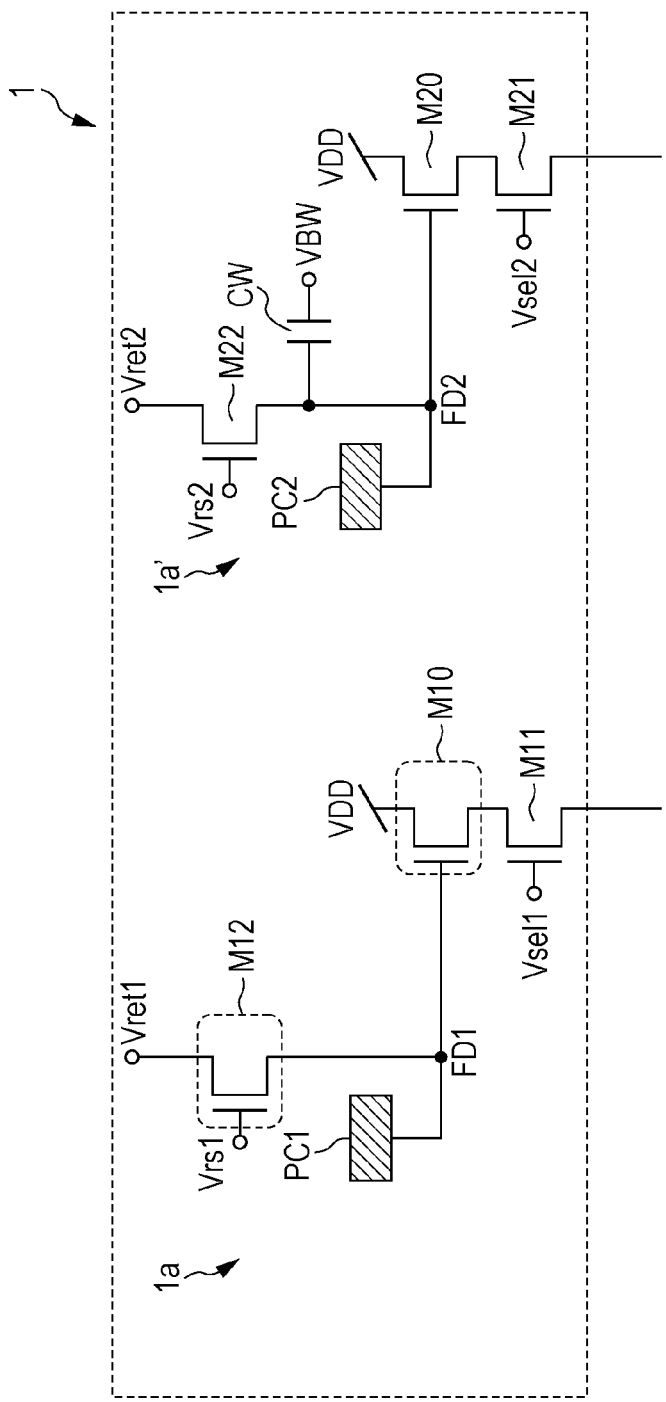
FIG. 6B is a schematic view illustrating another circuit configuration of the unit pixel according to exemplary First Embodiment.

The circuit configurations illustrated in FIGS. 6A and 6B are examples of a simple and basic configuration. The circuit configuration of the unit pixel 1 and variations thereof are described in detail in Japanese Patent Application No. 2016-137868 that is an unpublished patent application filed by the applicant of the subject application, and disclosure thereof is hereby entirely incorporated by reference.

Figure 5:
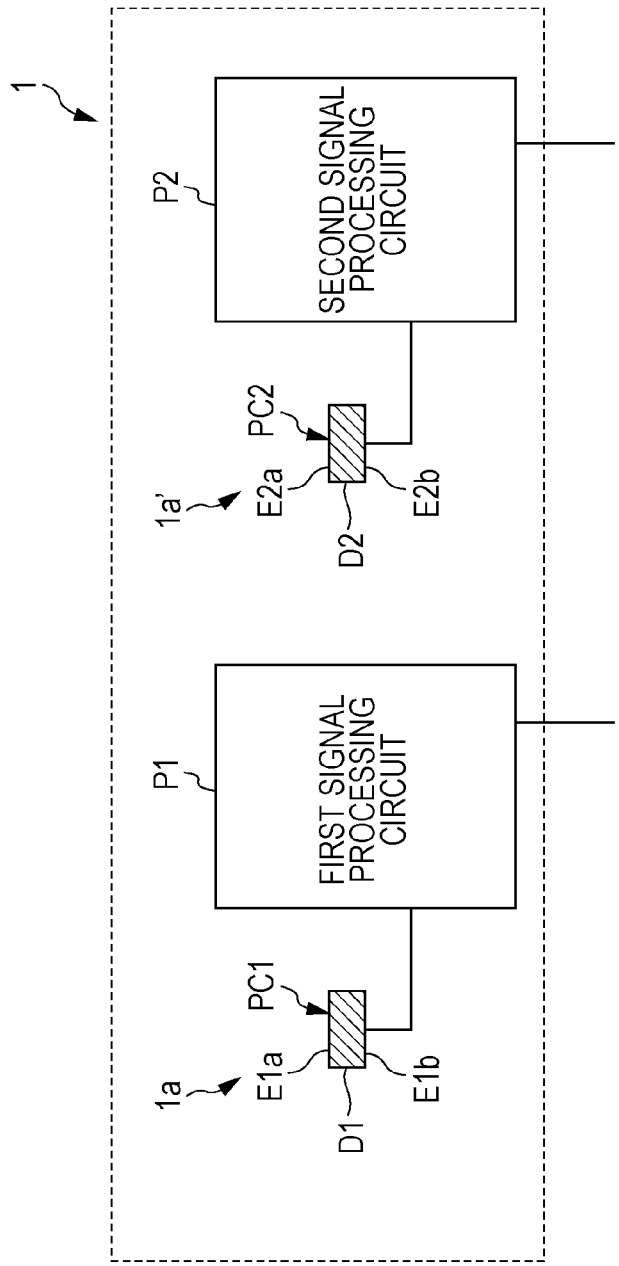
FIG. 5 is a schematic view illustrating a first signal processing circuit and a second signal processing circuit in a unit pixel.

FIG. 5 illustrates first and second signal processing circuits P1 and P2 in the unit pixel 1. FIG. 6A illustrates an example of a circuit configuration of the unit pixel 1 according to the present embodiment.

The unit pixel 1 includes the first imaging cell 1a and the second imaging cell 1a'. The first imaging cell 1a functions as a low-noise cell. The first imaging cell 1a includes a first photoelectric converter PC1 that converts light into an electric signal and the first signal processing circuit P1 that is electrically connected to the first photoelectric converter PC1 and reads out the electric signal generated by the first photoelectric converter PC1. The first photoelectric converter PC1 includes a first upper electrode E1a, a first pixel electrode E1b, and a first photoelectric conversion region D1 that is sandwiched between the first upper electrode E1a and the first pixel electrode E1b.

The first signal processing circuit P1 includes a first signal processing circuit that detects the electric signal generated by the first photoelectric converter PC1. The first signal processing circuit includes a first amplifier transistor M10, a first selection transistor M11, and a first reset transistor M12. A gate of the first amplifier transistor M10 is connected to the first photoelectric converter PC1. The first amplifier transistor M10 amplifies the electric signal generated by the first photoelectric converter PC1. One of a source and a drain of the first selection transistor M11 is connected to one of a source and a drain of the first amplifier transistor M10. The first selection transistor M11 selectively outputs the signal amplified by the first amplifier transistor M10. One of a source and a drain of the first reset transistor M12 is connected to a readout node FD1. The first reset transistor M12 resets (initializes) the readout node FD1 connected to the first pixel electrode E1b of the first photoelectric converter PC1.

The second imaging cell 1a' functions as a high-saturation cell. The second imaging cell 1a' includes a second photoelectric converter PC2 that converts light into an electric signal and the second signal processing circuit P2 that is electrically connected to the second photoelectric converter PC2 and reads out the electric signal generated by the second photoelectric converter PC2. The second photoelectric converter PC2 includes a second upper electrode E2a, a second pixel electrode E2b, and a second photoelectric conversion region D2 that is sandwiched between the second upper electrode E2a and the second pixel electrode E2b.

The second signal processing circuit P2 includes a second signal processing circuit that detects the electric signal generated by the second photoelectric converter PC2. The second signal processing circuit includes a second amplifier transistor M20, a second selection transistor M21, and a second reset transistor M22. A gate of the second amplifier transistor M20 is connected to the second photoelectric converter PC2. The second amplifier transistor M20 amplifies the electric signal generated by the second photoelectric converter PC2. One of a source and a drain of the second selection transistor M21 is connected to one of a source and a drain of the second amplifier transistor M20. The second selection transistor M21 selectively outputs the signal amplified by the second amplifier transistor M20. One of a source and a drain of the second reset transistor M22 is connected to a readout node FD2. The second reset transistor M22 resets (i. e., initializes) the readout node FD2 connected to the second pixel electrode E2b of the second photoelectric converter PC2.

The first photoelectric converter PC1 of the first imaging cell 1a is configured to take in a larger amount of light per unit time than the second photoelectric converter PC2 of the second imaging cell 1a'. For example, the first photoelectric converter PC1 of the first imaging cell 1a may be disposed on an optical axis of a light collecting lens. Furthermore, for example, the area of the first photoelectric converter PC1 of the first imaging cell 1a may be larger in plan view than the area of the second photoelectric converter PC2 of the second imaging cell 1a'.

The first imaging cell 1a, which is in charge of imaging of a dark scene, requires low-noise characteristics but does not require high-saturation characteristics. Meanwhile, the second imaging cell 1a', which is in charge of imaging of a bright scene, requires high-saturation characteristics. However, the second imaging cell 1a' does not require low-noise characteristics since a light amount is large and the characteristics are determined by shot noise at a bright scene.

In the present embodiment, a gate width of the first amplifier transistor M10 is larger than that of the second amplifier transistor M20. This makes it possible to set gm of the first amplifier transistor M10 large. As a result, it is possible to reduce readout noise of the first imaging cell 1a. Meanwhile, low-noise characteristics of the second imaging cell 1a' do not pose a problem even in a case where the low-noise characteristics are equivalent to conventional ones. A gate length of the first reset transistor M12 is longer than that of the second reset transistor M22. This improves the noise reducing effect of the first imaging cell 1a. Meanwhile, low-noise characteristics of the second imaging cell 1a' do not pose a problem even in a case where the low-noise characteristics are equivalent to conventional ones.

FIG. 6B illustrates another example of a circuit configuration of the unit pixel 1 according to the present embodiment. As illustrated in FIG. 6B, a fifth capacitor CW that is electrically connected between the second photoelectric converter PC2 and a reference voltage VBW is provided. This makes it possible to improve the high-saturation characteristics of the second imaging cell 1a' by a degree corresponding to a capacitance ratio. As a result, it is possible to further widen a dynamic range. The reference sign "P1" of the first signal processing circuit and the reference sign "P2" of the second signal processing circuit are omitted in FIG. 6B and the subsequent drawings and are used only in the specification.

According to the circuit configurations of the unit pixel 1 described above, it is possible to prevent an unnecessary increase in pixel size. Furthermore, it is possible to provide a small imaging device in which low-noise high-sensitivity imaging is achieved by the first imaging cell 1a and high-saturation low-sensitivity imaging is achieved by the second imaging cell 1a'. Furthermore, a subject having a large difference in brightness can be imaged without a time lag and without blown out highlights and blocked up shadows.

Other examples of a circuit configuration of the unit pixel 1 different from the above circuit configurations are described with reference to FIGS. 7 through 10. The first imaging cell 1a and/or the second imaging cell 1a' in the unit pixel 1 illustrated in FIGS. 7 through 10 include a feedback circuit.

Figure 7:
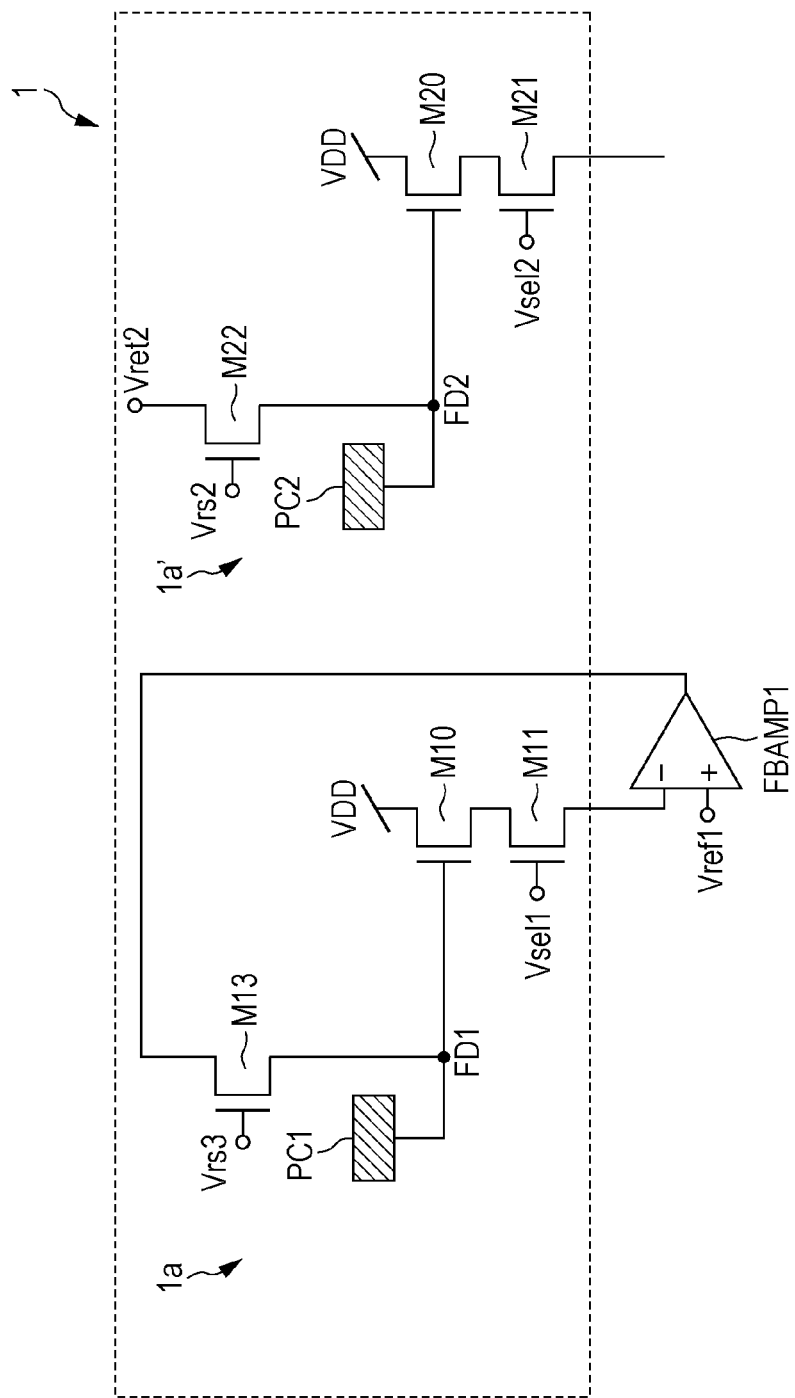
FIG. 7 is a schematic view illustrating another circuit configuration of the unit pixel according to exemplary First Embodiment.

FIG. 7 illustrates another example of a circuit configuration of the unit pixel 1 according to the present embodiment. The first signal processing circuit P1 includes a first signal processing circuit that detects the electric signal generated by the first photoelectric converter PC1. The first signal processing circuit includes a first amplifier transistor M10, a first selection transistor M11, a first reset transistor M13, and a first feedback circuit. A gate of the first amplifier transistor M10 is connected to the first photoelectric converter PC1. The first amplifier transistor M10 amplifies the electric signal generated by the first photoelectric converter PC1. One of a source and a drain of the first selection transistor M11 is connected to one of a source and a drain of the first amplifier transistor M10. The first selection transistor M11 selectively outputs the signal amplified by the first amplifier transistor M10. One of a source and a drain of the first reset transistor M13 is connected to a readout node FD1. The first reset transistor M13 resets (i.e., initializes) the readout node FD1 connected to the first pixel electrode of the first photoelectric converter PC1.

The first feedback circuit has a first inverting amplifier FBAMP1 and forms a first feedback path for negative feedback of kTC noise that occurs when the first reset transistor M13 is turned off. Gain of the first feedback path can be increased and a noise suppressing effect can be improved by the first inverting amplifier FBAMP1. The first inverting amplifier FBAMP1 corresponds to the first inverting amplifier 11 in FIG. 4.

The second imaging cell 1a' functions as a high-saturation cell as described above and has substantially the same circuit configuration as the circuit configuration illustrated in FIG. 6A.

Since the first imaging cell 1a includes the first feedback circuit, the first imaging cell 1a can markedly suppress noise that occurs when the first reset transistor M13 is turned off. Meanwhile, noise characteristics of the second imaging cell 1a' do not pose a problem even in a case where the noise characteristics are equivalent to conventional ones. Note that a method for suppressing noise will be described later. A gate width of the first amplifier transistor M10 may be larger than that of the second amplifier transistor M20. This makes it possible to set gm of the first amplifier transistor M10 large. As a result, it is possible to reduce readout noise of the first imaging cell 1a. Meanwhile, noise characteristics of the second imaging cell 1a' do not pose a problem even in a case where the noise characteristics are equivalent to conventional ones. A gate length of the first reset transistor M13 may be longer than that of the second reset transistor M22. This further improves the noise reducing effect of the first imaging cell 1a. The noise characteristics of the second imaging cell 1a' do not pose a problem even in a case where the noise characteristics are equivalent to conventional ones.

Figure 8:
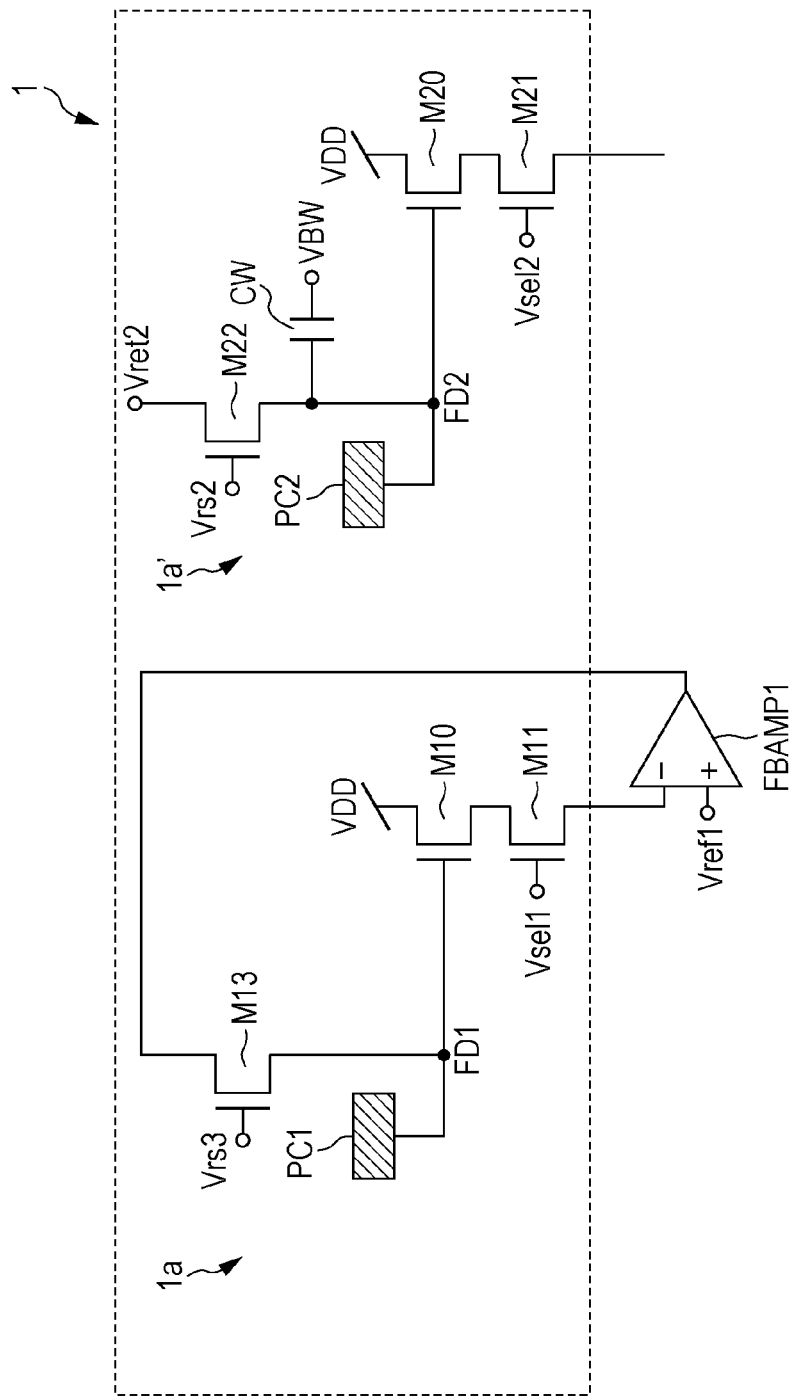
FIG. 8 is a schematic view illustrating another circuit configuration of the unit pixel according to exemplary First Embodiment.

FIG. 8 illustrates another example of a circuit configuration of the unit pixel 1 according to the present embodiment. As in the circuit configuration illustrated in FIG. 6B, a fifth capacitor CW that is electrically connected between the second photoelectric converter PC2 and a reference voltage VBW may be provided. This makes it possible to improve the high-saturation characteristics of the second imaging cell 1a' by a degree corresponding to a capacitance ratio. As a result, it is possible to further widen a dynamic range.

Figure 9A:
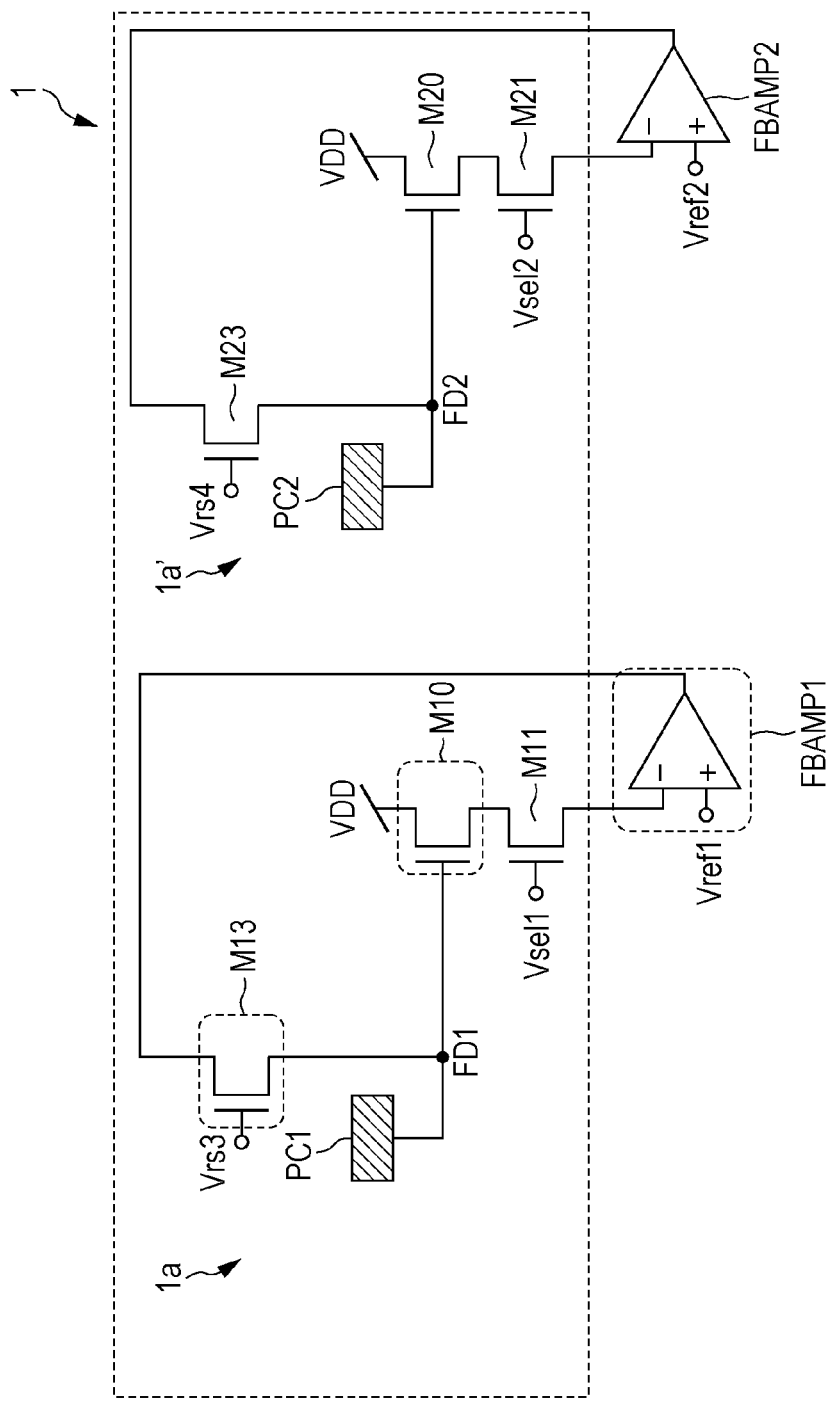
FIG. 9A is a schematic view illustrating still another circuit configuration of the unit pixel according to exemplary First Embodiment.
Figure 9B:
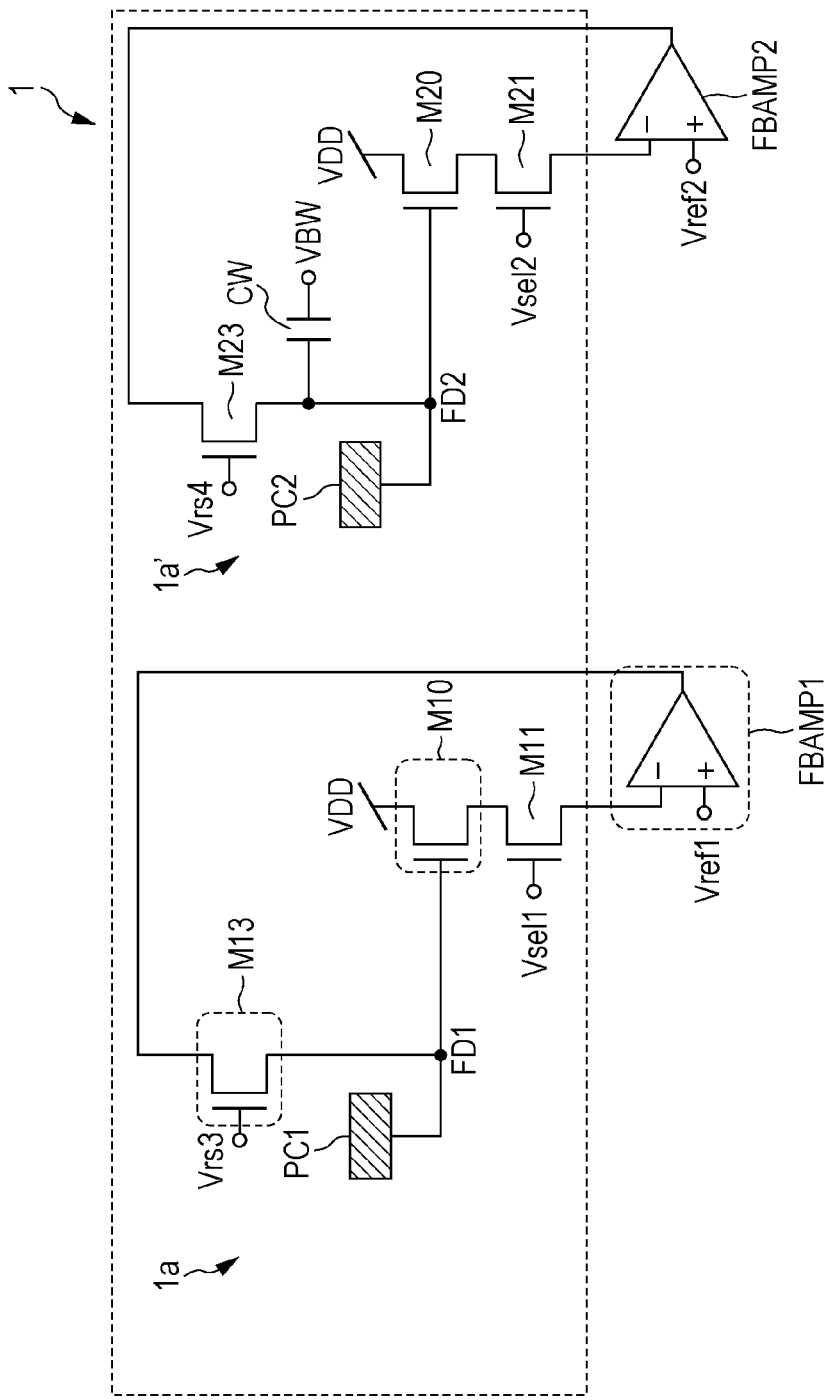
FIG. 9B is a schematic view illustrating still another circuit configuration of the unit pixel according to exemplary First Embodiment.
Figure 9C:
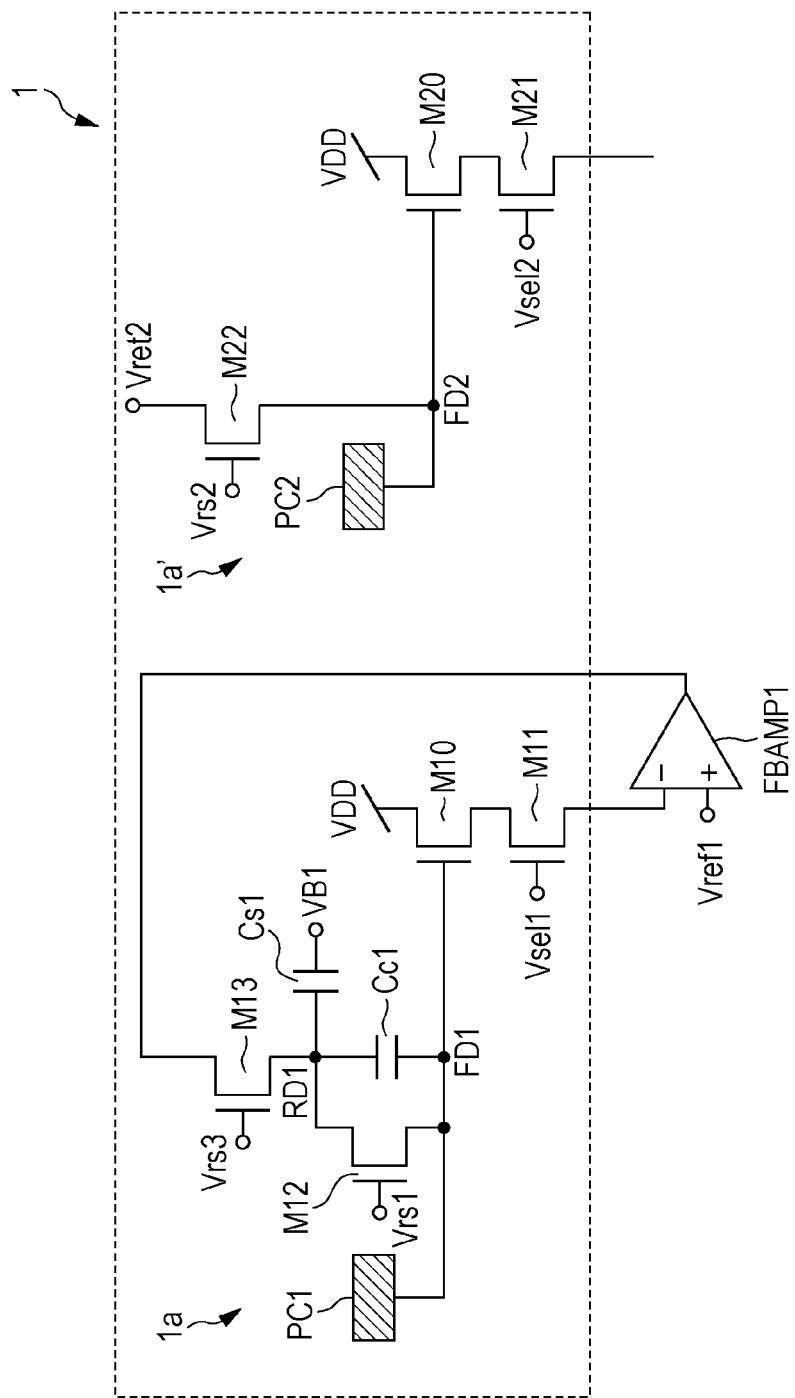
FIG. 9C is a schematic view illustrating still another circuit configuration of the unit pixel according to exemplary First Embodiment.
Figure 9D:
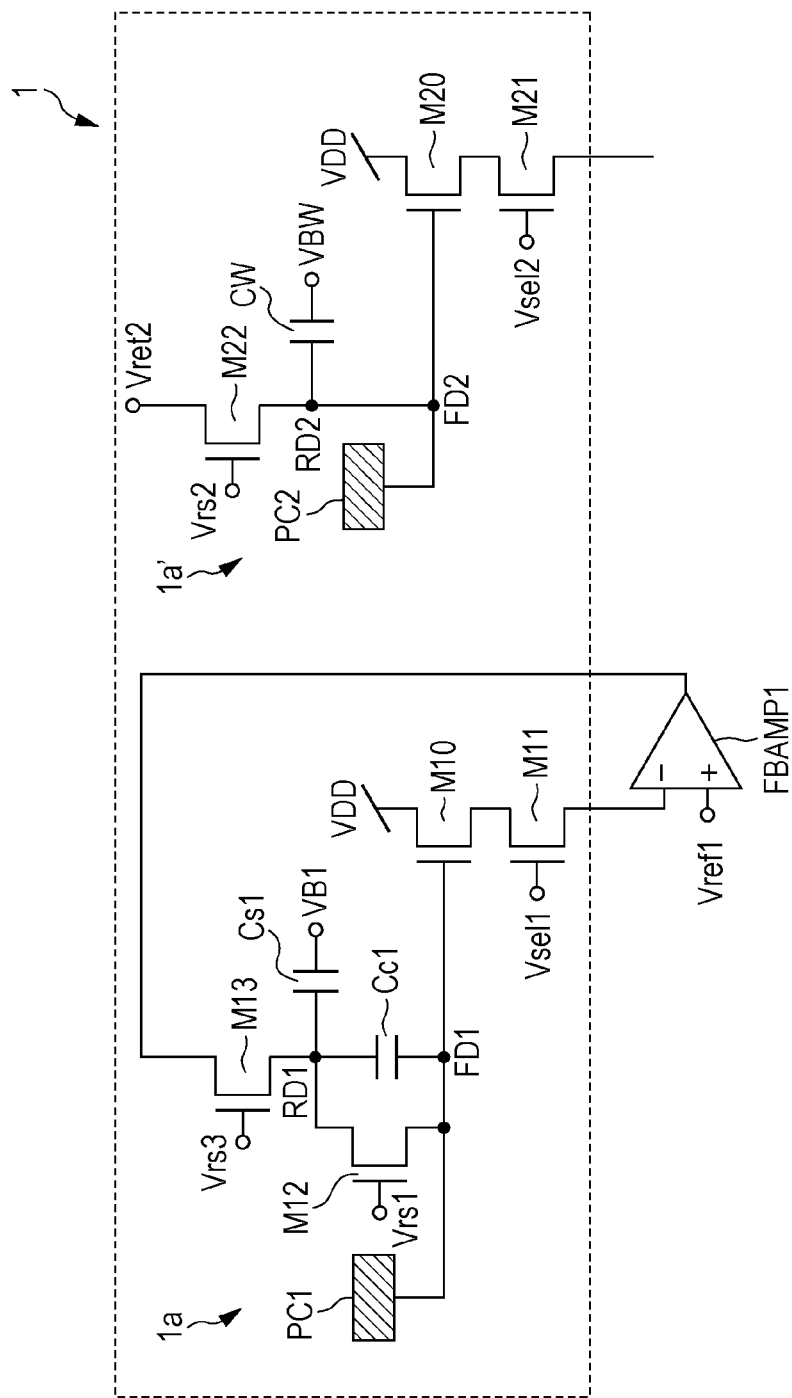
FIG. 9D is a schematic view illustrating still another circuit configuration of the unit pixel according to exemplary First Embodiment.
Figure 9E:
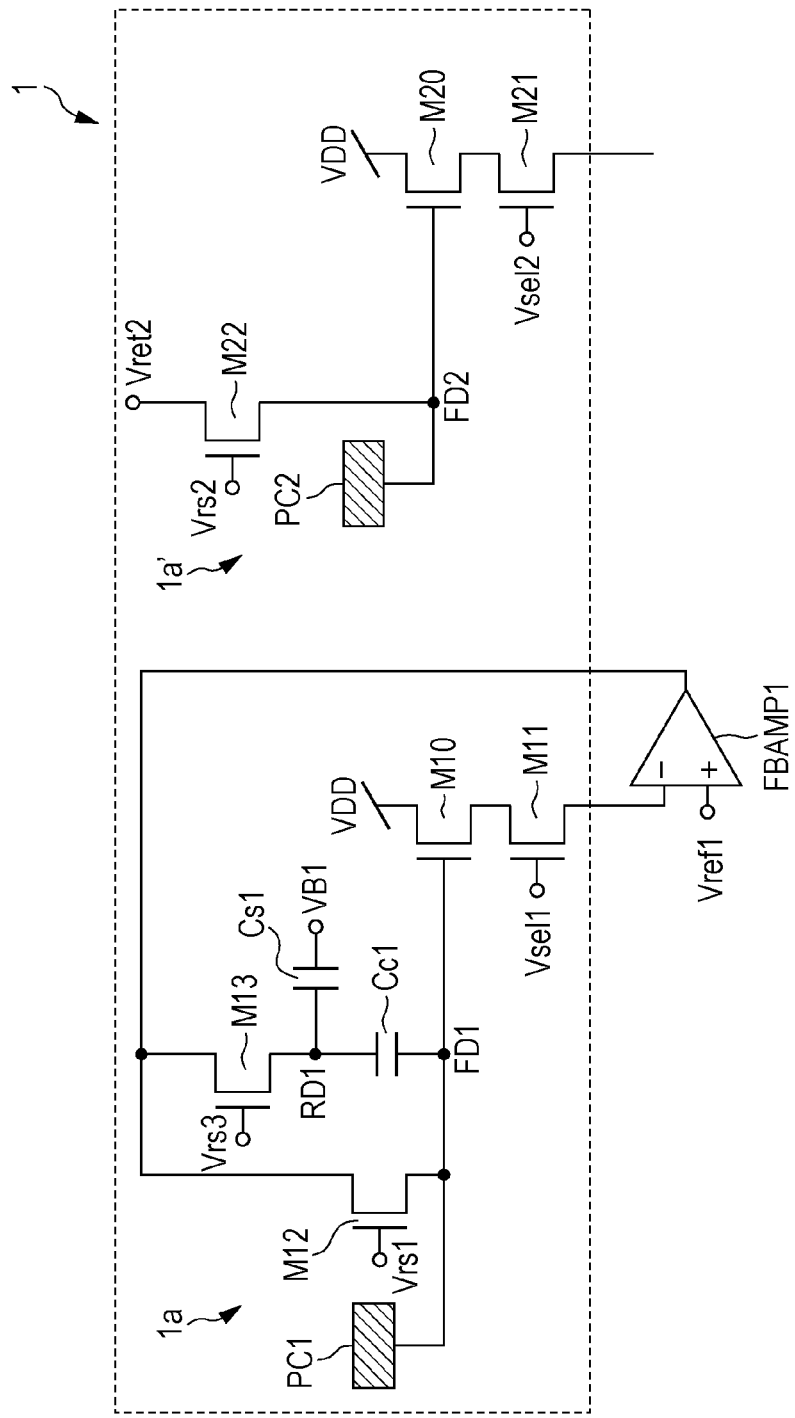
FIG. 9E is a schematic view illustrating still another circuit configuration of the unit pixel according to exemplary First Embodiment.
Figure 9F:
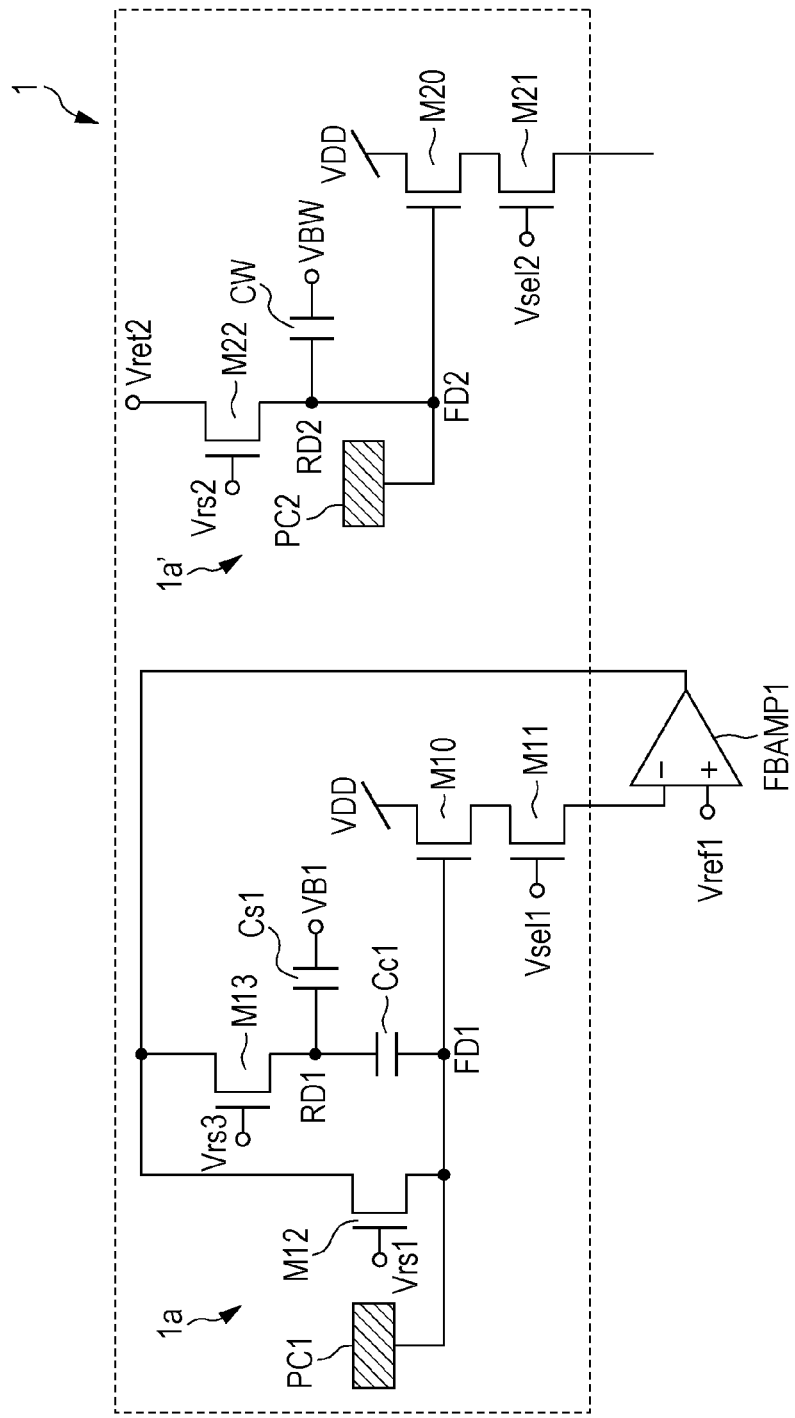
FIG. 9F is a schematic view illustrating still another circuit configuration of the unit pixel according to exemplary First Embodiment.
Figure 9G:
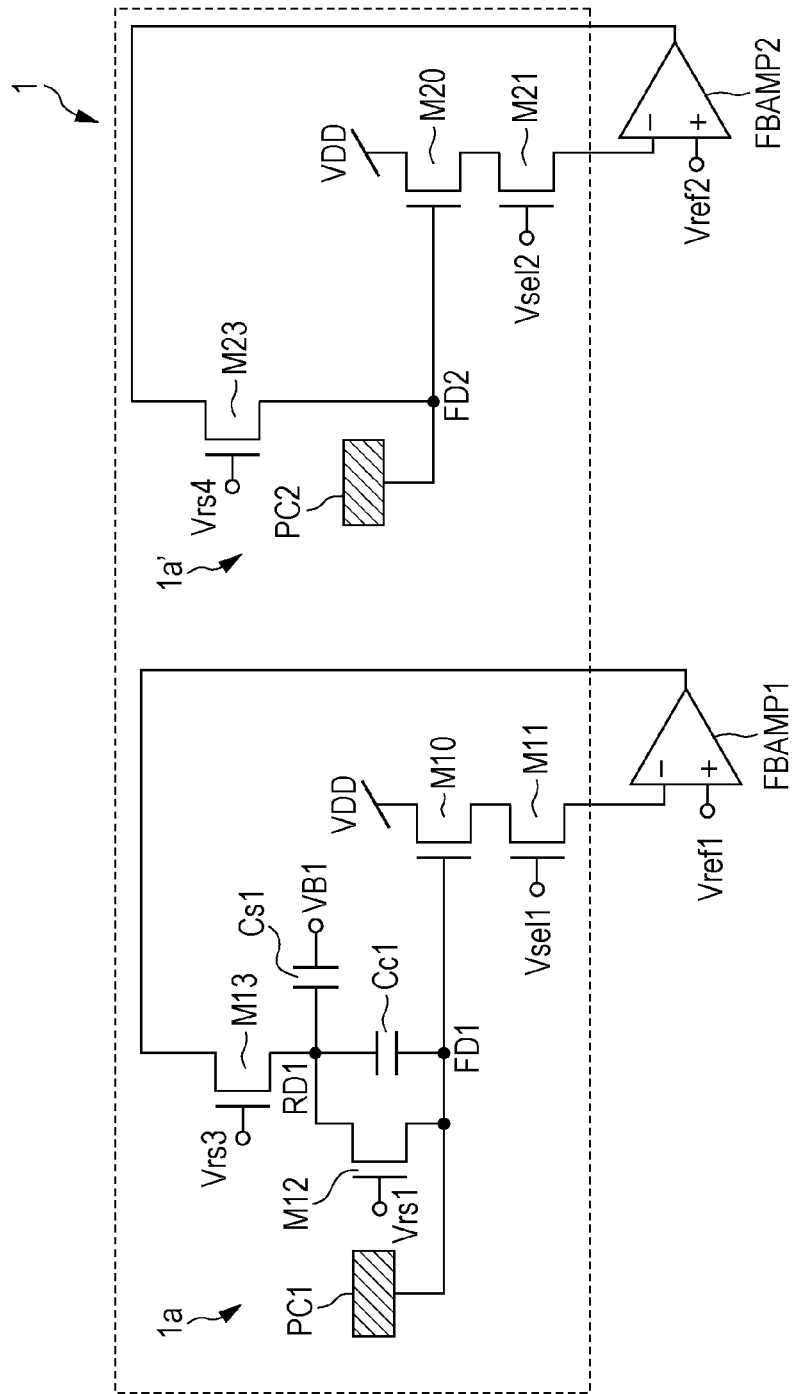
FIG. 9G is a schematic view illustrating still another circuit configuration of the unit pixel according to exemplary First Embodiment.
Figure 9H:
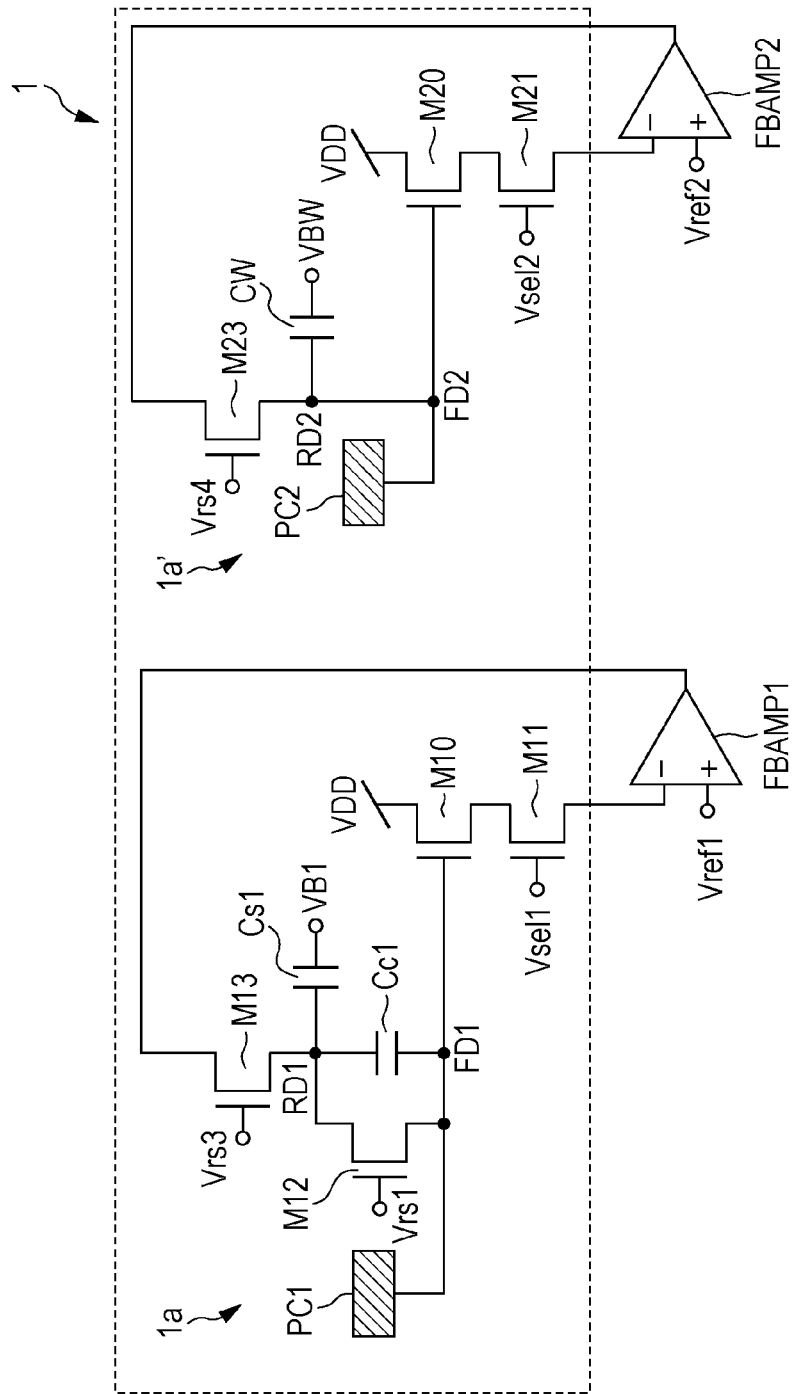
FIG. 9H is a schematic view illustrating still another circuit configuration of the unit pixel according to exemplary First Embodiment.
Figure 9I:
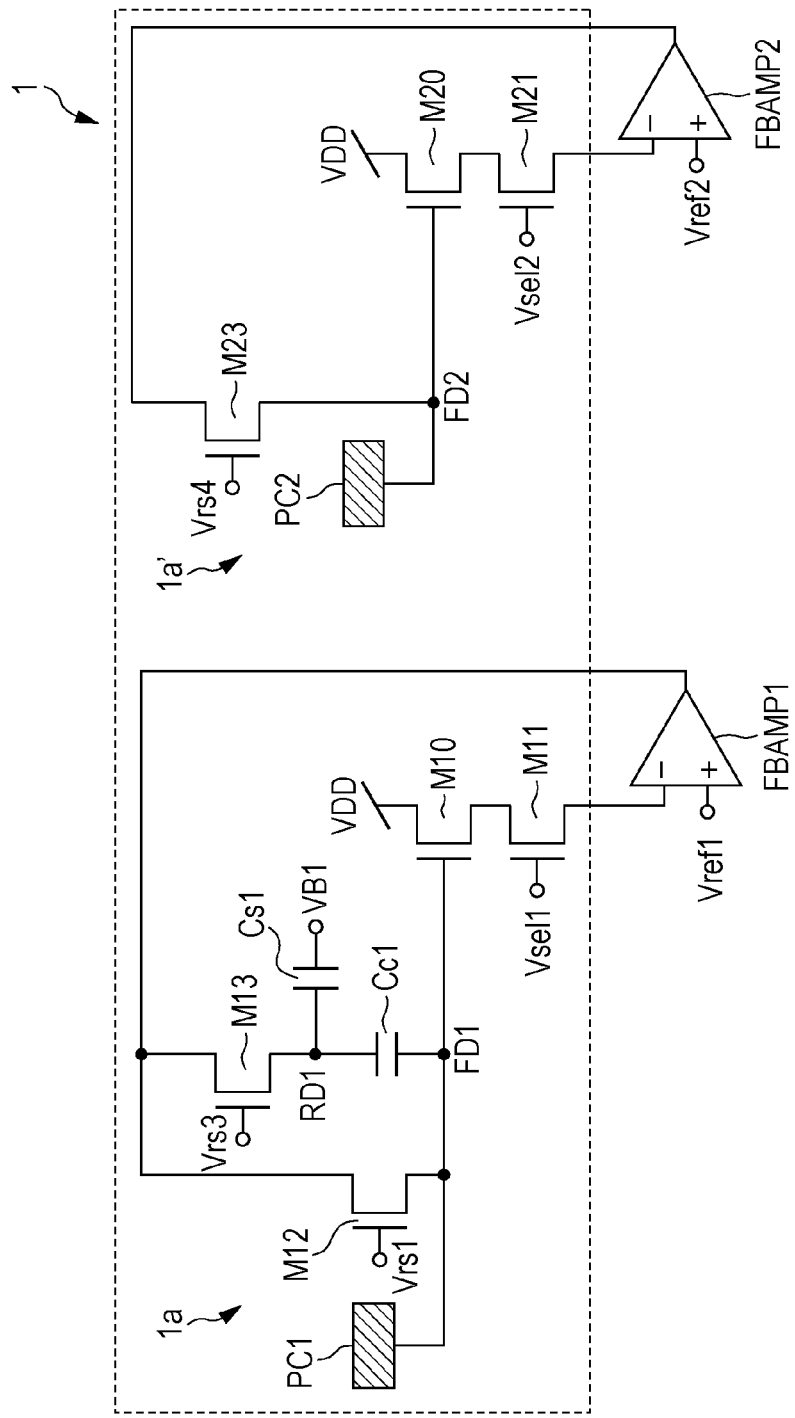
FIG. 9I is a schematic view illustrating still another circuit configuration of the unit pixel according to exemplary First Embodiment.
Figure 9J:
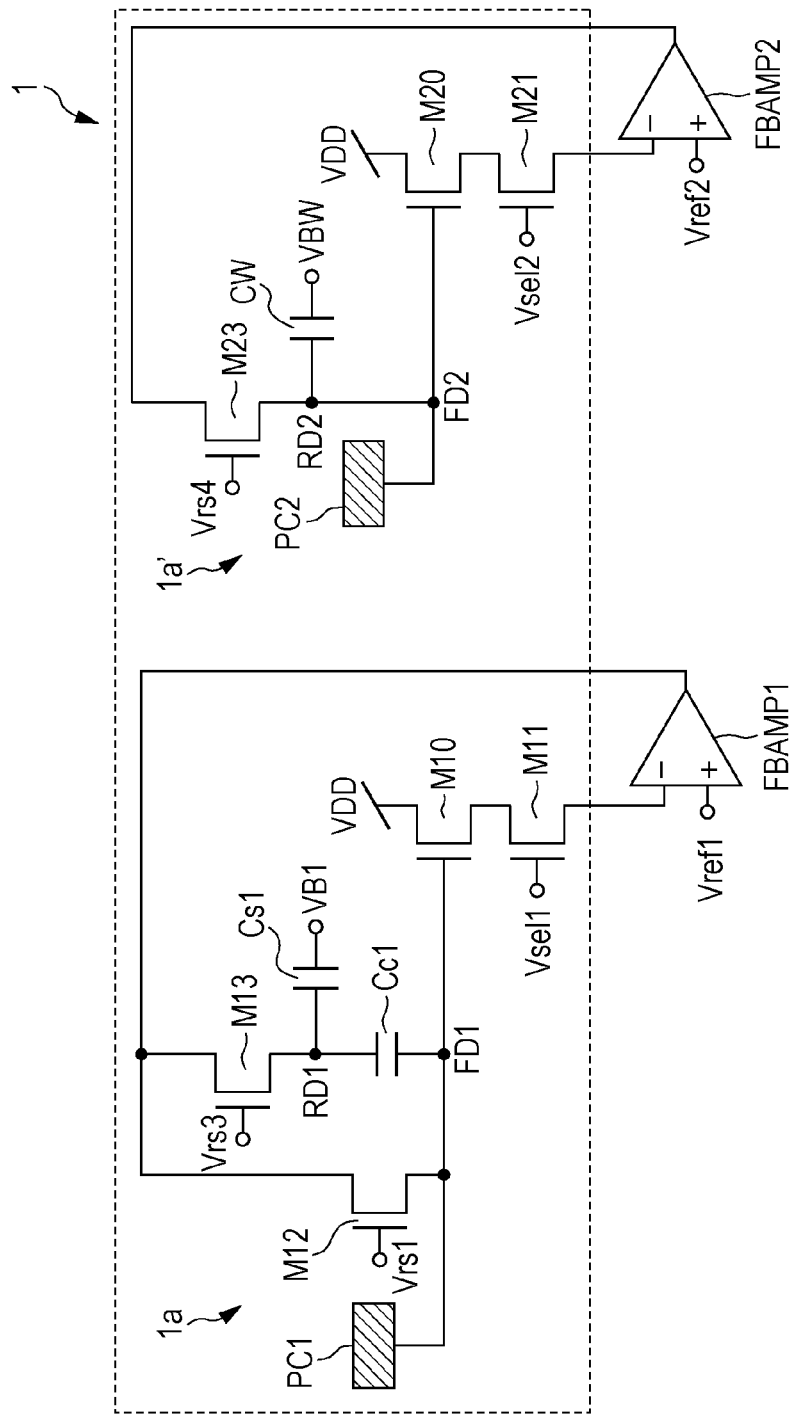
FIG. 9J is a schematic view illustrating still another circuit configuration of the unit pixel according to exemplary First Embodiment.
Figure 9K:
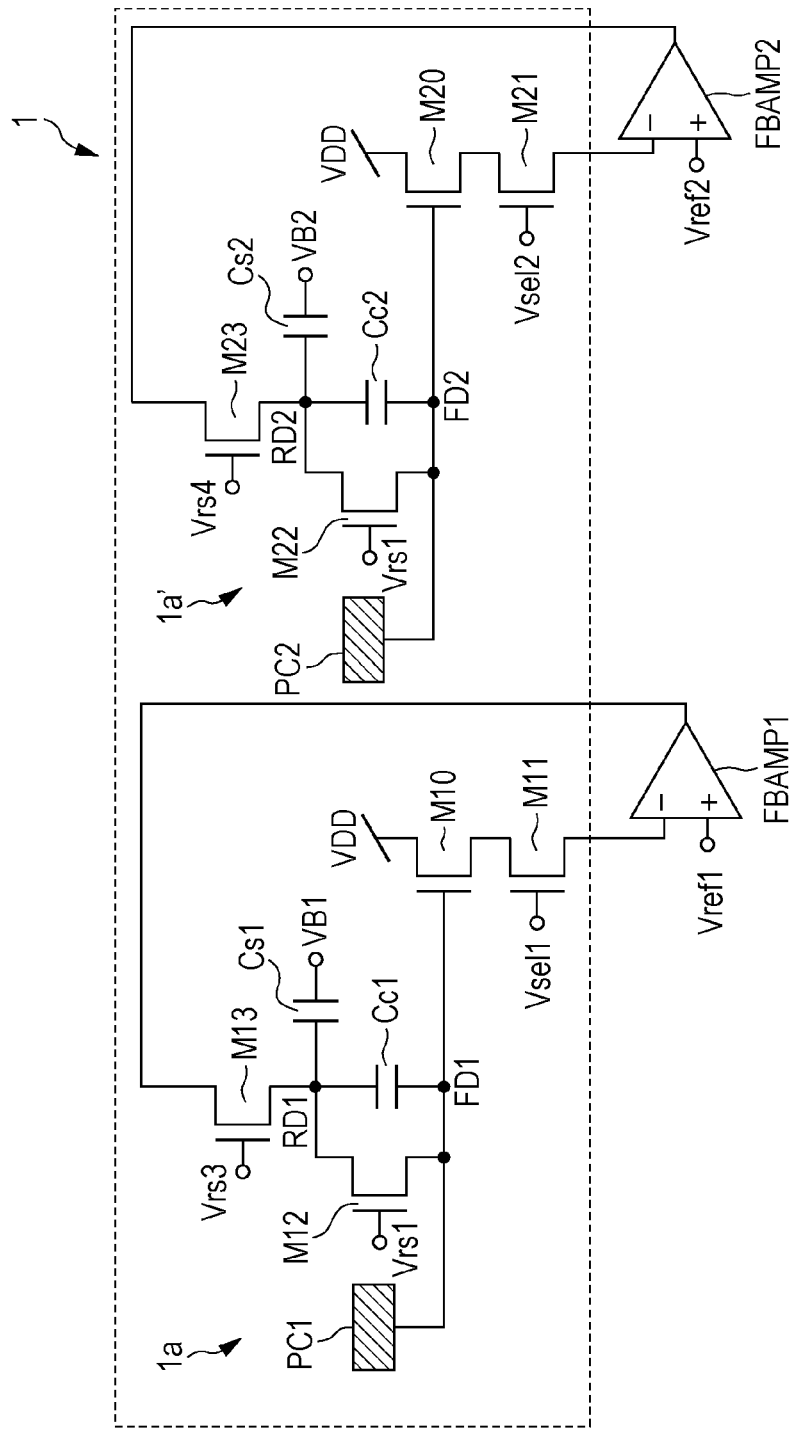
FIG. 9K is a schematic view illustrating still another circuit configuration of the unit pixel according to exemplary First Embodiment.
Figure 9L:
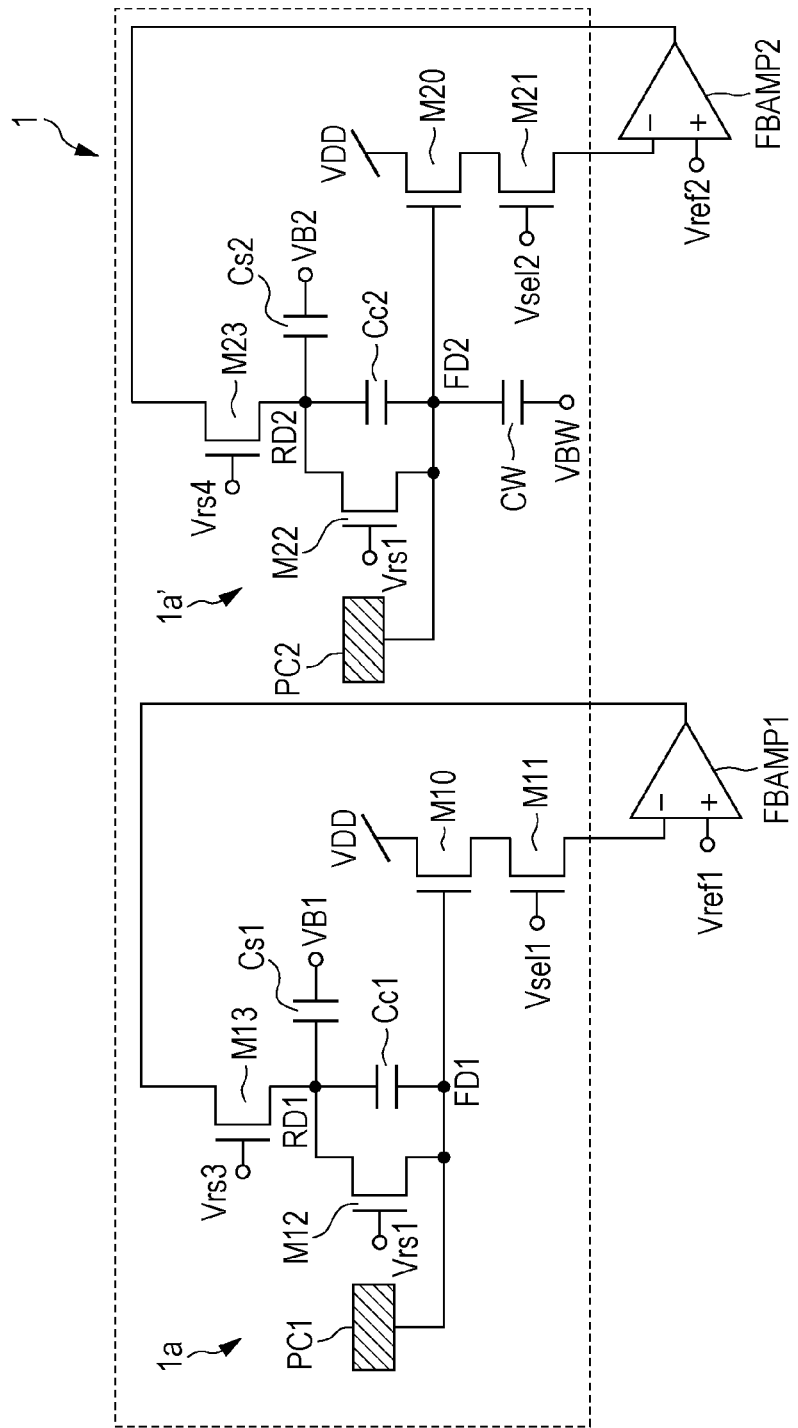
FIG. 9L is a schematic view illustrating still another circuit configuration of the unit pixel according to exemplary First Embodiment.
Figure 9M:
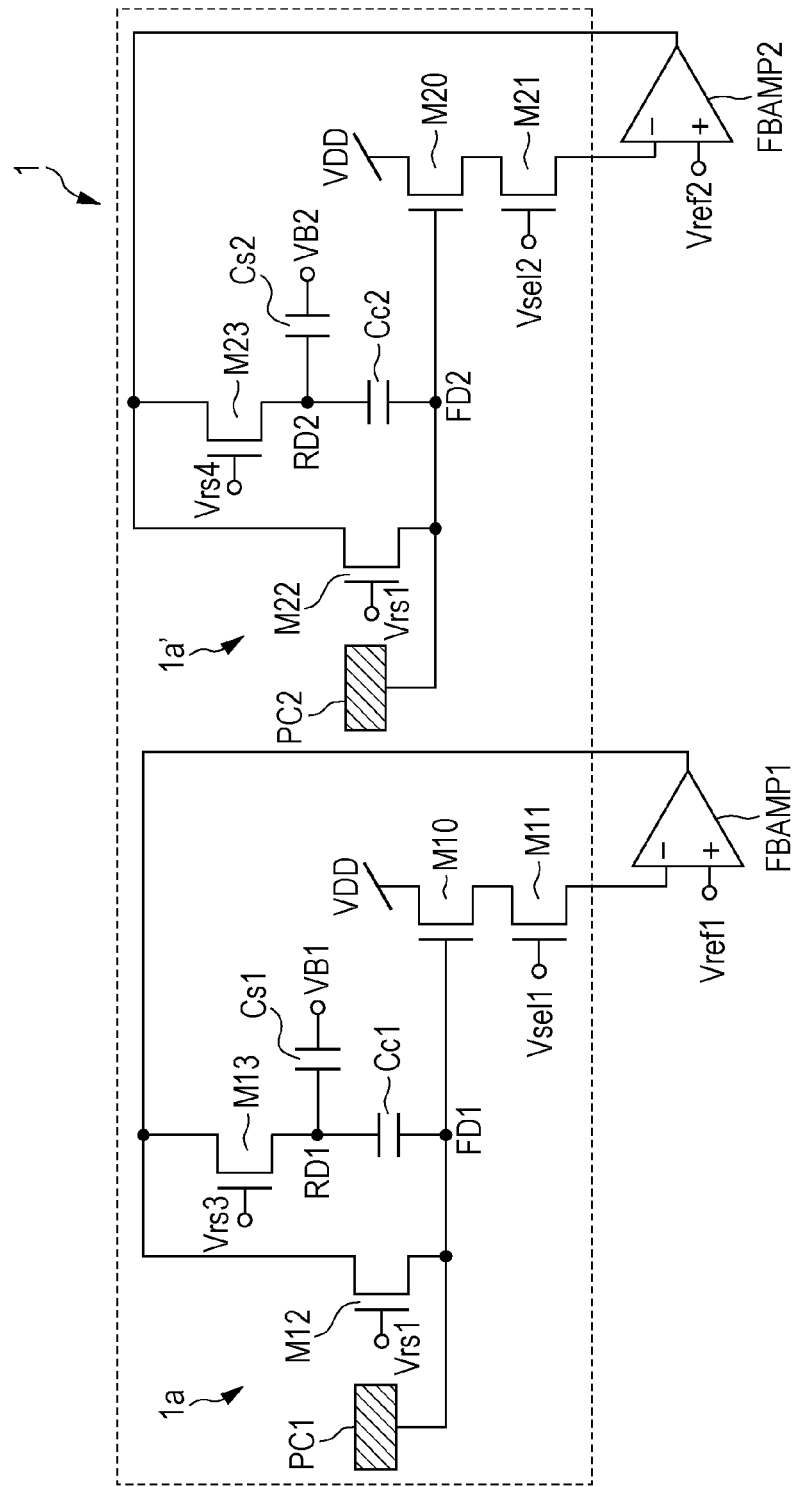
FIG. 9M is a schematic view illustrating still another circuit configuration of the unit pixel according to exemplary First Embodiment.
Figure 9N:
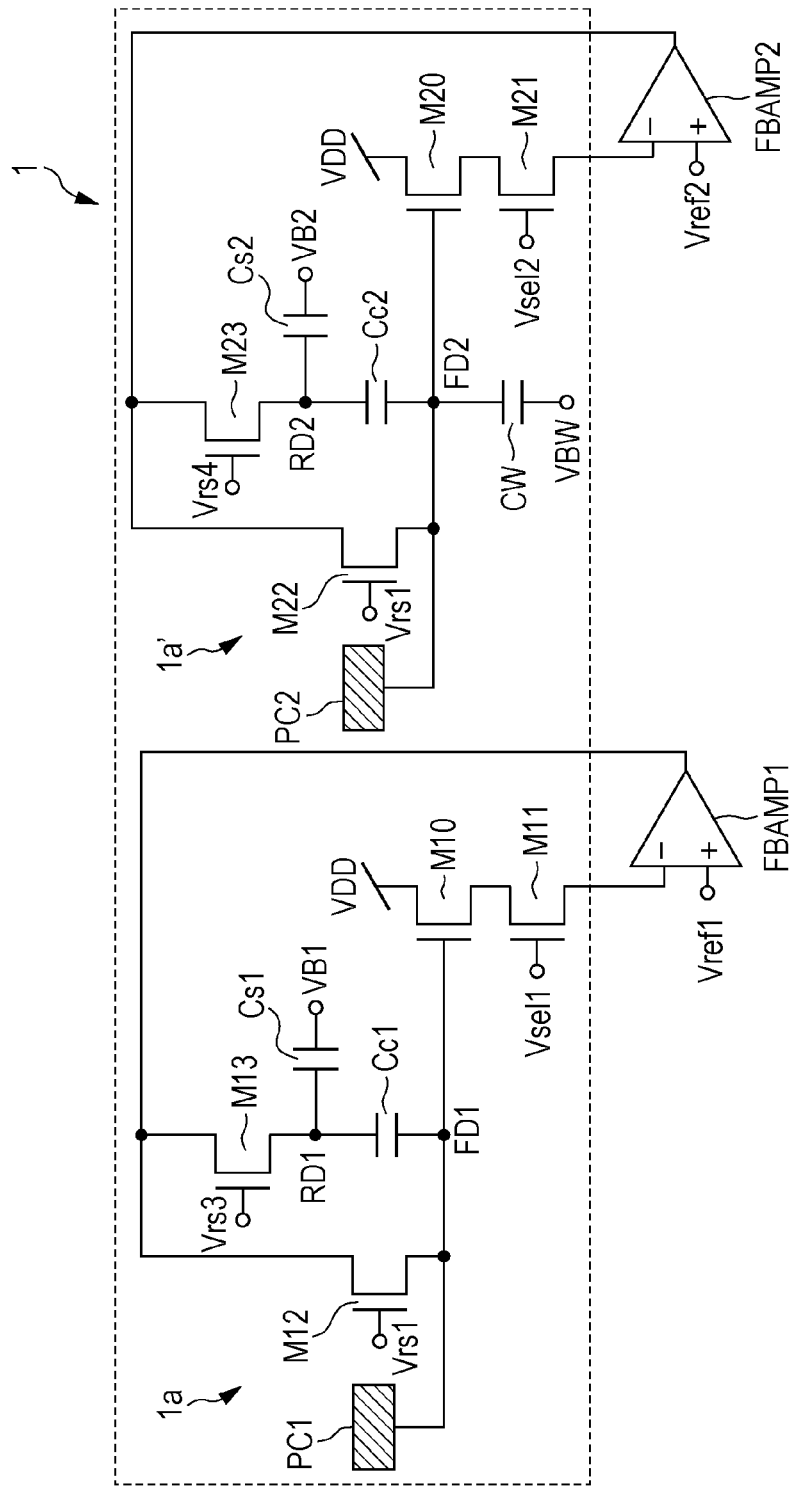
FIG. 9N is a schematic view illustrating still another circuit configuration of the unit pixel according to exemplary First Embodiment.

FIG. 9A through 9N illustrate still other examples of the circuit configuration of the unit pixel 1 according to the present embodiment. Effects same as the above effects are obtained by using any of the circuit configurations. The following mainly describes representative ones of the examples of the circuit configuration.

The unit pixel 1 illustrated in FIG. 9A has a configuration obtained by adding a second feedback circuit that forms a second feedback path for negative feedback of kTC noise that occurs when the second reset transistor M23 is turned off, to the second imaging cell 1a' of the unit pixel 1 illustrated in FIG. 7. The second feedback circuit includes a second inverting amplifier FBAMP2. According to this configuration, low-noise imaging is achieved by using the first imaging cell 1a, and low-noise and high-saturation imaging is achieved by using the second imaging cell 1a'. As a result, it is possible to suppress noise throughout imaging data. Especially in imaging of a subject of an intermediate amount of light, noise can be effectively suppressed, and a higher-definition image can be obtained. The second inverting amplifier FBAMP2 corresponds to the second inverting amplifier 11' in FIG. 4.

Gain of the first feedback circuit may be set larger than that of the second feedback circuit. This further improves the noise reducing effect of the first imaging cell 1a. Noise characteristics of the second imaging cell 1a' do not pose a problem even in a case where the noise characteristics are equivalent to conventional ones.

The unit pixel 1 illustrated in FIG. 9C has a configuration obtained by adding a first bandwidth control transistor M13, a first capacitor Cc1, and a second capacitor Cs1, to the first imaging cell 1a of the unit pixel 1 illustrated in FIG. 7. The first bandwidth control transistor M13 performs bandwidth control of the first feedback circuit. The first bandwidth control transistor M13 is disposed on the feedback path and is connected to an output of the first inverting amplifier FBAMP1. The first capacitor Cc1 is electrically connected between the readout node FD1 and a source or a drain of the first bandwidth control transistor M13. The second capacitor Cs1 has a larger capacitance value than the first capacitor Cc1 and is connected between the first capacitor Cc1 and a reference voltage VB1. According to this configuration, it is possible to improve noise suppression performance of the first imaging cell 1a.

It is desirable that the first reset transistor M12 be connected between the readout node FD1 connected to the first photoelectric converter PC1 and a connection node RD1 between the first capacitor Cc1 and the second capacitor Cs1, as illustrated in FIG. 9C. Alternatively, it is desirable that the first reset transistor M12 be connected between the readout node FD1 connected to the first photoelectric converter PC1 and one of a source and a drain of the first bandwidth control transistor M13 that is not connected to the connection node RD1, as illustrated in FIG. 9E. According to such a configuration, it is unnecessary to additionally provide a reset voltage Vret (=VRST). Furthermore, since convergence of kTC noise into a value close to a reset value can be achieved by feedback, the speed of noise cancelling can be increased.

The unit pixel 1 illustrated in FIGS. 9G and 9I has a configuration obtained by adding a second feedback circuit to the second imaging cell 1a' of the unit pixel 1 illustrated in FIG. 9C. The second feedback circuit forms a second feedback path for negative feedback of kTC noise that occurs when the second reset transistor M23 is turned off. According to this configuration, low-noise imaging is achieved by using the first imaging cell 1a, and low-noise and high-saturation imaging is achieved by using the second imaging cell 1a'. As a result, it is possible to suppress noise throughout imaging data. Especially in imaging of a subject of an intermediate amount of light, noise can be effectively suppressed, and a higher-definition image can be obtained.

Each of the unit pixels 1 illustrated in FIGS. 9K and 9M has a configuration obtained by adding a second bandwidth control transistor M23 and a capacitance circuit including a third capacitor Cc2 and a fourth capacitor Cs2 to the second imaging cell 1a' of the unit pixel 1 illustrated in FIG. 9G. The second bandwidth control transistor M23 performs bandwidth control of the second feedback circuit. The second bandwidth control transistor M23 is disposed on the feedback path and is connected between an output of the second inverting amplifier FBAMP2 and a connection node RD2 between the third capacitor Cc2 and the fourth capacitor Cs2. The third capacitor Cc2 is electrically connected between the readout node FD2 and a source or a drain of the second bandwidth control transistor M23. The fourth capacitor Cs2 has a larger capacitance value than the third capacitor Cc2 and is connected between the third capacitor Cc2 and a reference voltage VB2. The third capacitor Cc2 is connected in series with the fourth capacitor Cs2. According to this configuration, low-noise imaging is achieved by using the first imaging cell 1a, and low-noise and high-saturation imaging is achieved by using the second imaging cell 1a'. As a result, it is possible to suppress noise throughout imaging data. Especially in imaging of a subject of an intermediate amount of light, noise can be effectively suppressed, and a higher-definition image can be obtained.

According to the circuit configurations illustrated in FIGS. 9A through 9N, it is possible to suppress an unnecessary increase in pixel size. Furthermore, it is possible to provide a small imaging device in which low-noise high-sensitivity imaging is achieved by the first imaging cell 1a and high-saturation low-sensitivity imaging is achieved by the second imaging cell 1a'. Furthermore, a subject having a large difference in brightness can be imaged without a time lag and without blown out highlights and blocked up shadows.

As in the unit pixel 1 illustrated in FIG. 8, a fifth capacitor CW that is electrically connected between the second photoelectric converter PC2 and the reference voltage VBW may be provided as illustrated in FIGS. 9B, 9D, 9F, 9H, 9J, 9L, and 9N. This makes it possible to improve the high-saturation characteristics of the second imaging cell 1a' by a degree corresponding to a capacitance ratio. As a result, it is possible to further widen a dynamic range.

As described above, in the forms illustrated in FIGS. 9A through 9N, a gate width of the first amplifier transistor M10 may be larger than that of the second amplifier transistor M20. This makes it possible to set gm of the first amplifier transistor M10 large. As a result, it is possible to reduce readout noise of the first imaging cell 1a. Noise characteristics of the second imaging cell 1a' do not pose a problem even in a case where the noise characteristics are equivalent to conventional ones. A gate length of the first reset transistor M13 may be longer than that of the second reset transistor M23. This further improves the noise reducing effect of the first imaging cell 1a. Noise characteristics of the second imaging cell 1a' do not pose a problem even in a case where the noise characteristics are equivalent to conventional ones. Furthermore, gain of the first feedback circuit may be set larger than that of the second feedback circuit. This further improves the noise reducing effect of the first imaging cell 1a. Noise characteristics of the second imaging cell 1a' do not pose a problem even in a case where the noise characteristics are equivalent to conventional ones.

It is desirable that the first reset transistor M12 be connected between the readout node FD1 connected to the first photoelectric converter PC1 and the connection node RD1 between the first capacitor Cc1 and the second capacitor Cs1, as illustrated in FIGS. 9G and 9K. Alternatively, it is desirable that the first reset transistor M12 be connected between the readout node FD1 connected to the first photoelectric converter PC1 and one of a source and a drain of the first bandwidth control transistor M13 that is not connected to the connection node RD1, as illustrated in FIGS. 9I and 9M. According to such a configuration, it is unnecessary to additionally provide a reset voltage Vret (=VRST). Furthermore, since convergence into a value close to a reset value can be achieved by feedback, the speed of noise cancelling can be increased.

A specific example of a noise suppression and data readout operation using a feedback circuit is described below.

Readout and Noise Suppression

A noise suppression and data readout operation using the first imaging cell 1a of the unit pixel 1 illustrated in FIG. 9H is described below as a specific example.

In the first signal processing circuit P1, one end of the second capacitor Cs1 is connected to one of a source and a drain of the first bandwidth control transistor M13. The first bandwidth control transistor M13 and the second capacitor Cs1 form an RC filter circuit. Furthermore, one end of the first capacitor Cc1 is also connected to the one of the source and the drain of the first bandwidth control transistor M13. The other end of the first capacitor Cc1 is connected to the first readout node FD1.

A gate of the first bandwidth control transistor M13 receives a first bandwidth control signal Vrs3, and the state of the first bandwidth control transistor M13 is determined by the electric potential of the first bandwidth control signal Vrs3. For example, in a case where the first bandwidth control signal Vrs3 is at a high level, the first bandwidth control transistor M13 is on, and the readout node FD1, the first amplifier transistor M10, the first selection transistor M11, the first inverting amplifier FBAMP1, the first bandwidth control transistor M13, and the first capacitor Cc1 form a feedback path. When the electric potential of the first bandwidth control signal Vrs3 decreases, a resistive component of the first bandwidth control transistor M13 increases. This narrows the bandwidth of the first bandwidth control transistor M13 and narrows a frequency region of a signal that is fed back. While feedback is being formed, a signal that is output by the first bandwidth control transistor M13 is attenuated by an attenuation circuit formed by the first capacitor Cc1 and parasitic capacitance of the readout node FD1 and is fed back to the readout node FD1. An attenuation rate B is expressed by B=Cc/(Cc+CFD) where Cc is the capacitance value of the first capacitor Cc1 and CFD is the parasitic capacitance of the readout node FD1. When the electric potential of the first bandwidth control signal Vrs3 decreases to a low level, the first bandwidth control transistor M13 is turned off, and no feedback is formed. The readout node FD1 is further connected to one of a source and a drain of the first reset transistor M12. The other one of the source and the drain of the first reset transistor M12 is connected to the connection node RD1.

A gate of the first reset transistor M12 receives a first reset control signal Vrs1, and the state of the first reset transistor M12 is determined by the electric potential of the first reset control signal Vrs1. For example, in a case where the first reset control signal Vrs1 is at a high level, the first reset transistor M12 is on, and the readout node FD1 has the same voltage as the connection node RD1. In this case, in a case where the first bandwidth control signal Vrs3 is also at a high level, both of the first reset transistor M12 and the first bandwidth control transistor M13 are on, and both of the readout node FD1 and the connection node RD1 have a desired reset voltage VRST. This reset voltage VRST is a value obtained by subtracting a voltage between a gate of the first amplifier transistor M10 and one of a source and a drain of the first amplifier transistor M10 that is not connected to VDD, from the reference voltage Vref1 of the first inverting amplifier FBAMP1. One of a source and a drain of the first selection transistor M11 is connected to the vertical signal line 9. A gate of the first selection transistor M11 receives a first selection control signal Vsel1, and the state of the first selection transistor M11 is determined by the electric potential of the first selection control signal Vsel1. For example, in a case where the first selection control signal Vsel1 is at a high level, the first selection transistor M11 is on, and the first amplifier transistor M10 and the vertical signal line 9 are electrically connected. In a case where the first selection control signal Vsel1 is at a low level, the first selection transistor M11 is off, and the first amplifier transistor M10 and the vertical signal line 9 are electrically separated.

Operation of First Imaging Cell 1a

Figure 10:
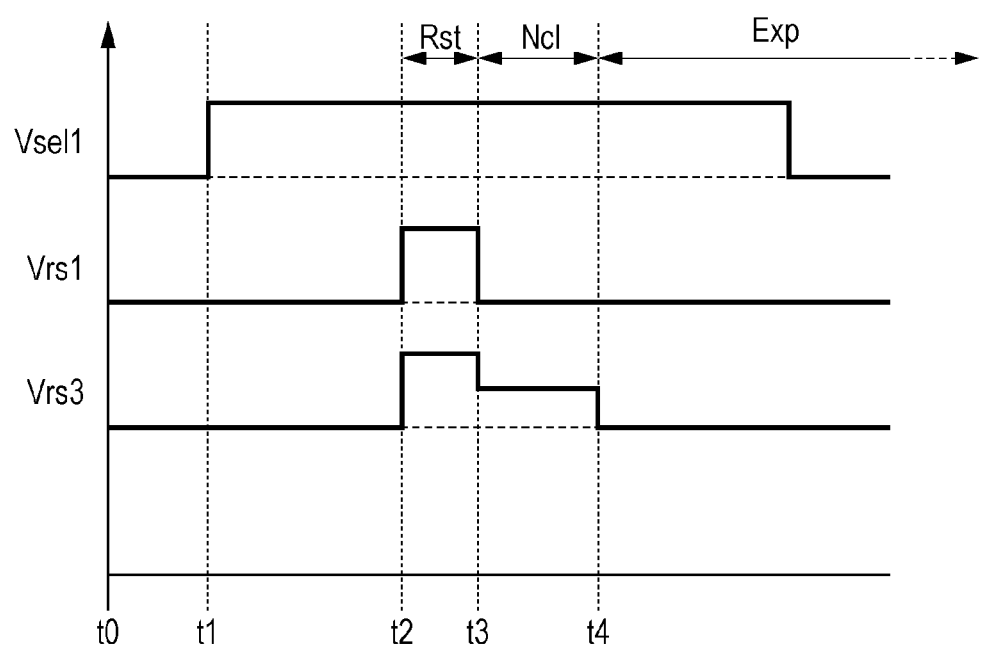
FIG. 10 is a timing chart illustrating an example of operation timings of a first imaging cell according to exemplary First Embodiment.

FIG. 10 illustrates an example of operation timings of the first imaging cell 1a according to the present embodiment.

Reset Period

First, the first selection control signal Vsel1 is brought into a high level (time t1). Next, the electric potential of the first bandwidth control signal Vrs3 is brought into a high level so that the first bandwidth control transistor M13 is turned on. At the same timing, the first reset control signal Vrs1 is brought into a high level so that the first reset transistor M12 is turned on (time t2). This makes the voltage of the readout node FD1 equal to the reset voltage VRST.

Noise Suppression Period

Next, the first reset control signal Vrs1 is brought into a low level so that the first reset transistor M12 is turned off (time t3). In this state, the first feedback circuit forms feedback at an amplification factor (=−A×B) where −A is an amplification factor of an inverting amplifier and B is a rate of attenuation by the first capacitor Cc1, and therefore the kTC noise of the readout node FD1 that occurs when the first reset transistor M12 is turned off is suppressed to 1/(1+A×B). Furthermore, noise is suppressed at high speed by setting the electric potential of the first bandwidth control signal Vrs3 so that the operation bandwidth of the first bandwidth control transistor M13 is a first bandwidth that is a broad bandwidth.

At the same timing as the timing at which the first reset control signal Vrs1 is brought into a low level, the first bandwidth control signal Vrs3 is set to an intermediate electric potential between the high level and the low level (time t3). Note that this timing may be slightly later than the time t3. At this point in time, the operation bandwidth of the first bandwidth control transistor M13 is a second bandwidth that is lower than the first bandwidth. The noise suppressing effect is increased by making the second bandwidth sufficiently lower than the operation bandwidth of the first amplifier transistor M10. However, trade-off for this is extension of a period necessary for noise suppression. The noise suppression effect is obtained even in a case where the second bandwidth is higher than the operation bandwidth of the first amplifier transistor M10. A designer can design the second bandwidth to any value in accordance with a period for noise suppression. In the present embodiment, it is assumed that the second bandwidth is sufficiently lower than the operation bandwidth of the first amplifier transistor M10.

In a state where the second bandwidth is lower than the operation bandwidth of the first amplifier transistor M10, thermal noise that occurs in the first bandwidth control transistor M13 is suppressed to be $1/(1+A\times B)^{1/2}$ times by a first feedback circuit. In this state, the first bandwidth control signal Vrs3 is set to a low level so that a bandwidth control transistor is turned off (time t4). At this point in time, kTC noise that remains in the readout node FD1 is the sum of squares of kTC noise resulting from the first reset transistor M12 and kTC noise resulting from the first bandwidth control transistor M13. The kTC noise of the first bandwidth control transistor M13 that occurs in a state where there is no suppression by feedback is $(CFD/Cs)^{1/2}$ times the kTC noise of the first reset transistor M12 that occurs in a state where there is no suppression by feedback where Cs is the capacitance value of the second capacitor Cs1. When this is taken into consideration, the kTC noise is suppressed to be $[1+(1+A\times B)\times CFD/Cs]^{1/2}/(1+A\times B)$ times as compared with a case where there is no feedback.

Note that the first bandwidth control signal Vrs3 may be controlled so that the first bandwidth control transistor M13 gradually changes from an ON state to an OFF state. That is, the level of the first bandwidth control signal Vrs3 may be controlled so that the first bandwidth control transistor M13 changes across a threshold voltage of the first bandwidth control transistor M13. This makes it possible to suppress noise of all of the unit pixels 1 even in a case where there are variations in threshold voltage of the first bandwidth control transistor M13 among the plurality of unit pixels 1 that constitute the imaging device 100. Furthermore, a voltage range in which the first bandwidth control signal Vrs3 is changed may be limited to a range of the variations of the unit pixels 1. This makes it possible to shorten a period for the change and achieve high speed noise suppression.

Exposure/Readout Period

Next, the electric potential of the vertical signal line 9 shifts to a level corresponding to the electric potential of the readout node FD1, but an amplification factor of a source follower circuit formed by the first amplifier transistor M10, the first selection transistor M11, and the electric current source 5 (see FIG. 4) is approximately 1. At this point in time, a voltage signal that has changed by a degree corresponding to the electric signal generated by the first photoelectric converter PC1 from the time of completion of noise suppression (time t4) to readout is accumulated in the readout node FD1. The voltage signal of the readout node FD1 is output to the vertical signal line 9 at an amplification factor of approximately 1 by the source follower circuit. Random noise is a fluctuation of output (i.e., kTC noise) obtained when the electric signal generated by the first photoelectric converter PC1 is 0. The kTC noise is suppressed to be $[1+(1+A \times B) \times CFD/Cs]^{1/2}/(1+A \times B)$ times during the noise suppression period. Furthermore, during the exposure/readout period, the voltage signal of the readout node FD1 is output to the vertical signal line 9 at an amplification factor of approximately 1. Therefore, according to the present embodiment, it is possible to acquire good image data in which random noise is suppressed.

The random noise is suppressed by increasing the second capacitor Cs1 as much as the area permits.

In general, random noise is reduced by increasing capacitance. However, when the electric charge signal is converted into a voltage signal in the readout node FD1, the signal itself decreases. As a result, S/N is not improved.

In the present embodiment, since the readout node FD1 and the connection node RD1 are separated by the first capacitor Cc1, the signal decrease does not occur even in a case where the capacitance of the second capacitor Cs1 is increased. Since only the random noise is suppressed, the S/N ratio can be improved. Therefore, the present embodiment is effective in an imaging device in which the area of each unit pixel 1 can be made large.

A post-stage circuit for detecting a signal of the vertical signal line 9 may be connected, for example, as illustrated in FIG. 4. The post-stage circuit is, for example, constituted by a first vertical scanning circuit 2, a second vertical scanning circuit 2', a first column AD conversion circuit 4, and a second column AD conversion circuit 4'. However, the present disclosure is not limited to such a circuit configuration.

In the imaging device 100, CDS for cancelling a variation of the post-stage circuit may be performed. Specifically, the aforementioned reset operation is performed again after readout of a signal voltage. After completion of the reset operation, the readout operation described in Exposure/Readout Period is performed before light detection by the first photoelectric converter PC1. In this way, a reference voltage can be read out. A signal excluding fixed noise can be obtained by finding a difference between the signal voltage and the reference voltage.

In the present embodiment, a signal of the readout node FD1 is read out by the source follower circuit at an amplification factor of approximately 1 during the exposure/readout period. However, the present disclosure is not limited to this. The amplification factor may be changed by a designer in accordance with an S/N ratio and a circuit range necessary for a system.

In the present embodiment, the noise suppressing effect can be increased by increasing the capacitance value of a capacitor disposed in the first imaging cell 1a.

Furthermore, the reset voltage of the readout node FD1 in the reset period may be supplied via the connection node RD1 as illustrated in FIG. 9C or may be directly supplied from the first inverting amplifier FBAMP1 as illustrated in FIG. 9F. Alternatively, it is also possible to employ a configuration in which a desired voltage value is supplied from an outside. According to these examples of the configuration, wires that connect nodes can be optimized in a pixel layout having a small area, and thus a pixel area can be reduced.

Although an example of operation of the first imaging cell 1a has been described above, the second imaging cell 1a' can be also operated in a manner similar to the first imaging cell 1a. Furthermore, an example of operation of the first imaging cell 1a having the highest noise suppression performance illustrated in FIG. 9H has been described above. However, a configuration in which the first bandwidth control transistor M13 is not provided (e.g., the first imaging cell 1a illustrated in FIG. 7) may be selected in accordance with required noise level and pixel area. In this case, bandwidth limitation may be placed while performing a reset operation by supplying an intermediate electric potential (e.g., Vrs3 in FIG. 10) to the first reset transistor M13. Alternatively, only a reset operation may be performed by supplying only a low level and a high level without supplying an intermediate electric potential. Operations of the other transistors are similar to those described above. Furthermore, it is also possible to employ a configuration in which the first bandwidth control transistor M13 and the second feedback circuit are not provided (e.g., the second imaging cell 1a' of FIG. 7). Operations of the other transistors are similar to those described above.

Operation of Imaging Device 100

The imaging device 100 according to the present disclosure can be suitably used for a camera for sensing (e.g., an on-board camera). For example, optimum sensing data can be acquired by causing the first imaging cell 1a and the second imaging cell 1a' to operate at different frame rates. A frame rate corresponds to an operation frequency of an electric charge sensing circuit. In this specification, an operation frequency and a frame rate are used without distinction. An example of an operation of the imaging device 100 according to the present disclosure is described below by taking a camera for sensing as an example.

For example, the first signal processing circuit P1 and the second signal processing circuit P2 can be operated at different operation frequencies by using the circuit configuration illustrated in FIG. 9H. In other words, the first imaging cell 1a and the second imaging cell 1a' can be operated at different frame rates. More specifically, in an operation example, an operation frequency of the first signal processing circuit P1 is higher than an operation frequency of the second signal processing circuit P2. For example, the operation frequency of the second signal processing circuit P2 can be 1/n times (n is an integer of 2 or more) as high as the operation frequency of the first signal processing circuit P1.

For example, the first imaging cell 1a performs low-noise high-sensitivity imaging at a high frame rate (e.g., 60 fps), and the second imaging cell 1a' can perform high-saturation low-sensitivity imaging at a low frame rate (e.g., 30 fps). A high-sensitivity image can be acquired at a high speed by the first imaging cell 1a, and a high-saturation image can be acquired by the second imaging cell 1a'.

The aforementioned operation example can be applied, for example, to an on-board camera. A vehicle travelling on a road during nighttime is considered. For example, general wide-dynamic-range photographing can be achieved by causing the first imaging cell 1a and the second imaging cell 1a' to operate at the same frame rate (hereinafter sometimes referred to as "general photographing"). In a case where the first imaging cell 1a and the second imaging cell 1a' operate at different frame rates, the imaging device 100 functions as a camera for sensing. For example, a headlight of a following vehicle can be detected by analyzing a high-saturation image acquired by the second imaging cell 1a'. A known object detection method can be widely used as a headlight detection method. Detection of the headlight triggers high-speed photographing at a high frame rate using the first imaging cell 1a, and movement of the following vehicle can be sensed by acquiring an image necessary for sensing.

According to this operation example, acquisition of only data imaged at a high frame rate that is necessary for sensing can be triggered by detection of a headlight. That is, a headlight (e.g., a specific subject) is detected from an image acquired by the second imaging cell 1a', and sensing using data acquired by the first imaging cell 1a is started in response to detection of the specific subject. Therefore, a load on signal processing in a later stage is reduced, and as a result, electric power consumption in a signal processing circuit in a later stage (e.g., a camera signal processing unit that will be described later) can be kept small, as compared with general photographing. Furthermore, for example, a size of a logic circuit (e.g., a field programmable gate array (FPGA)) can be reduced since processing in a later stage can be reduced.

In another operation example, for example, the first imaging cell 1a can perform low-noise high-sensitivity imaging at a low frame rate, and the second imaging cell 1a' can perform high-saturation low-sensitivity imaging at a high frame rate. Therefore, a high-saturation image can be acquired at a high speed by the second imaging cell 1a', and a high-sensitivity image can be acquired by the first imaging cell 1a.

According to this operation example, acquisition of data of a high-saturation image imaged at a high frame rate that is necessary for sensing can be triggered by detection of a specific subject in a high-sensitivity image.

In another operation example, the number N1 of times an electric signal generated by the first photoelectric converter PC1 is read out by the first signal processing circuit P1 and the number N2 of times an electric signal generated by the second photoelectric converter PC2 is read out by the second signal processing circuit P2 may be different from each other in a predetermined period.

For example, assume that the number N1 of times of readout is two times as large as the number N2 of times of readout. In this case, a period of imaging using the first imaging cell 1a is two times as long as a period of imaging using the second imaging cell 1a'. A period of imaging is, for example, a period needed to read out data corresponding to one row of pixels.

In another example, the first imaging cell 1a may perform low-noise high-sensitivity imaging at a high frame rate, the second imaging cell 1a' may perform high-saturation low-sensitivity at a low frame rate, and the first signal processing circuit P1 may read out an electric signal more frequently than the second signal processing circuit P2.

For example, assume that the frame rate of the first imaging cell 1a is 60 fps, the frame rate of the second imaging cell 1a' is 30 fps, and the number N1 of times of readout is four times as large as the number N2 of times of readout. In this case, a period of imaging using the first imaging cell 1a is two times as long as a period of imaging using the second imaging cell 1a'.

According to this operation example, more low-noise high-sensitivity images can be acquired by the first imaging cell 1a. An SN ratio can be improved while keeping noise small by integrating a series of acquired image data. As a result, it is possible to further widen a dynamic range.

In another operation example, an exposure period of the first imaging cell 1a may be different from an exposure period of the second imaging cell 1a'. The exposure period is a period in which irradiated light is accumulated as a signal electric charge. For example, the first imaging cell 1a performs low-noise high-sensitivity imaging at a low frame rate, the second imaging cell 1a' performs high-saturation low-sensitivity imaging at a high frame rate, and an exposure period of the first imaging cell 1a is longer than an exposure period of the second imaging cell 1a'.

According to this operation example, low-noise high-sensitivity imaging is performed by the first imaging cell 1a with a longer exposure period, and thereby a higher-sensitivity image can be acquired. As a result, it is possible to further widen a dynamic range.

As described above, according to the operation examples of the imaging device 100 according to the present disclosure, optimum sensing data can be acquired.

The imaging device 100 including the unit pixel 1 according to variations of the present embodiment can be suitably used for a camera for sensing. The following describes circuit configurations according to the variations.

Examples of the circuit configuration of the unit pixel 1 according to the variations of the present embodiment are described below with reference to FIGS. 11 through 14I.

Figure 11:
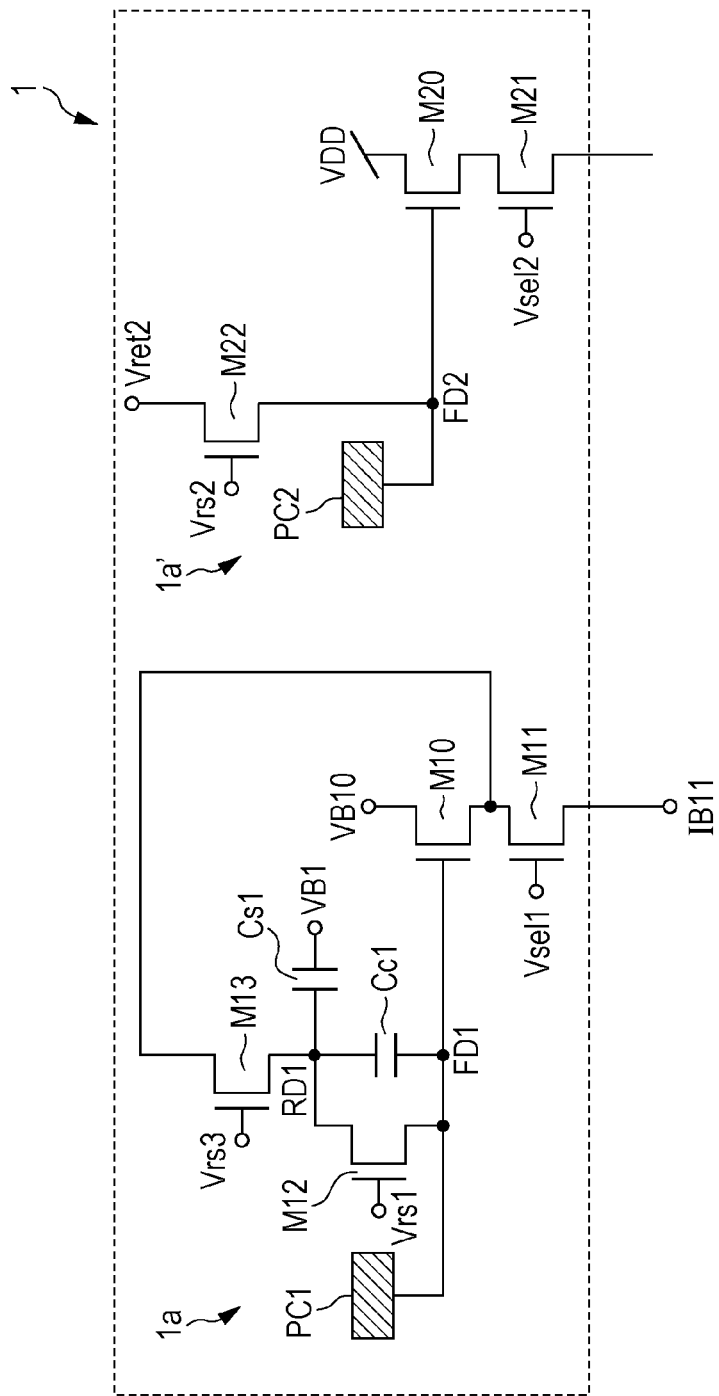
FIG. 11 is a schematic view illustrating a circuit configuration of the unit pixel according to a variation of exemplary First Embodiment.

In FIG. 11, one of a source and a drain of the first bandwidth control transistor M13 is connected to the connection node RD1 between the first capacitor Cc1 and the second capacitor Cs1. The other one of the source and the drain of the first bandwidth control transistor M13 is connected to a connection node between the first amplifier transistor M10 and the first selection transistor M11. The first bandwidth control transistor M13 controls a bandwidth of the first feedback circuit. In this example of the circuit configuration, a feedback path for noise cancelling is formed in a pixel. For example, a signal of the readout node FD1 is read out by the source follower circuit at an amplification factor of approximately 1 during the exposure/readout period. The first feedback circuit performs negative feedback via the first amplifier transistor M10, the first bandwidth control transistor M13, and the first capacitor Cc1. Since the first imaging cell 1a includes the first feedback circuit, the first imaging cell 1a can markedly suppress kTC noise that occurs when the first reset transistor M12 is turned off. Meanwhile, during a noise cancelling period, the first amplifier transistor M10 and the first selection transistor M11 function as inverting amplifier circuits.

The second imaging cell 1a' functions as a high-saturation cell as described above and includes substantially the same circuit configuration as the circuit configuration illustrated in FIG. 6A.

Figure 12:
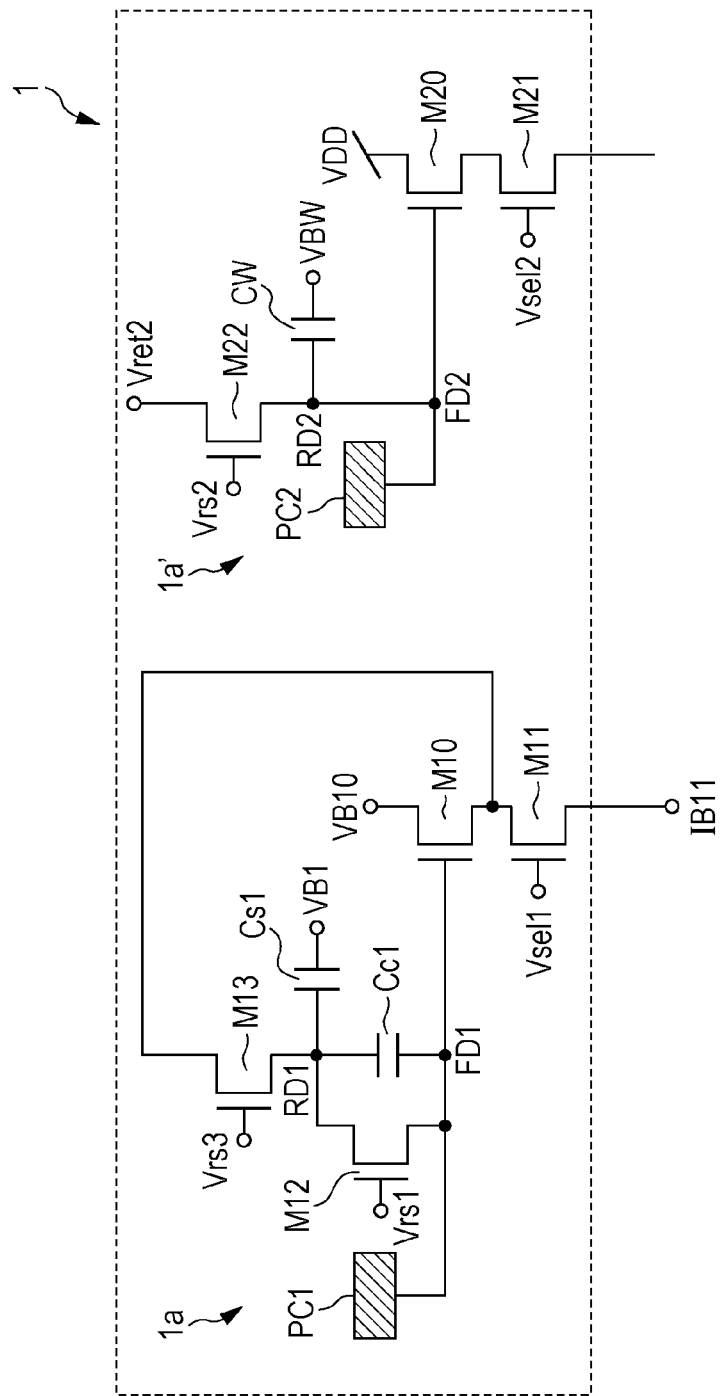
FIG. 12 is a schematic view illustrating another circuit configuration of the unit pixel according to a variation of exemplary First Embodiment.
Figure 13:
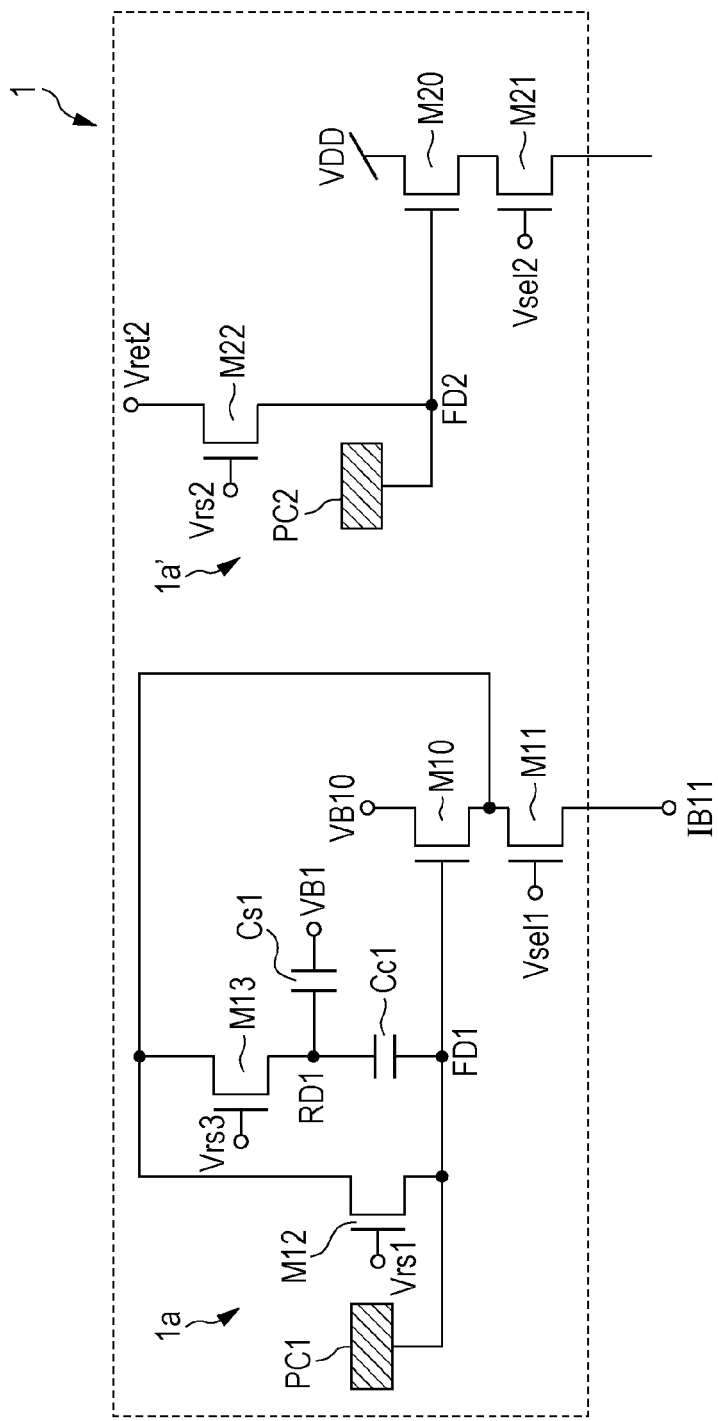
FIG. 13 is a schematic view illustrating another circuit configuration of the unit pixel according to a variation of exemplary First Embodiment.
Figure 14A:
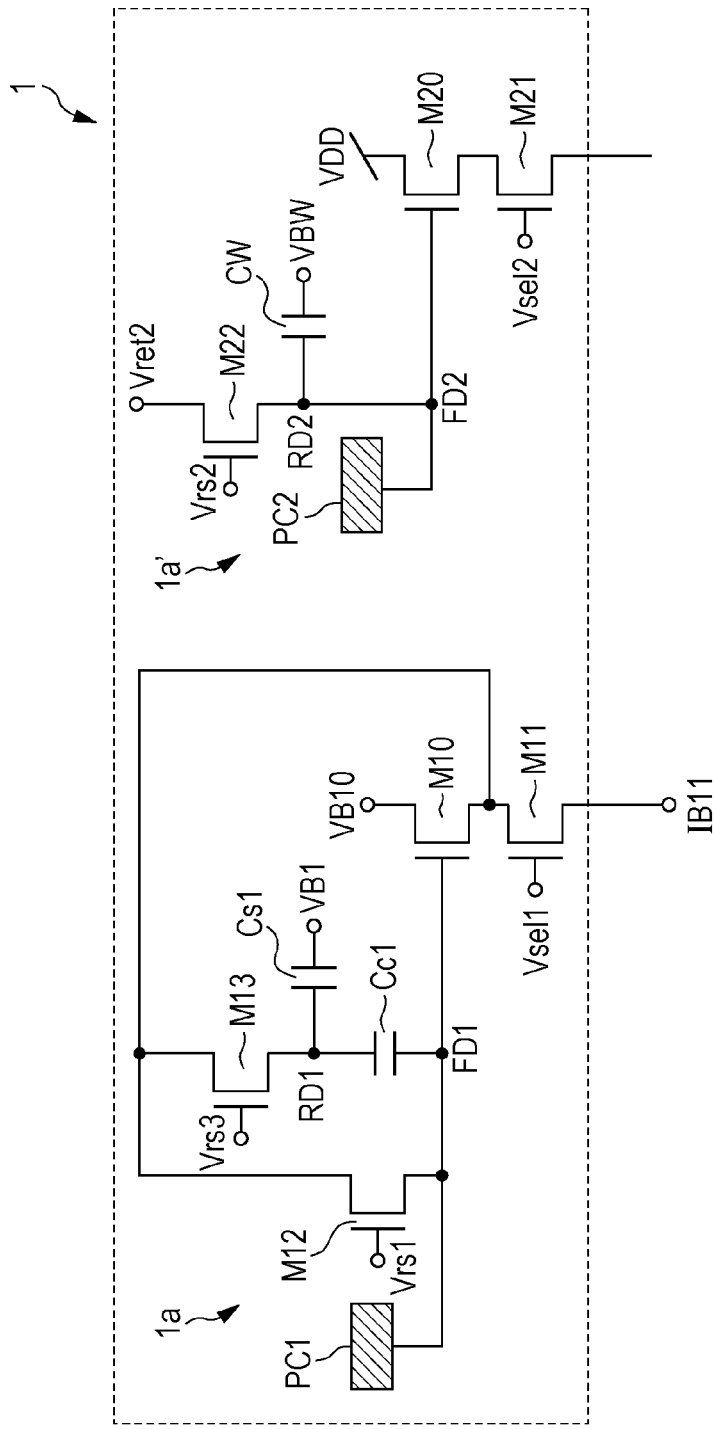
FIG. 14A is a schematic view illustrating another circuit configuration of the unit pixel according to a variation of exemplary First Embodiment.
Figure 14B:
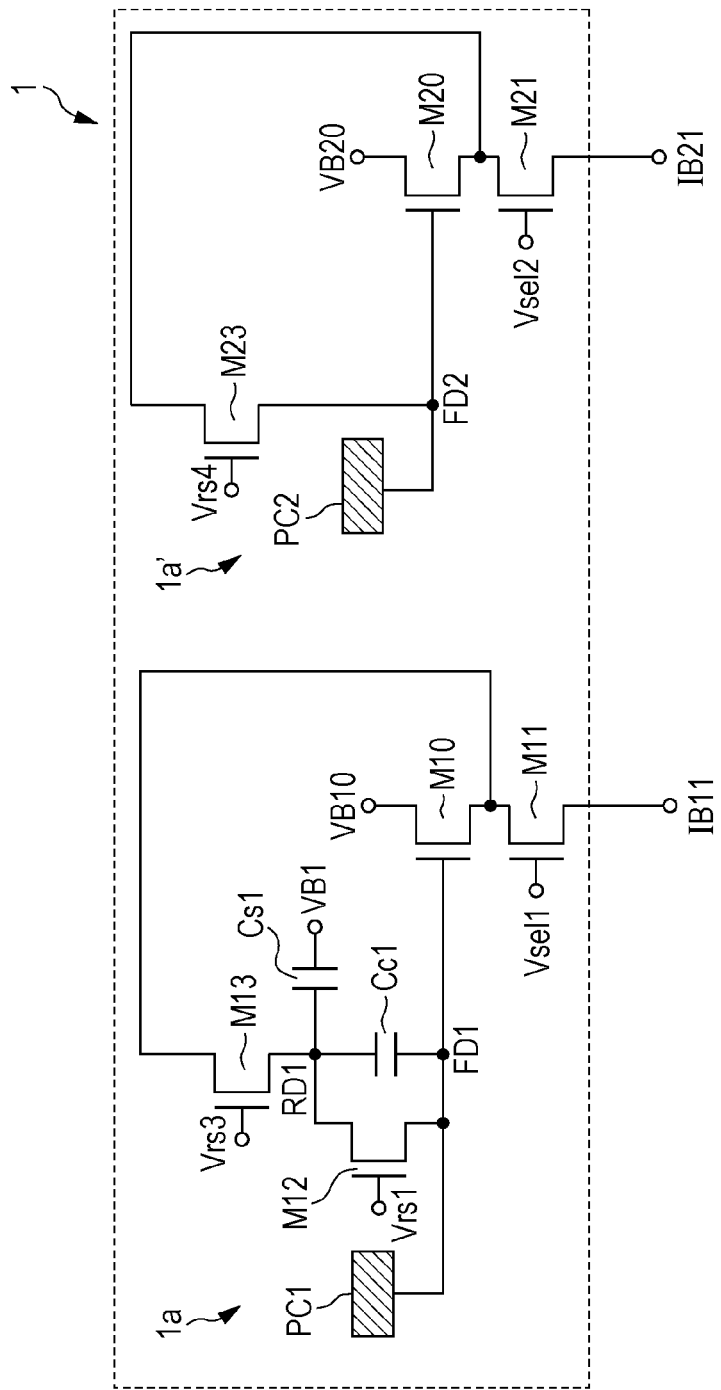
FIG. 14B is a schematic view illustrating another circuit configuration of the unit pixel according to a variation of exemplary First Embodiment.
Figure 14C:
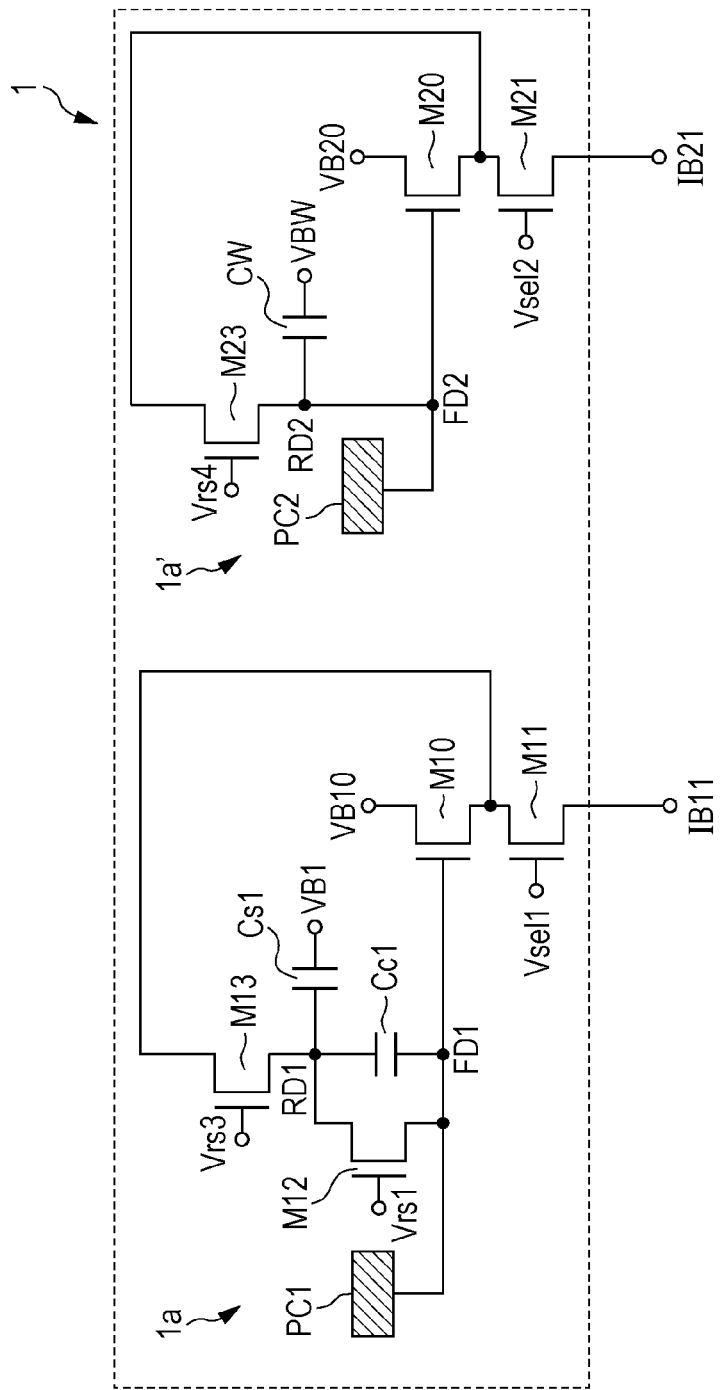
FIG. 14C is a schematic view illustrating another circuit configuration of the unit pixel according to a variation of exemplary First Embodiment.
Figure 14D:
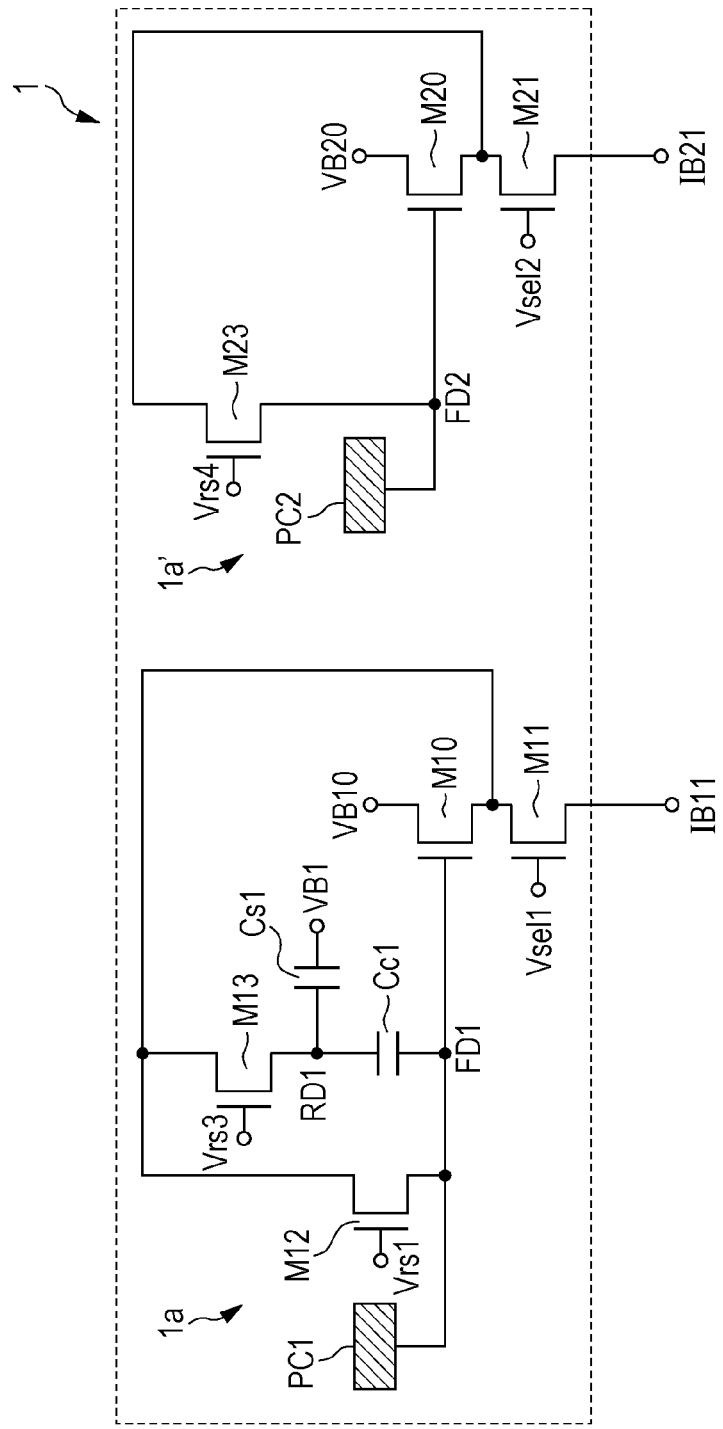
FIG. 14D is a schematic view illustrating another circuit configuration of the unit pixel according to a variation of exemplary First Embodiment.
Figure 14E:
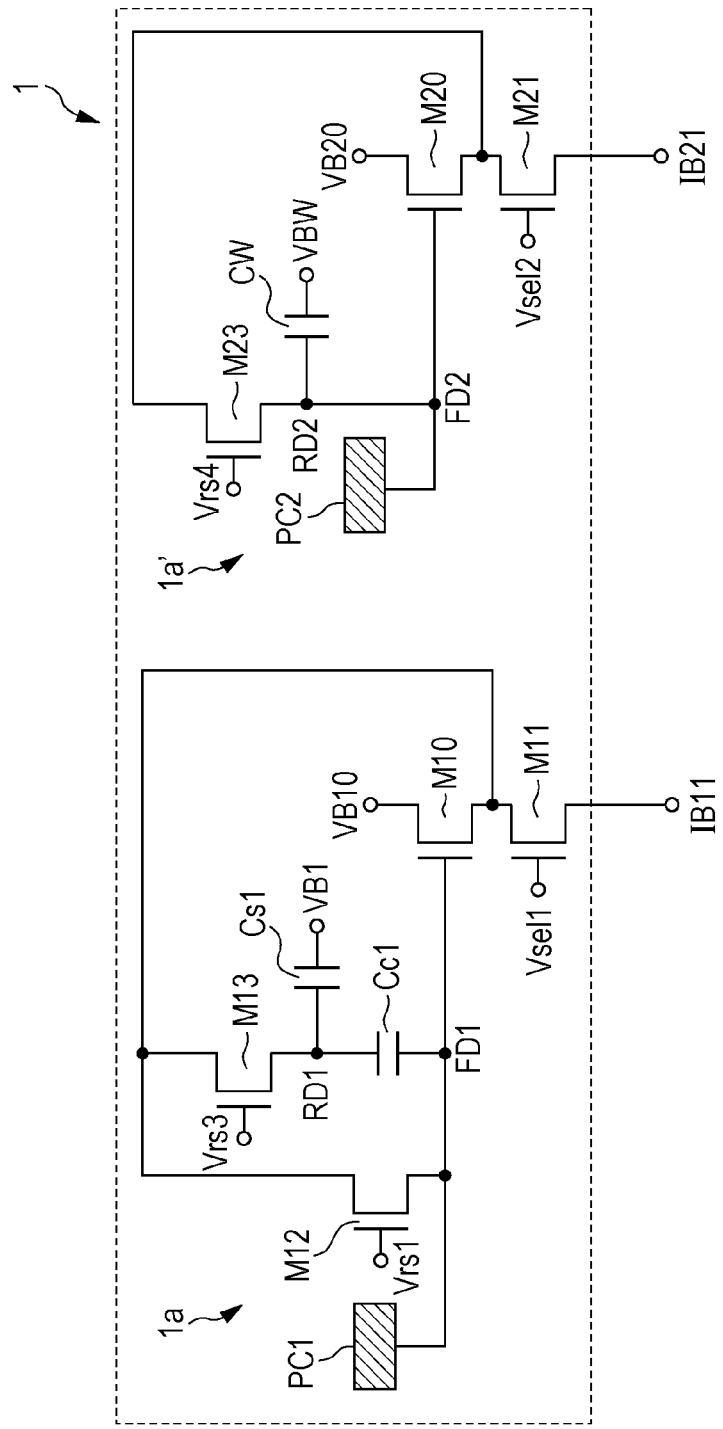
FIG. 14E is a schematic view illustrating another circuit configuration of the unit pixel according to a variation of exemplary First Embodiment.
Figure 14F:
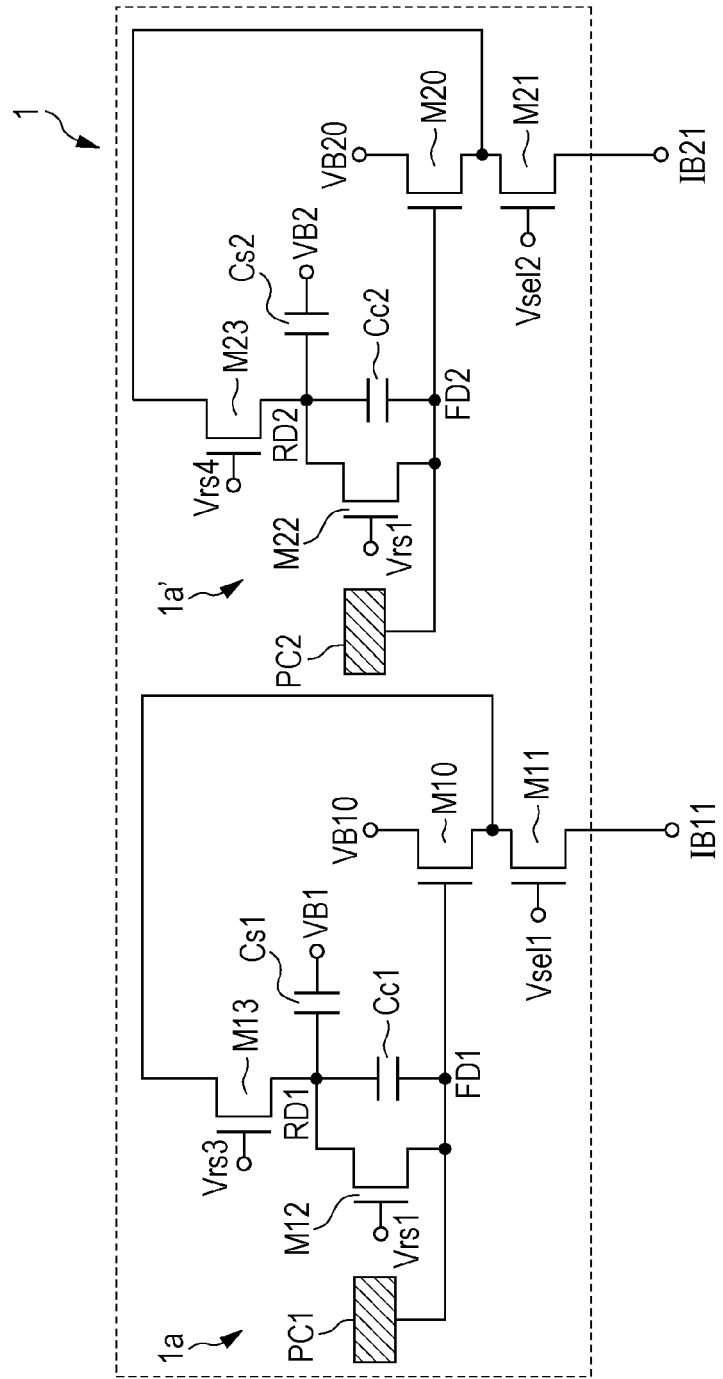
FIG. 14F is a schematic view illustrating another circuit configuration of the unit pixel according to a variation of exemplary First Embodiment.
Figure 14G:
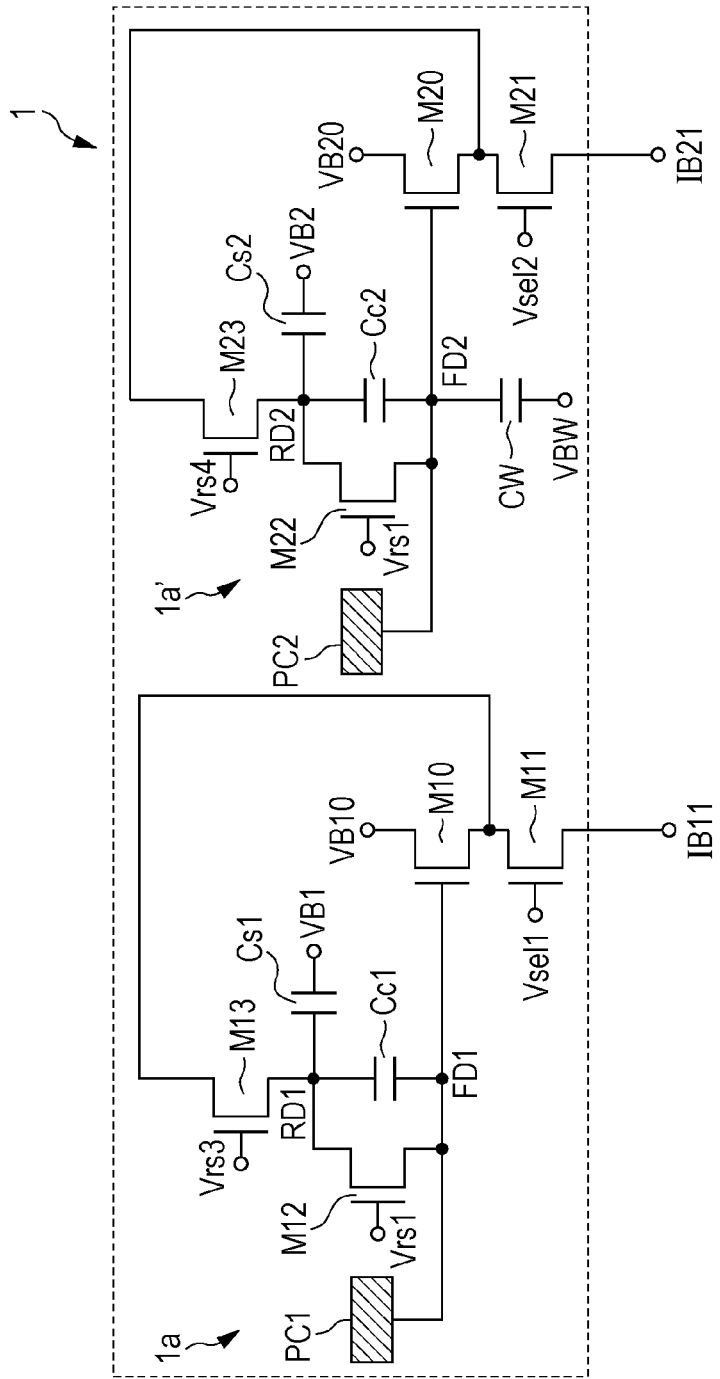
FIG. 14G is a schematic view illustrating another circuit configuration of the unit pixel according to a variation of exemplary First Embodiment.
Figure 14H:
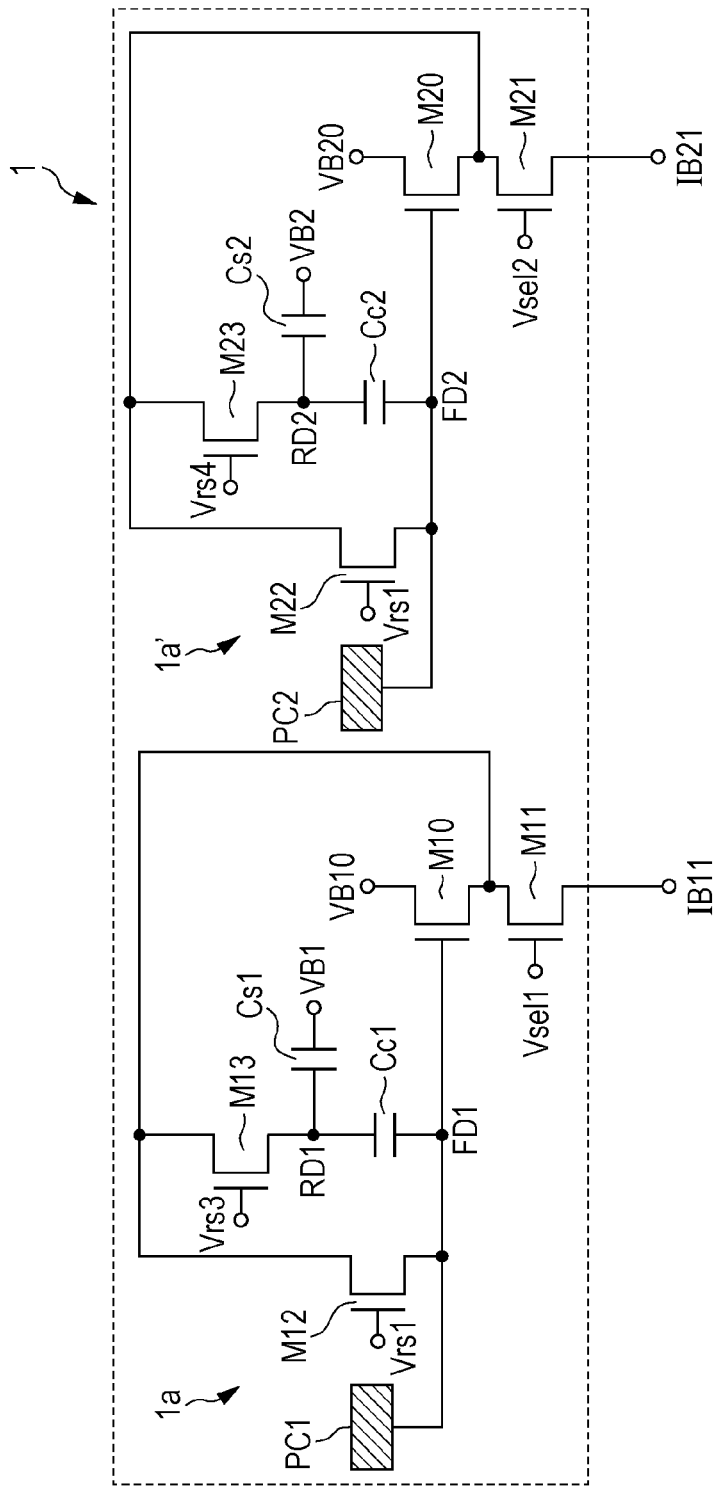
FIG. 14H is a schematic view illustrating another circuit configuration of the unit pixel according to a variation of exemplary First Embodiment.
Figure 14I:
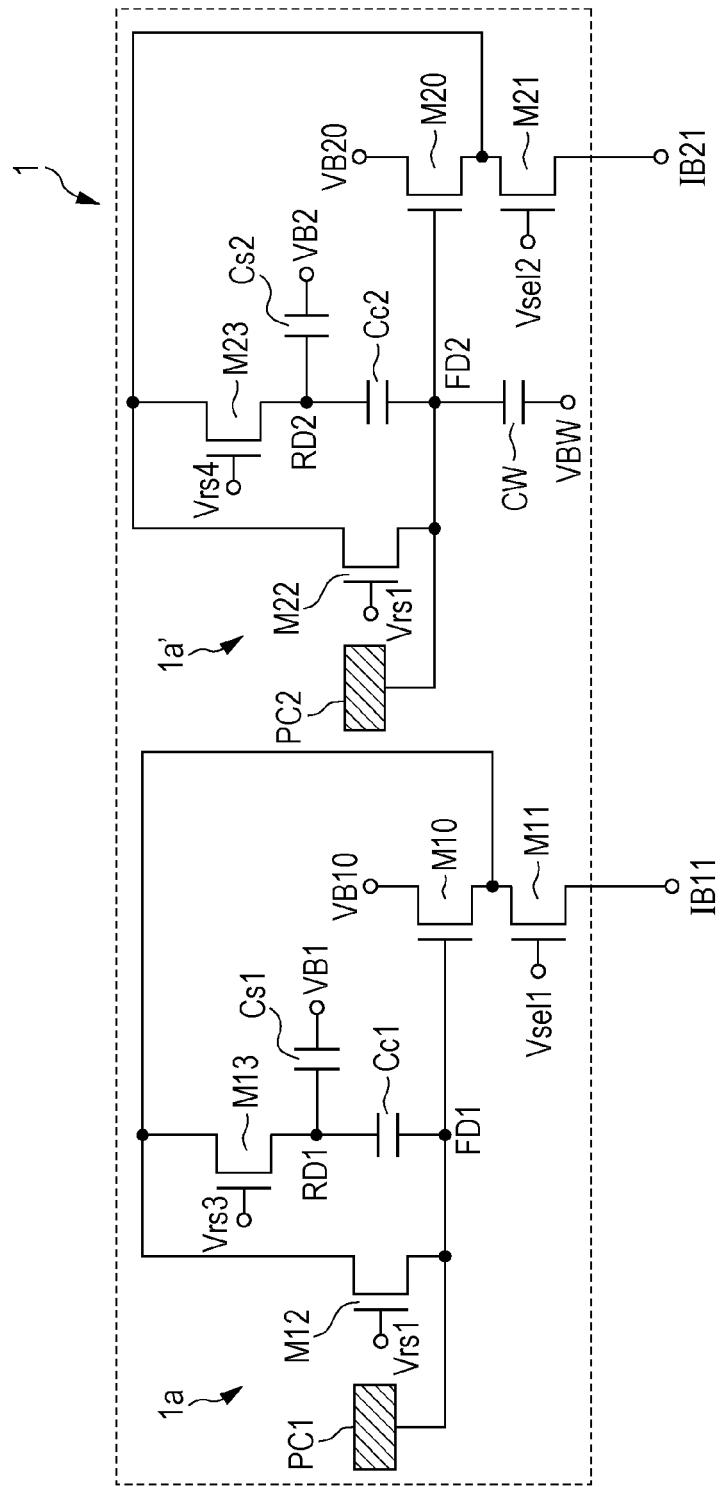
FIG. 14I is a schematic view illustrating another circuit configuration of the unit pixel according to a variation of exemplary First Embodiment.

FIG. 12 illustrates a circuit configuration corresponding to the circuit configuration of FIG. 9D. FIG. 13 illustrates a circuit configuration corresponding to the circuit configuration of FIG. 9E. A method for setting a reset voltage can be changed by changing a method of connection of the first reset transistor M12. As a result, it is possible to shorten a period for convergence to a reset voltage.

FIGS. 14A through 14I illustrate other examples of the circuit configuration of the unit pixel 1 according to the variations according to the present embodiment. The configurations illustrated in FIGS. 14A through 14I correspond to the configurations illustrated in FIGS. 9F through 9N. These configurations are different in terms of the configuration of the first feedback circuit that suppresses noise in the first imaging cell 1a and operation of the first feedback circuit and are identical in terms of configurations and operation of other elements.

For example, in the first imaging cell 1a in which feedback is formed within a pixel, readout and noise suppression can be executed as in the first imaging cell 1a illustrated in FIG. 9H.

Figure 15:
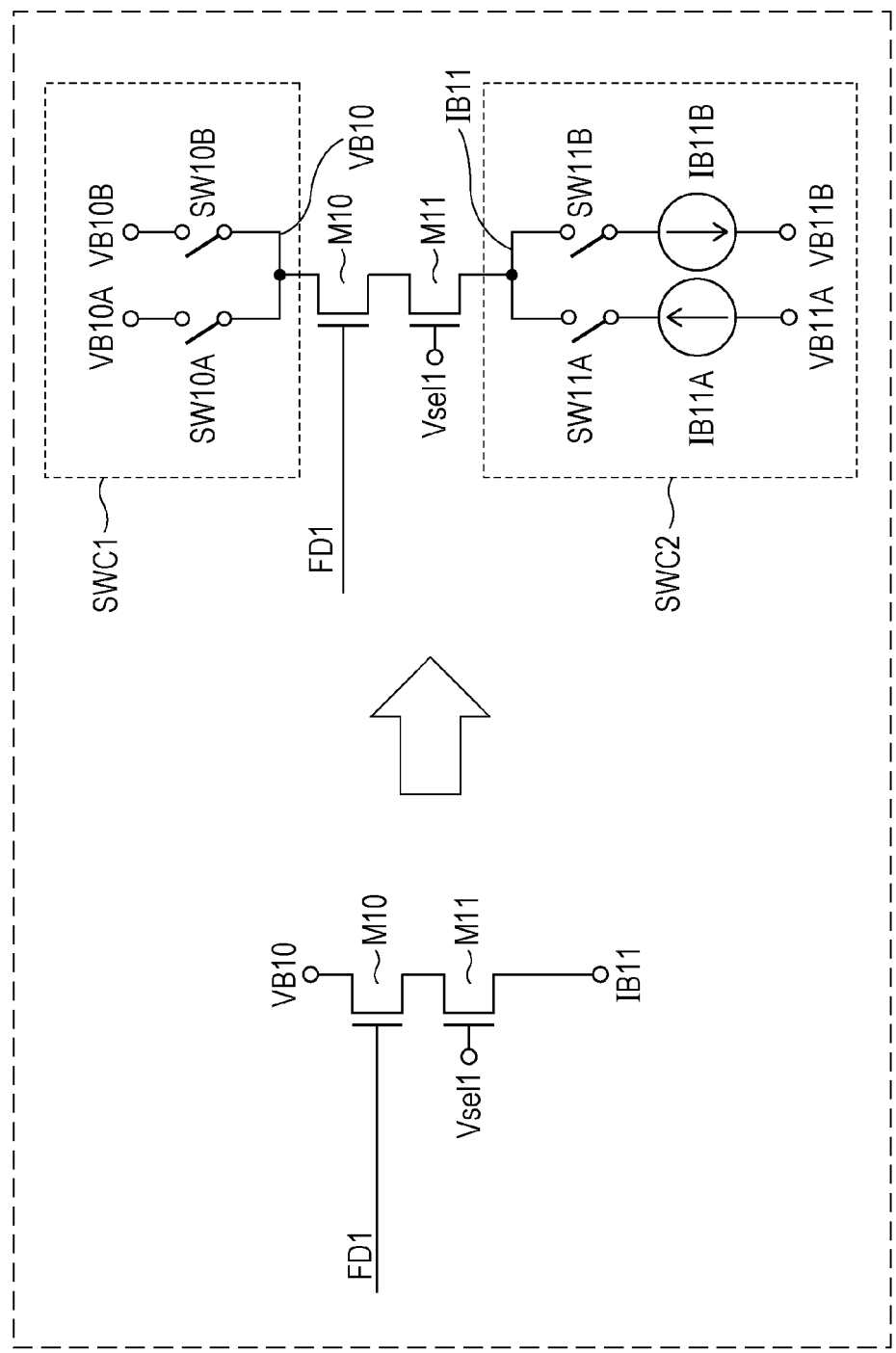
FIG. 15 is a schematic view illustrating part of a first signal processing circuit of a first imaging cell or a second signal processing circuit of a second imaging cell.

FIG. 15 illustrates part of the first signal processing circuit P1 of the first imaging cell 1a. A first switching circuit SWC1 is connected to one of a source and a drain of the first amplifier transistor M10. The first switching circuit SWC1 includes switch elements SW10A and SW10B. The switch elements SW10A and SW10B are connected to reference voltages VB10A and VB10B, respectively. The reference voltage VB10A can be input to the one of the source and the drain of the first amplifier transistor M10 via the switch element SW10A, and the reference voltage VB10B can be input to the one of the source and the drain of the first amplifier transistor M10 via the switch element SW10B. The voltage of the one of the source and the drain of the first amplifier transistor M10 can be switched by a control signal. The reference voltage VB10A is, for example, GND, and the reference voltage VB10B is, for example, VDD. Note that the first switching circuit SWC1 may be provided for each unit pixel or may be shared by a plurality of unit pixels in order to reduce the number of elements per unit pixel.

A second switching circuit SWC2 is connected to the vertical signal line 9 (see FIG. 4). The second switching circuit SWC2 includes switch elements SW11A and SW11B. The switch elements SW11A and SW11B are connected to reference voltages VB11A and VB11B via constant electric current sources IB11A and IB11B, respectively. The reference voltage VB11A is, for example, VDD, and the reference voltage VB11B is, for example, GND.

Assume that the switch elements SW10A and SW11A are selectively turned on. In this case, in a case where the electric potential of the first selection control signal Vsel1 is at a high level, the first selection transistor M11 is on, and the constant electric current source IB11A and the first amplifier transistor M10 form an inverting amplifier circuit. As a result, the readout node FD1, the first amplifier transistor M10, the first bandwidth control transistor M13, and the first capacitor Cc1 form a feedback path.

Assume that the switch elements SW10B and SW11B are selectively turned on. In this case, in a case where the electric potential of the first selection control signal Vsel1 is at a high level, the first selection transistor M11 is on, and the first amplifier transistor M10 and the constant electric current source IB11B form a source follower circuit. As a result, a signal of the readout node FD1 is output to the vertical signal line 9.

An operation timing of the first imaging cell 1a in which feedback is formed within a pixel is substantially the same as an operation timing of the first imaging cell 1a illustrated in FIG. 9C. For example, the first imaging cell 1a illustrated in FIG. 11 can be operated in accordance with the operation timing illustrated in FIG. 10.

According to the circuit configurations illustrated in FIGS. 11 through 14I, feedback for noise cancelling can be performed within a pixel excluding an electric current source. This makes it possible to reduce the influence of a time constant of the vertical signal line 9, thereby allowing high-speed noise cancelling. Furthermore, a noise suppression effect can be increased by increasing the capacitance value of a capacitor disposed in the unit pixel 1.

Figure 16:
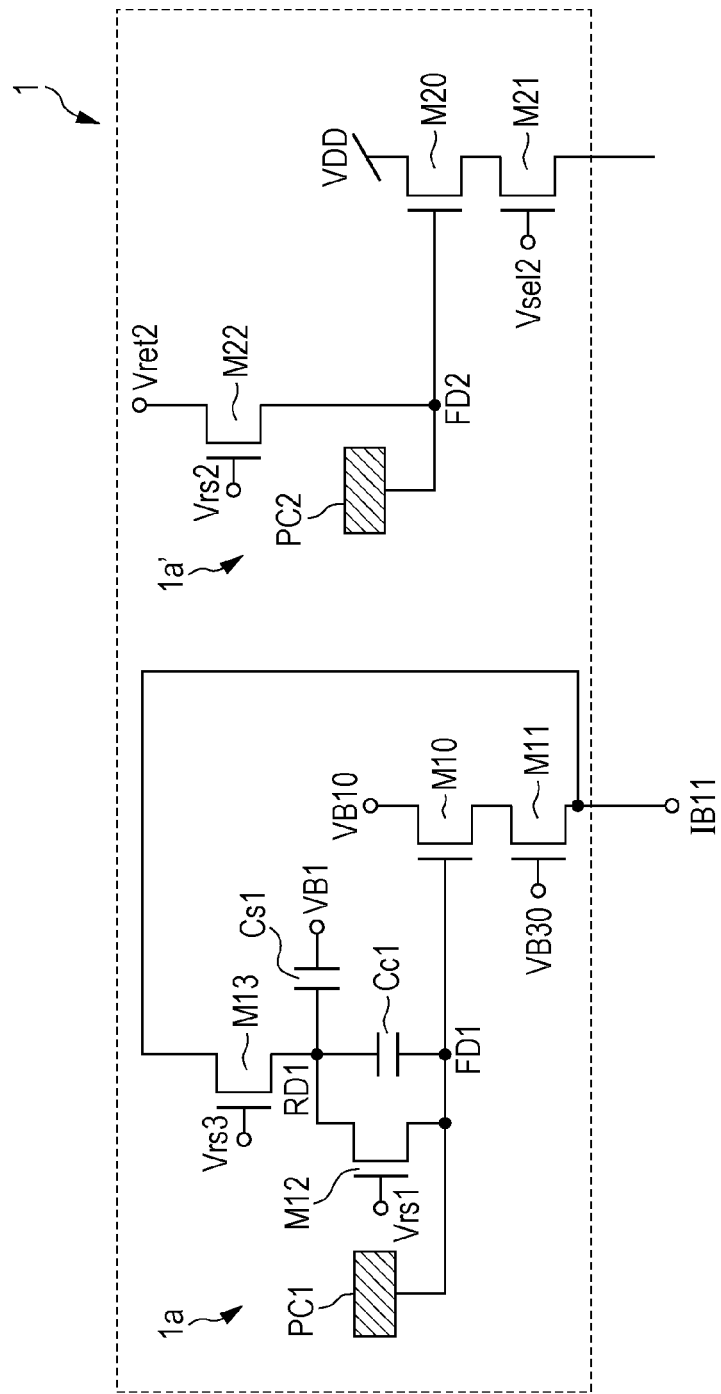
FIG. 16 is a schematic view illustrating another circuit configuration of the unit pixel according to a variation of exemplary First Embodiment.

FIG. 16 illustrates another example of the circuit configuration of the unit pixel 1 according to a variation of the present embodiment.

The first amplifier transistor M10 and the first selection transistor M11 constitute cascode connection during a feedback operation of the feedback circuit. One of a source and a drain of the first bandwidth control transistor M13 is connected to a connection node RD1 between the first capacitor Cc1 and the second capacitor Cs1. The other one of the source and the drain of the first bandwidth control transistor M13 is connected to a connection node between a power source circuit IB11 and the first selection transistor M11. The first bandwidth control transistor M13 controls a bandwidth of the first feedback circuit. In this example of the circuit configuration, the first selection transistor M11 is involved in not only switching of a state of connection with the vertical signal line 9, but also formation of a feedback path.

The first feedback circuit performs negative feedback via the first amplifier transistor M10, the first selection transistor M11, the first bandwidth control transistor M13, and the first capacitor Cc1. Since the first imaging cell 1a includes the first feedback circuit, the first imaging cell 1a can markedly suppress noise that occurs when the first reset transistor M12 is turned off.

The second imaging cell 1a' functions as a high-saturation cell as described above and includes substantially the same circuit configuration as the circuit configuration illustrated in FIG. 6A.

Figure 17:
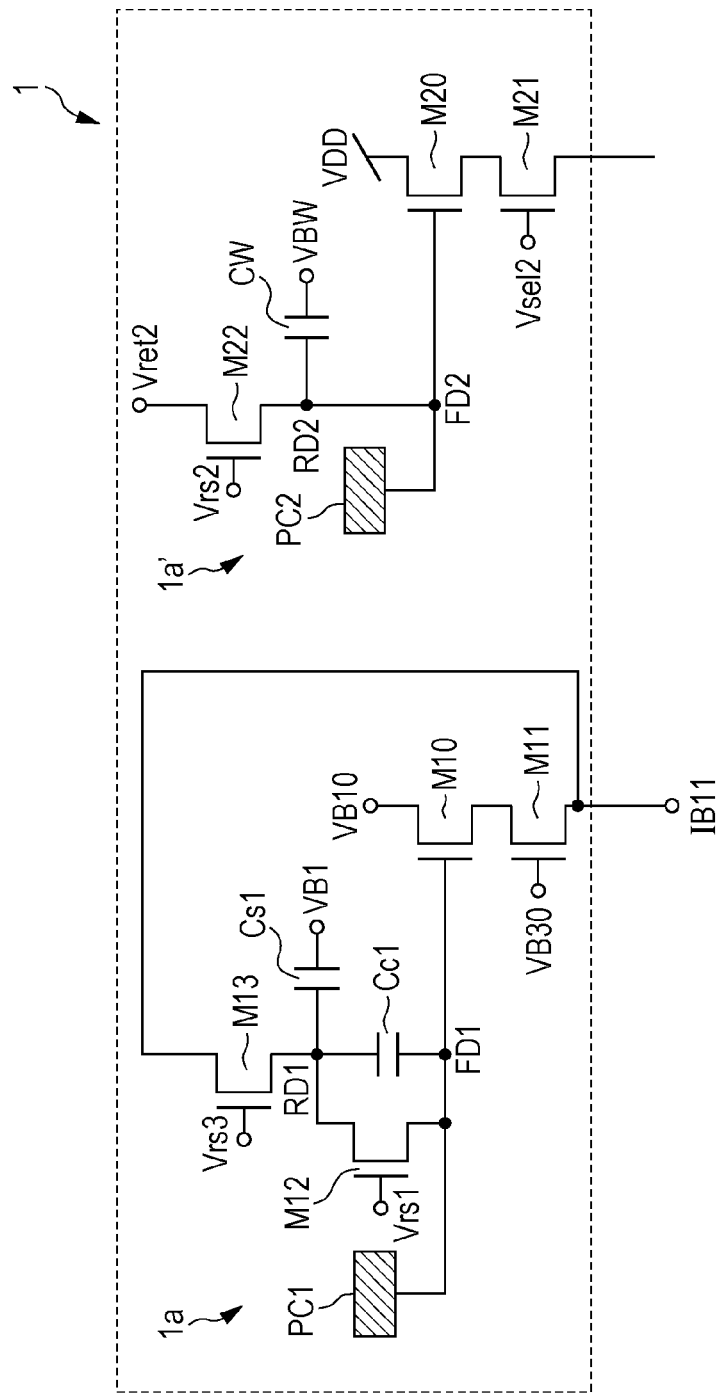
FIG. 17 is a schematic view illustrating another circuit configuration of the unit pixel according to a variation of exemplary First Embodiment.
Figure 18:
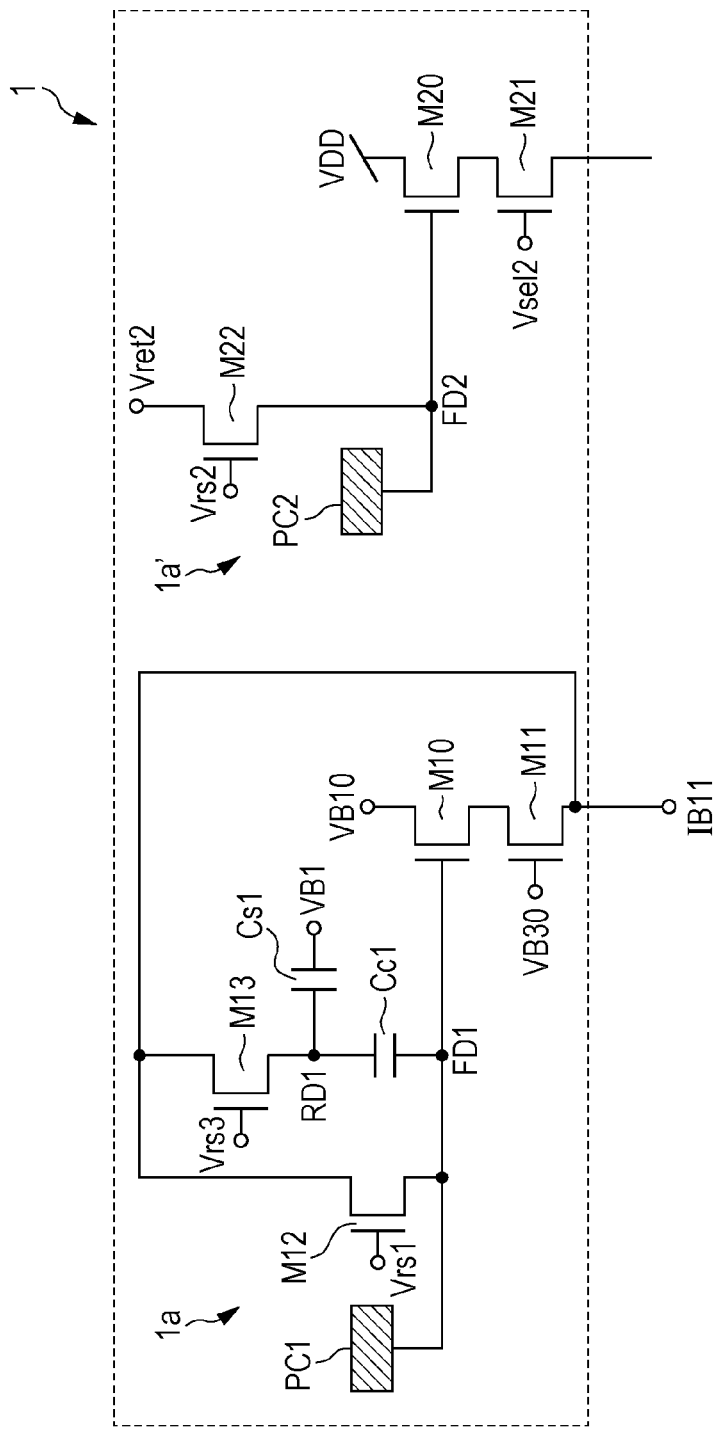
FIG. 18 is a schematic view illustrating another circuit configuration of the unit pixel according to a variation of exemplary First Embodiment.

FIG. 17 illustrates a circuit configuration corresponding to the circuit configuration of FIG. 9D. FIG. 18 illustrates a circuit configuration corresponding to the circuit configuration of FIG. 9E.

FIGS. 19A through 19I illustrate other examples of the circuit configuration of the unit pixel 1 according to the variations according to the present embodiment. The configurations illustrated in FIGS. 19A through 19I correspond to the configurations illustrated in FIGS. 14A through 14I. These configurations are different in terms of the configuration of the first feedback circuit that suppresses noise in the first imaging cell 1a and operation of the first feedback circuit, and are identical in terms of configurations and operation of other elements.

Figure 19A:
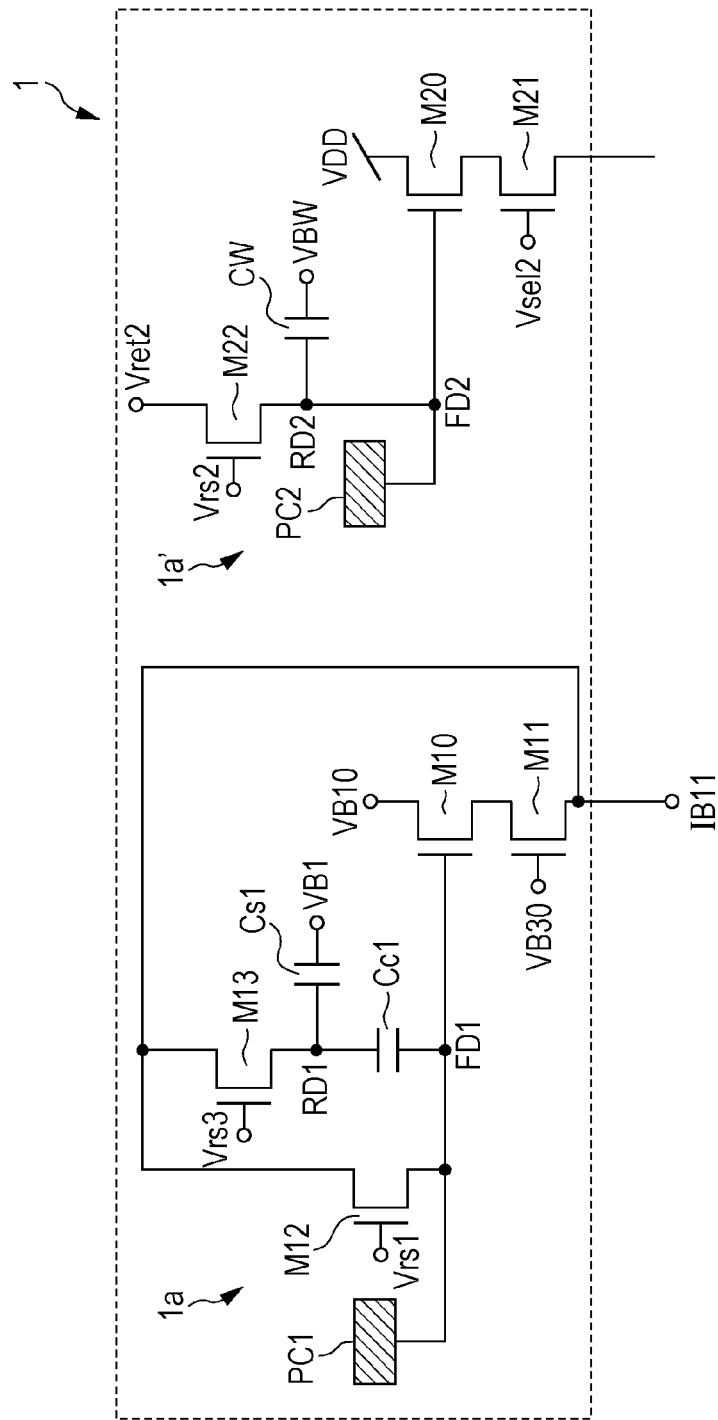
FIG. 19A is a schematic view illustrating another circuit configuration of the unit pixel according to a variation of exemplary First Embodiment.
Figure 19B:
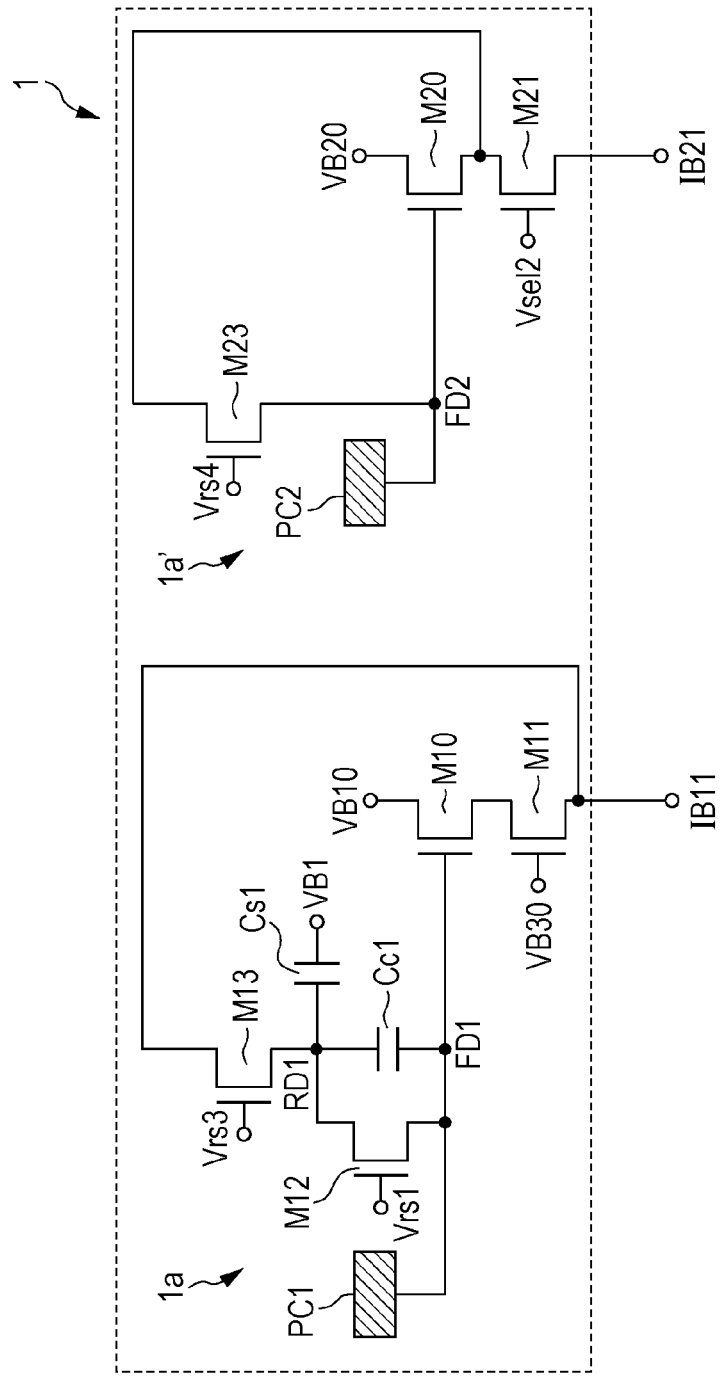
FIG. 19B is a schematic view illustrating another circuit configuration of the unit pixel according to a variation of exemplary First Embodiment.
Figure 19C:
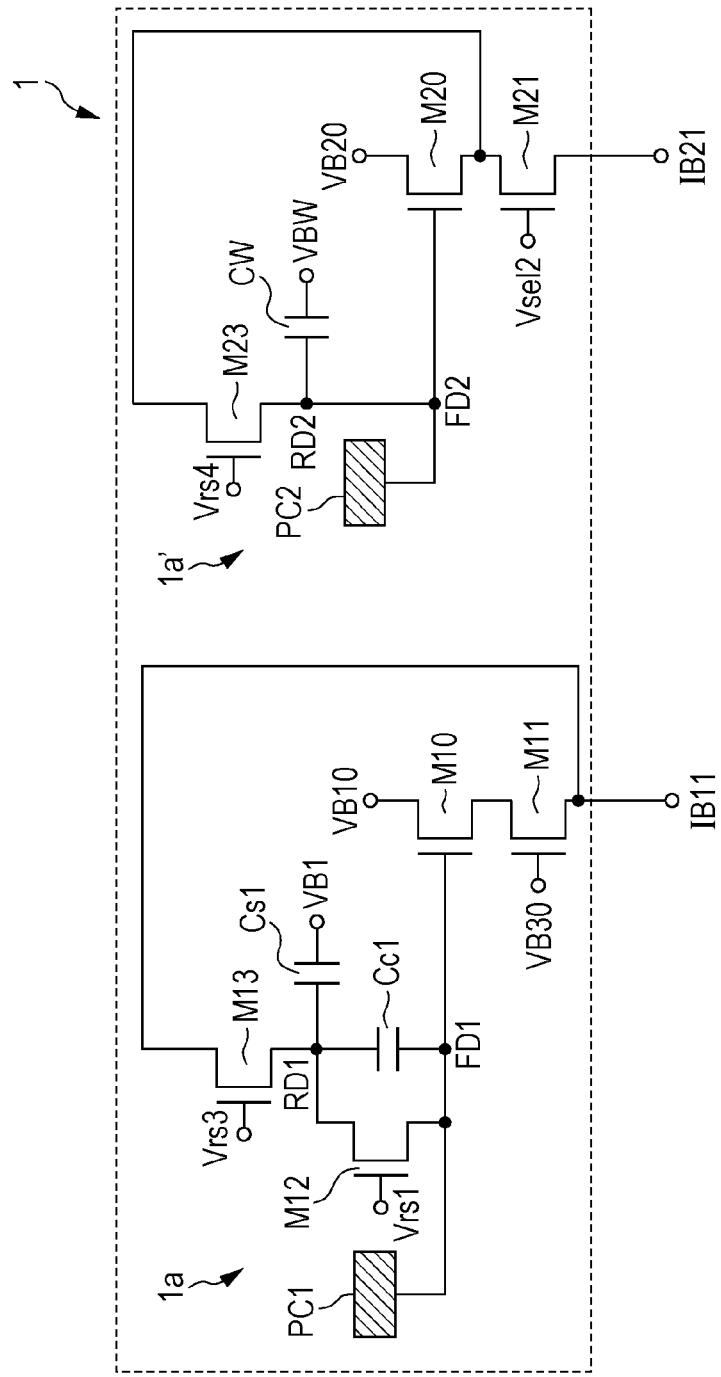
FIG. 19C is a schematic view illustrating another circuit configuration of the unit pixel according to a variation of exemplary First Embodiment.
Figure 19D:
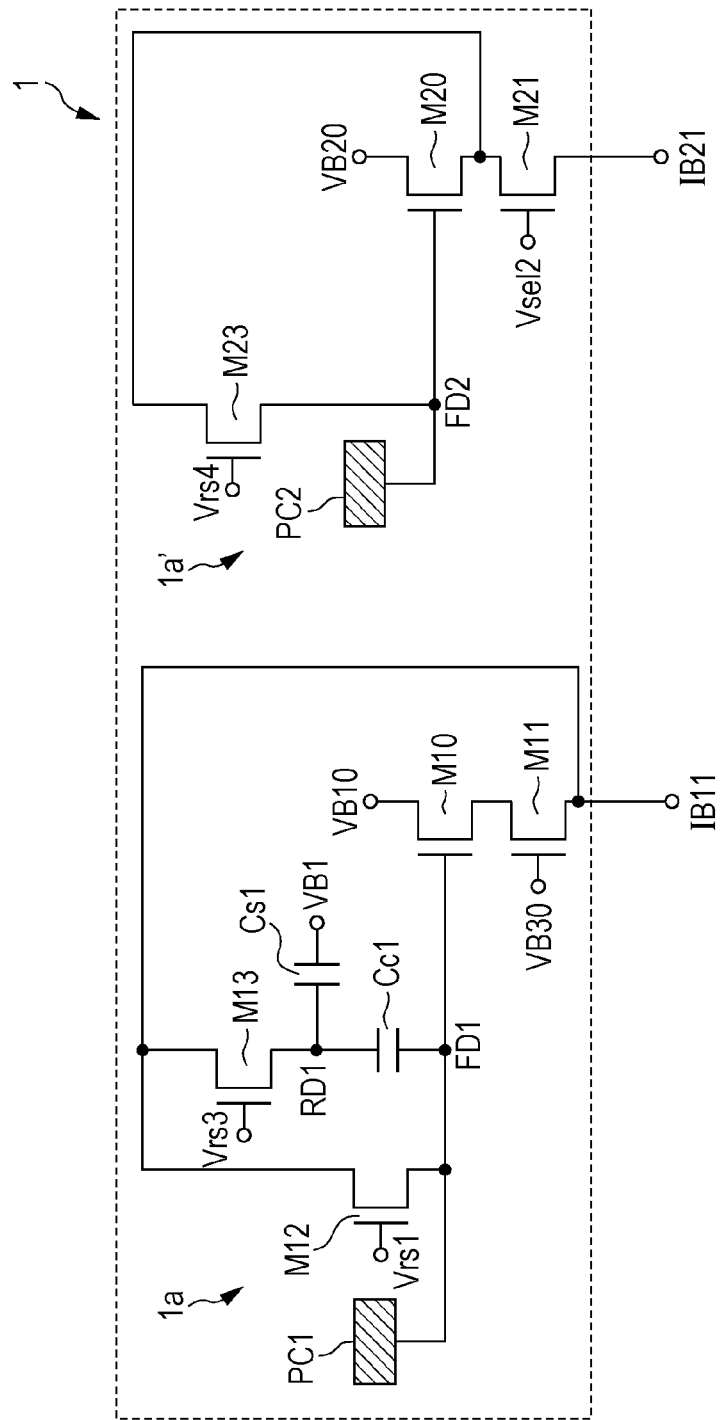
FIG. 19D is a schematic view illustrating another circuit configuration of the unit pixel according to a variation of exemplary First Embodiment.
Figure 19E:
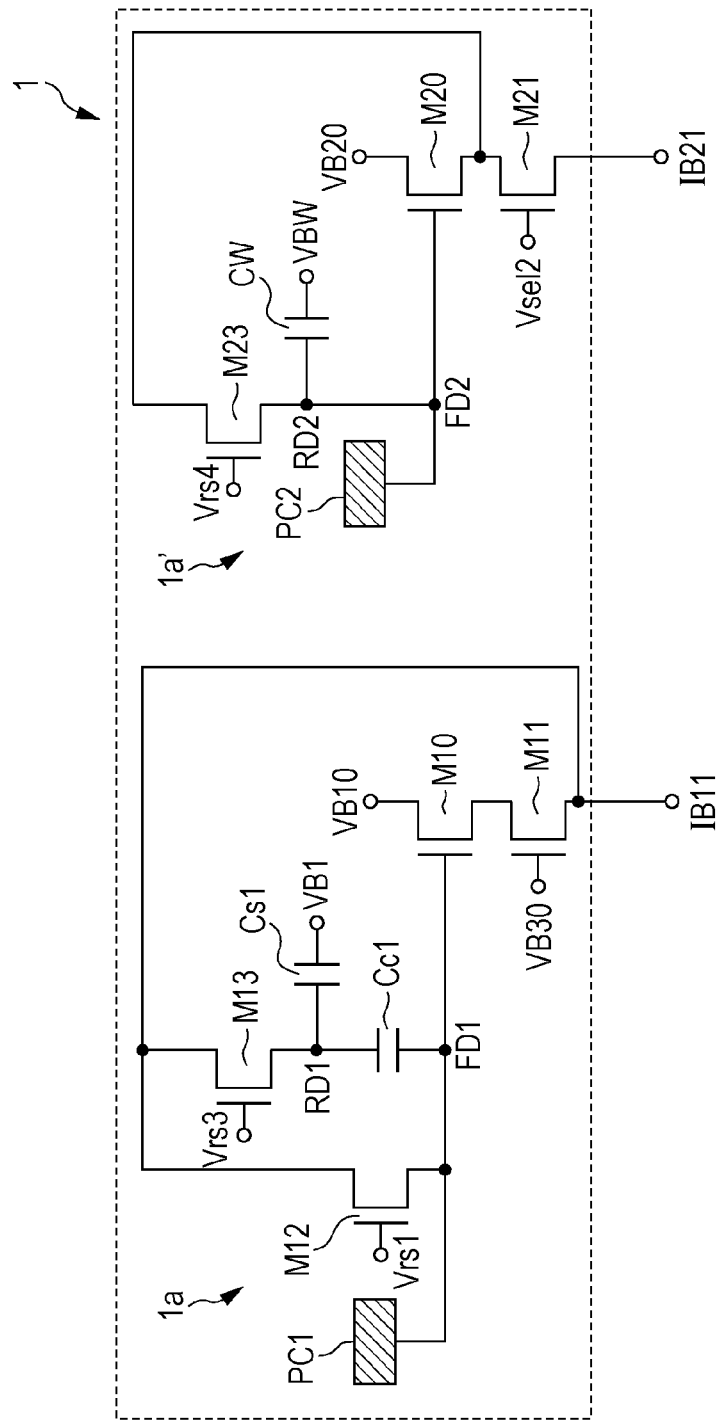
FIG. 19E is a schematic view illustrating another circuit configuration of the unit pixel according to a variation of exemplary First Embodiment.
Figure 19F:
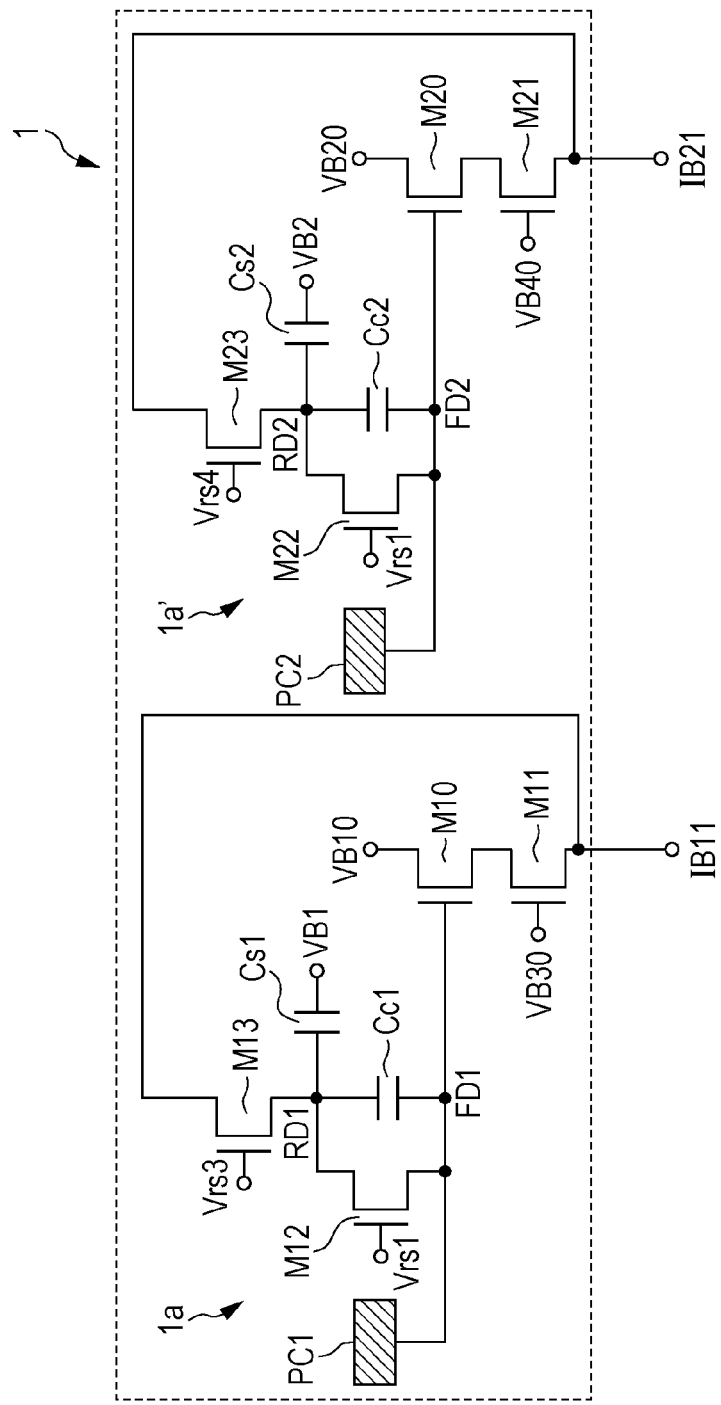
FIG. 19F is a schematic view illustrating another circuit configuration of the unit pixel according to a variation of exemplary First Embodiment.
Figure 19G:
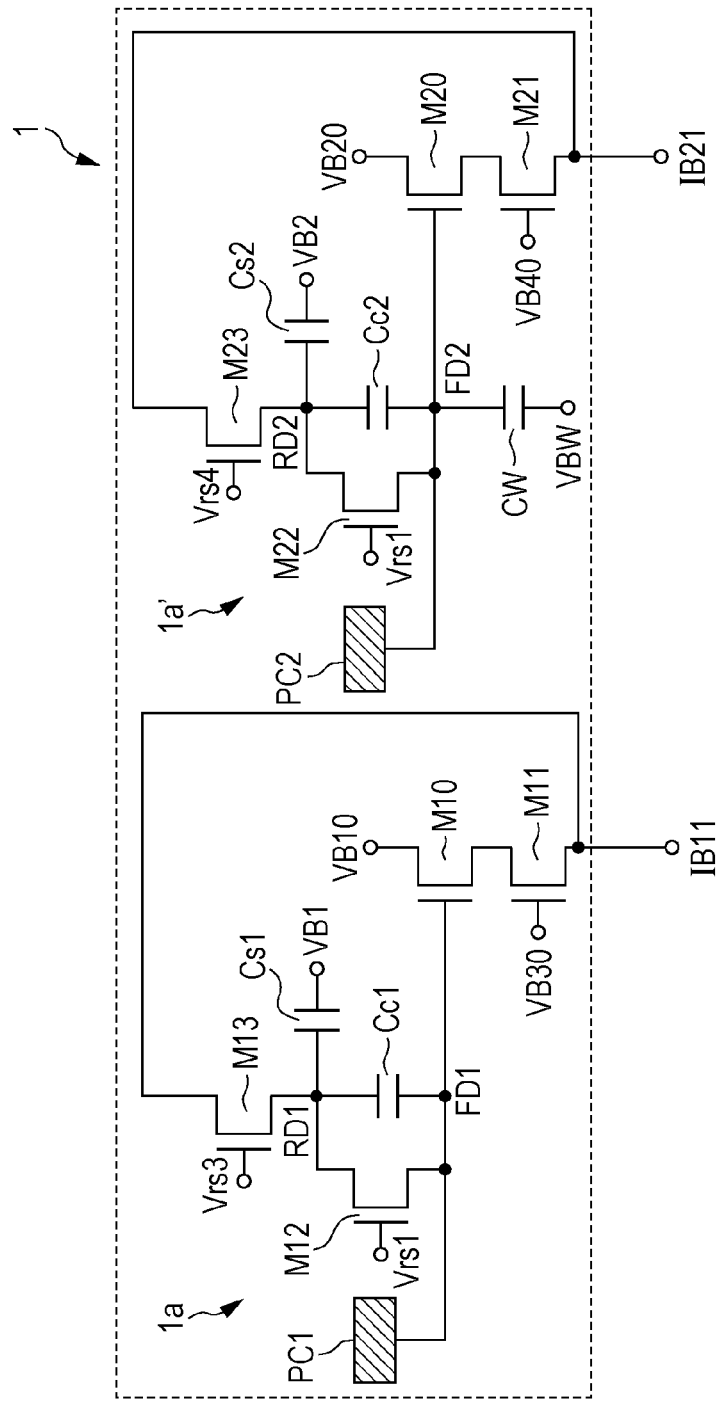
FIG. 19G is a schematic view illustrating another circuit configuration of the unit pixel according to a variation of exemplary First Embodiment.
Figure 19H:
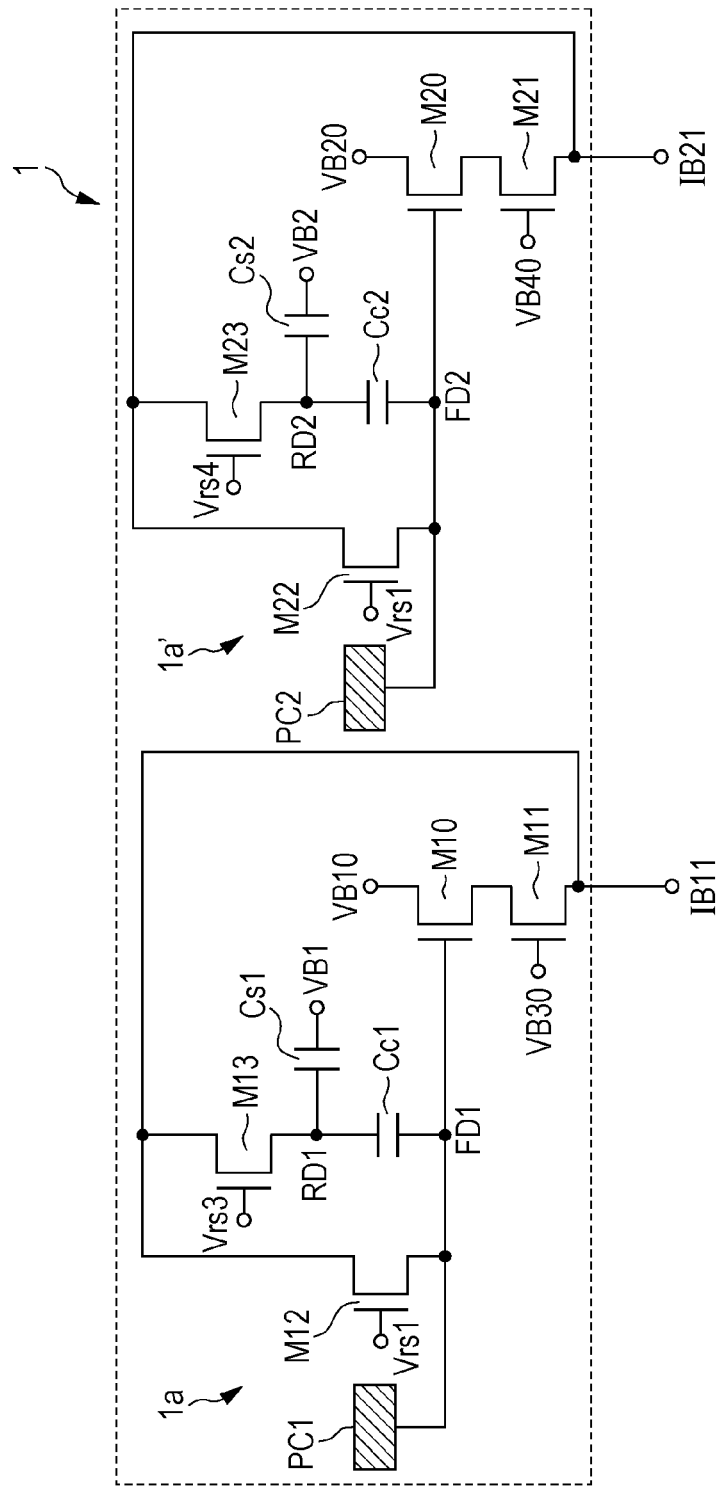
FIG. 19H is a schematic view illustrating another circuit configuration of the unit pixel according to a variation of exemplary First Embodiment.
Figure 19I:
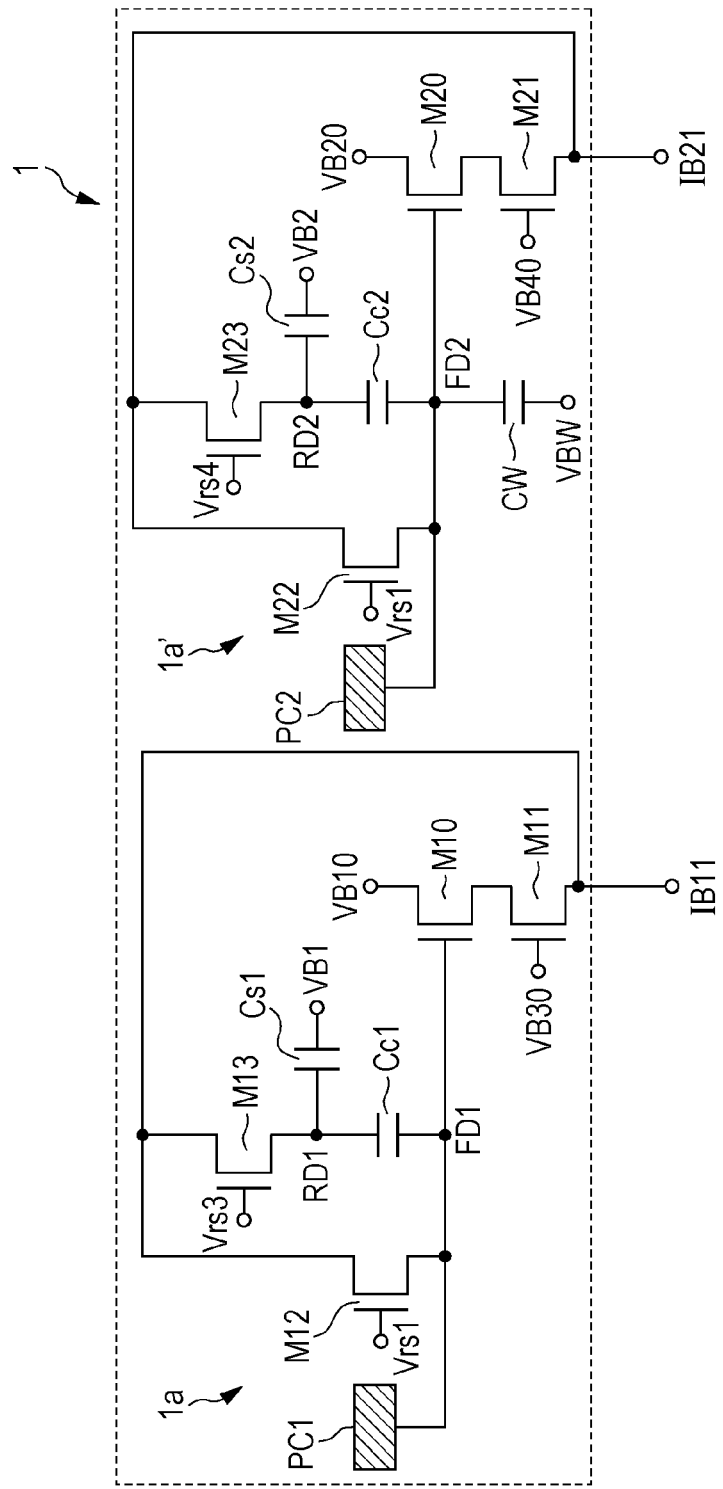
FIG. 19I is a schematic view illustrating another circuit configuration of the unit pixel according to a variation of exemplary First Embodiment.
Figure 20:
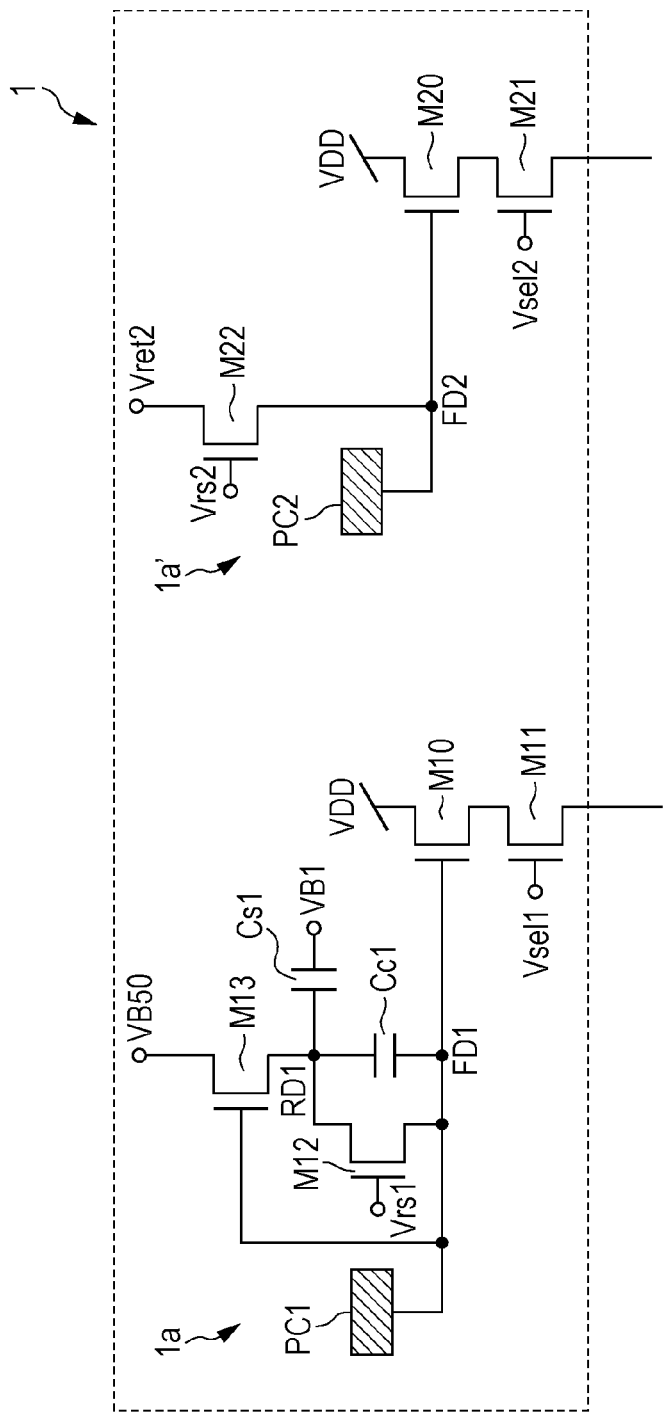
FIG. 20 is a schematic view illustrating another circuit configuration of the unit pixel according to a variation of exemplary First Embodiment.
Figure 21:
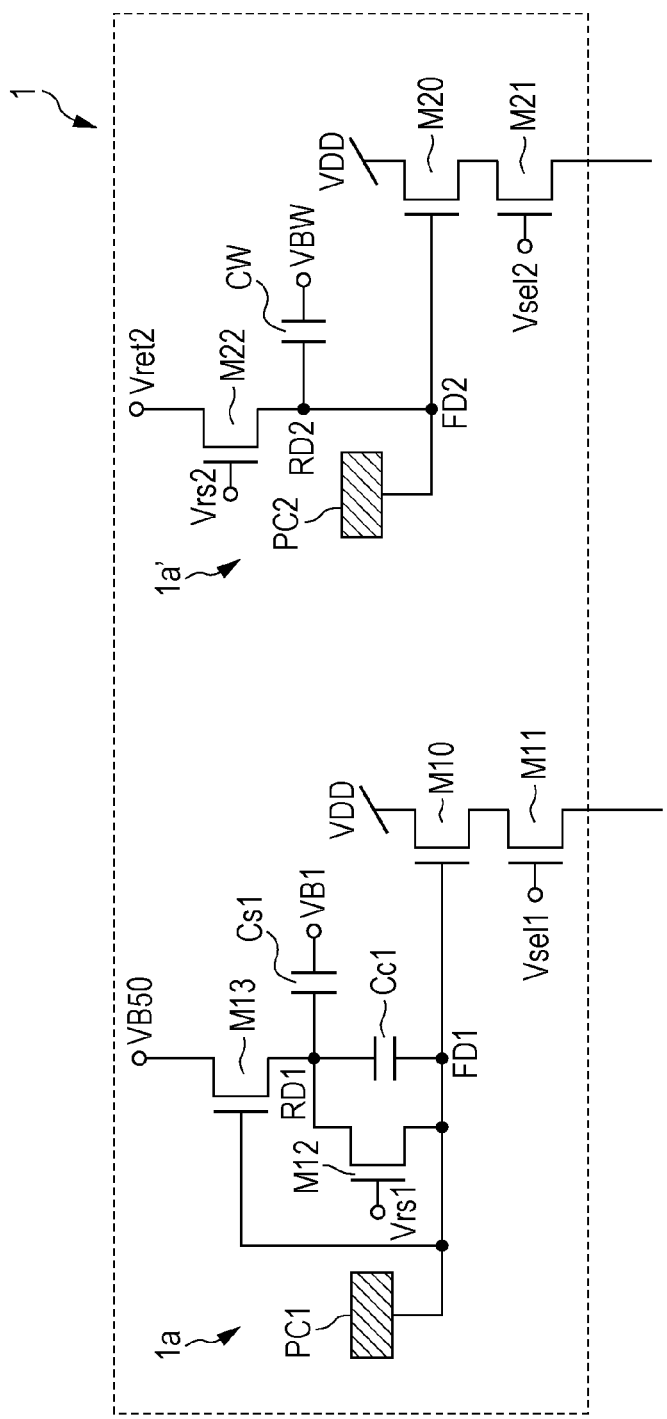
FIG. 21 is a schematic view illustrating another circuit configuration of the unit pixel according to a variation of exemplary First Embodiment.
Figure 22:
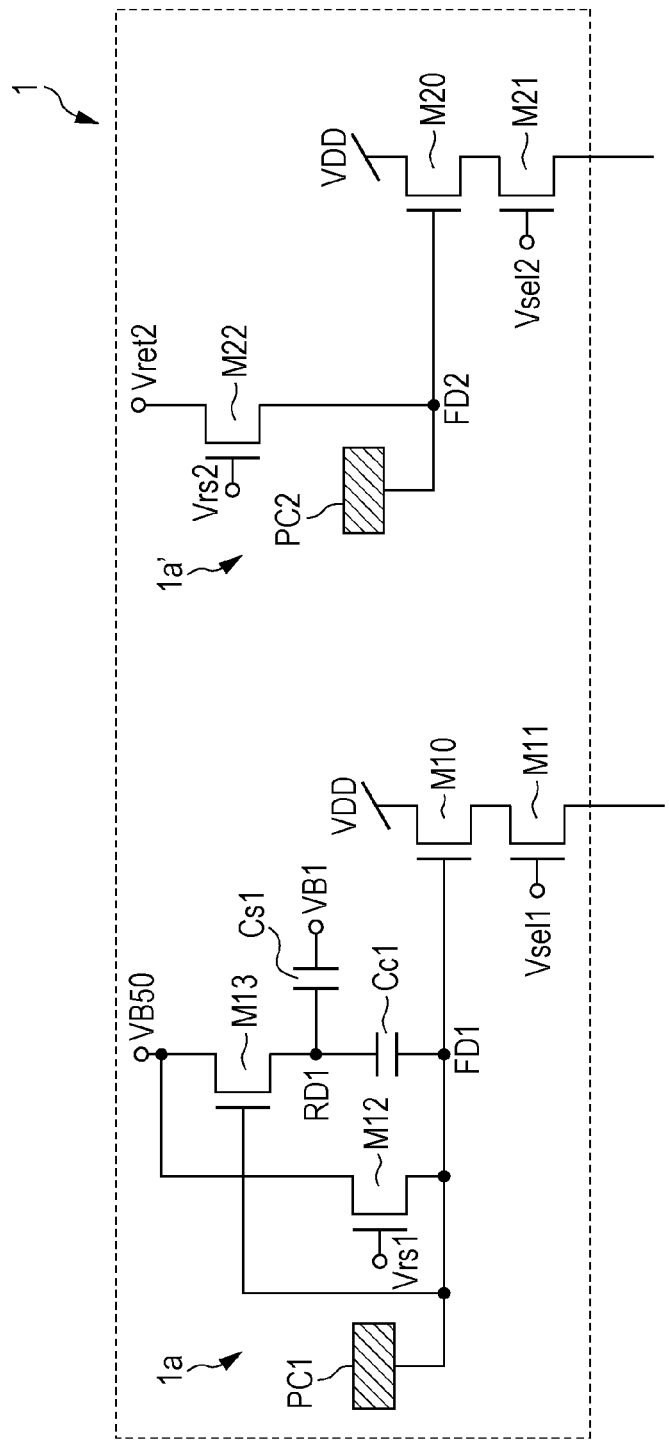
FIG. 22 is a schematic view illustrating another circuit configuration of the unit pixel according to a variation of exemplary First Embodiment.
Figure 23A:
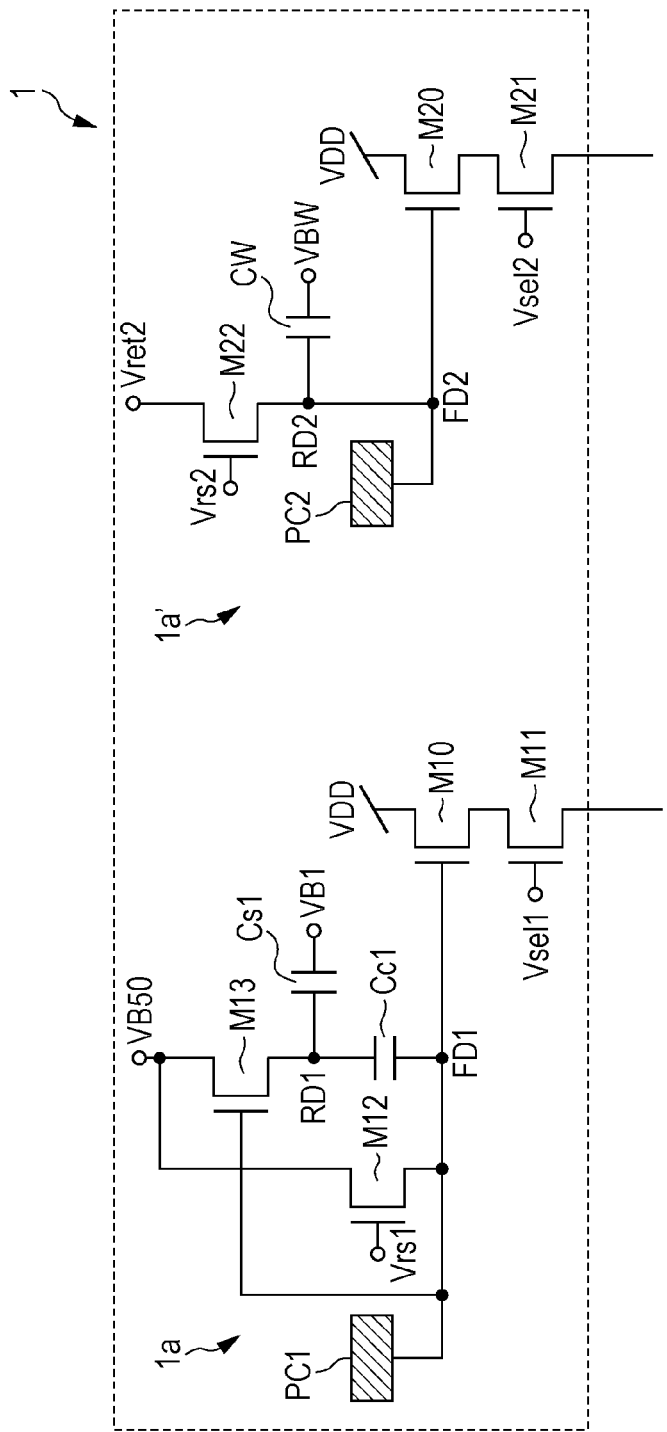
FIG. 23A is a schematic view illustrating another circuit configuration of the unit pixel according to a variation of exemplary First Embodiment.
Figure 23B:
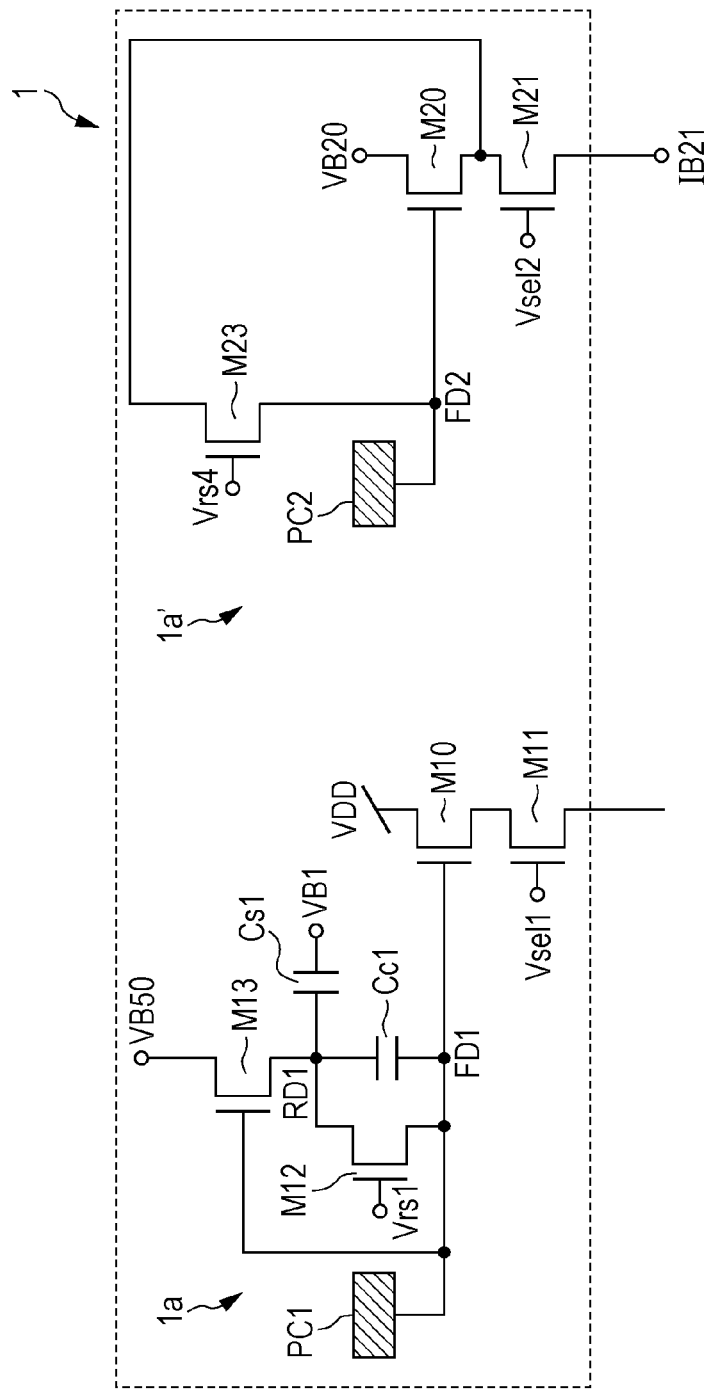
FIG. 23B is a schematic view illustrating another circuit configuration of the unit pixel according to a variation of exemplary First Embodiment.
Figure 23C:
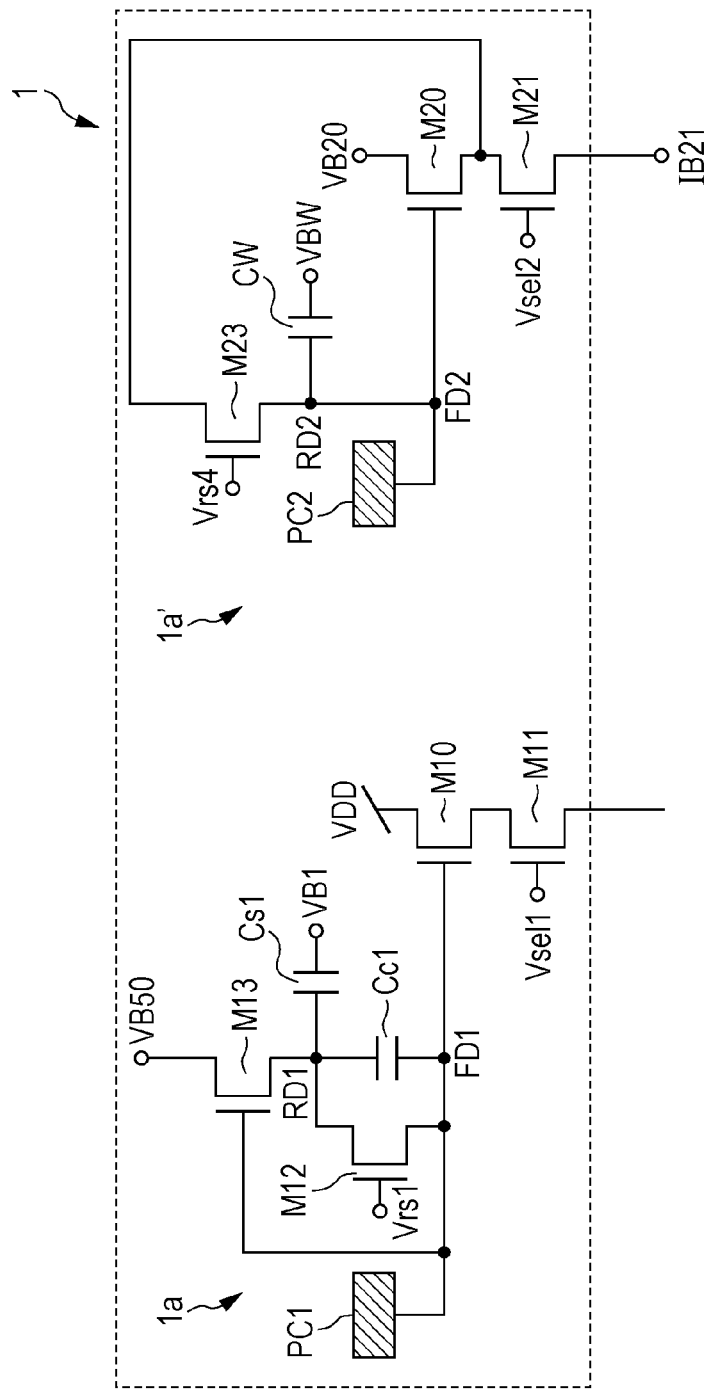
FIG. 23C is a schematic view illustrating another circuit configuration of the unit pixel according to a variation of exemplary First Embodiment.
Figure 23D:
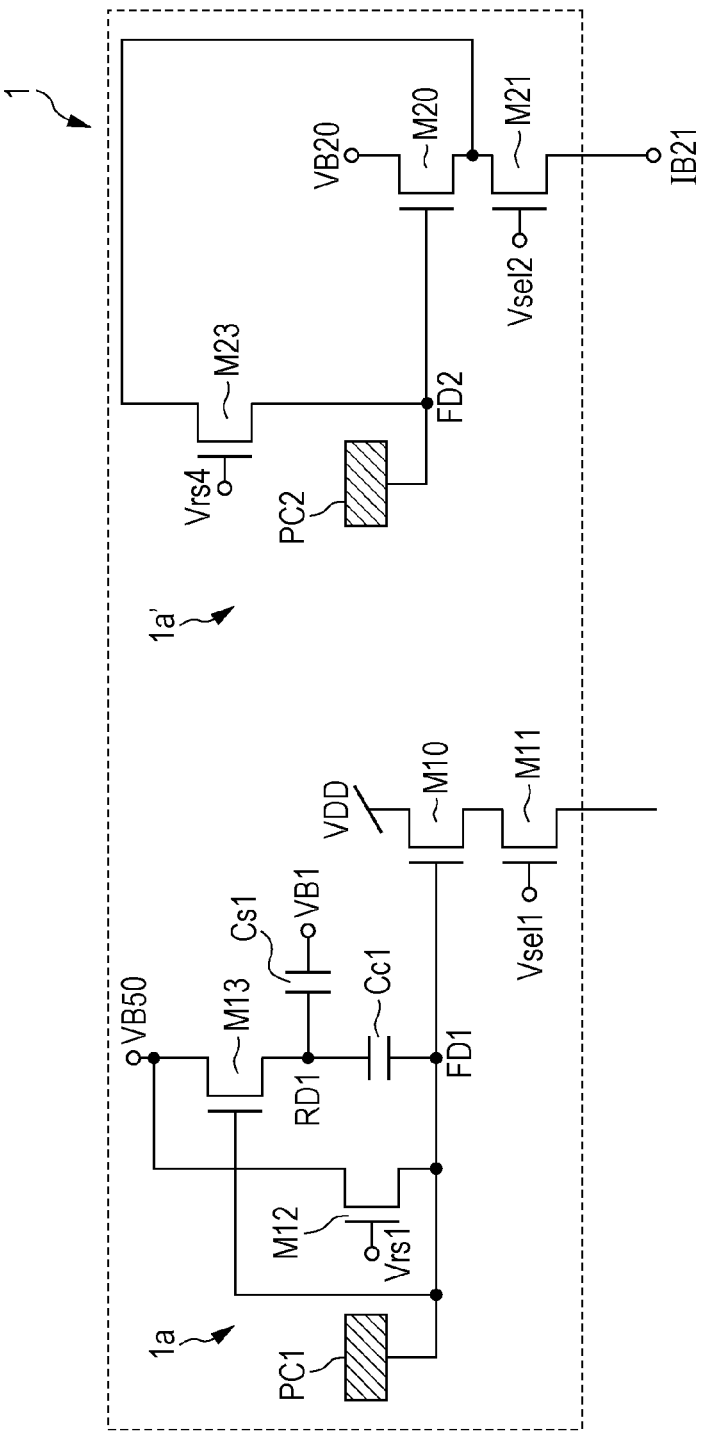
FIG. 23D is a schematic view illustrating another circuit configuration of the unit pixel according to a variation of exemplary First Embodiment.
Figure 23E:
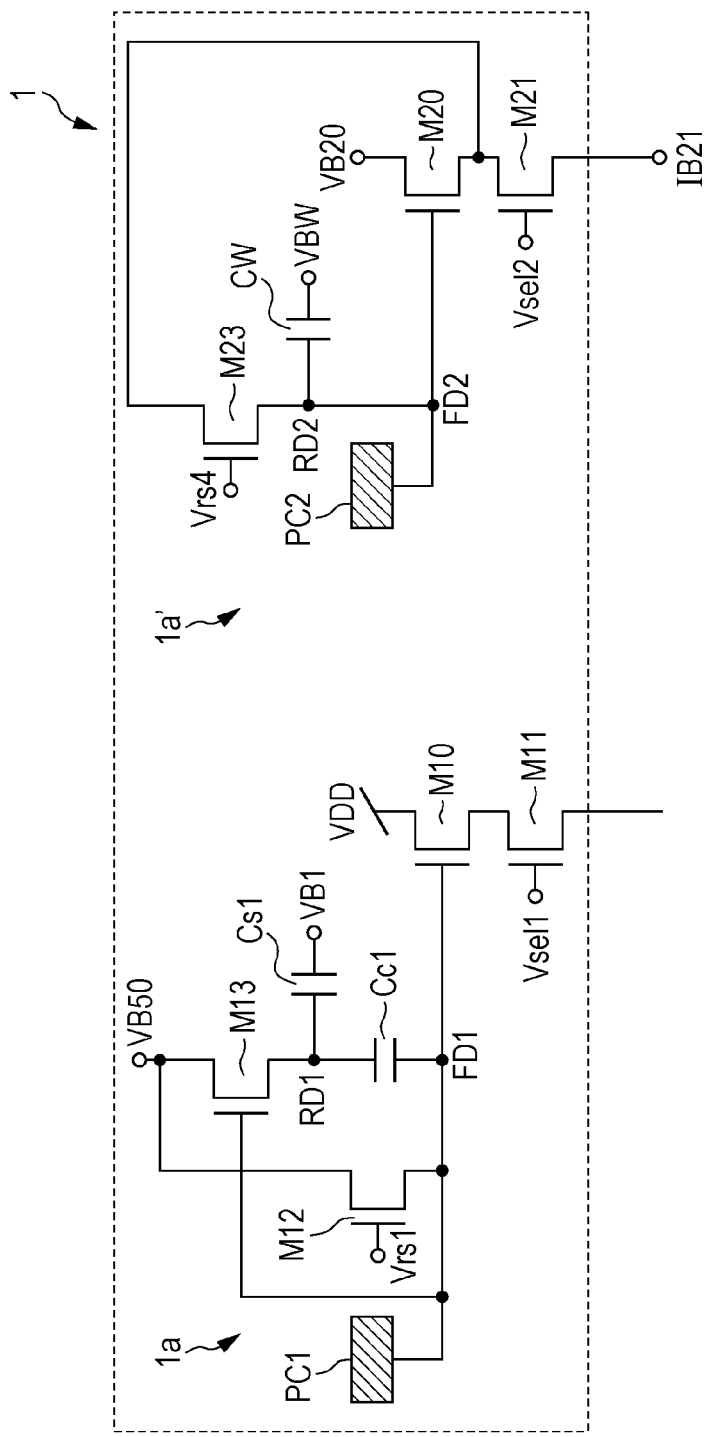
FIG. 23E is a schematic view illustrating another circuit configuration of the unit pixel according to a variation of exemplary First Embodiment.
Figure 23F:
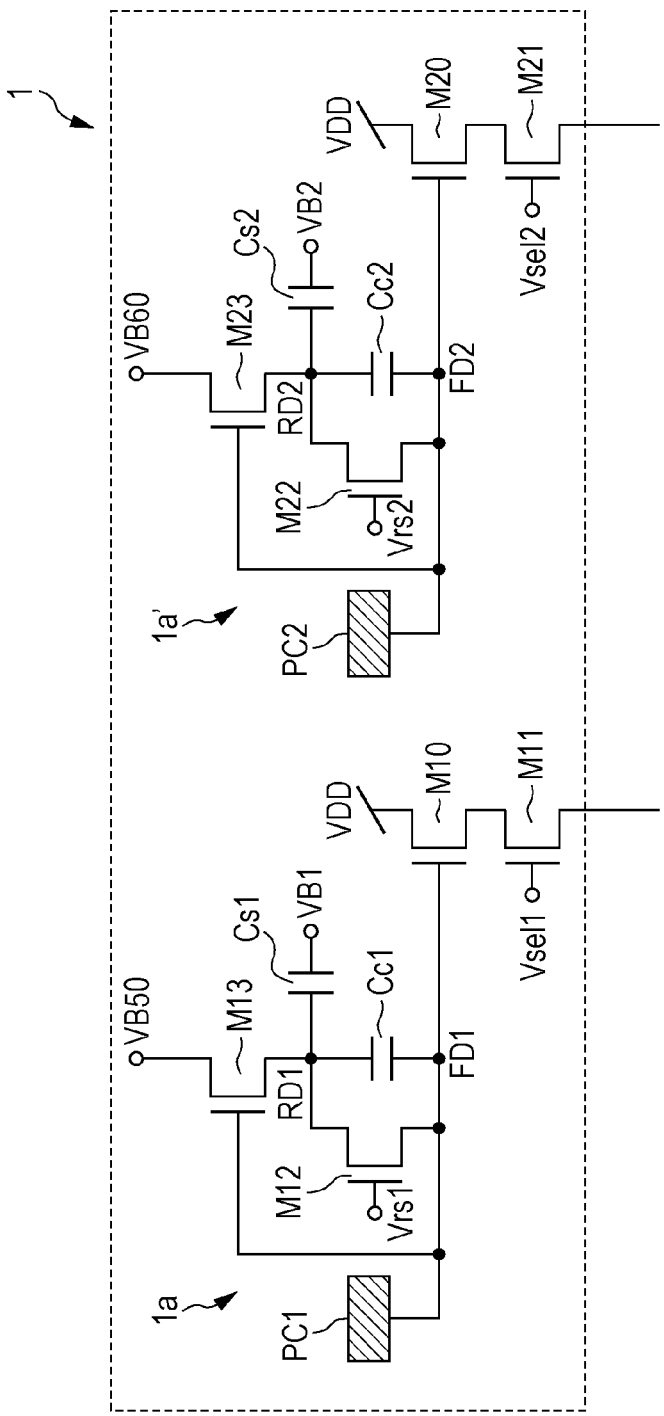
FIG. 23F is a schematic view illustrating another circuit configuration of the unit pixel according to a variation of exemplary First Embodiment.
Figure 23G:
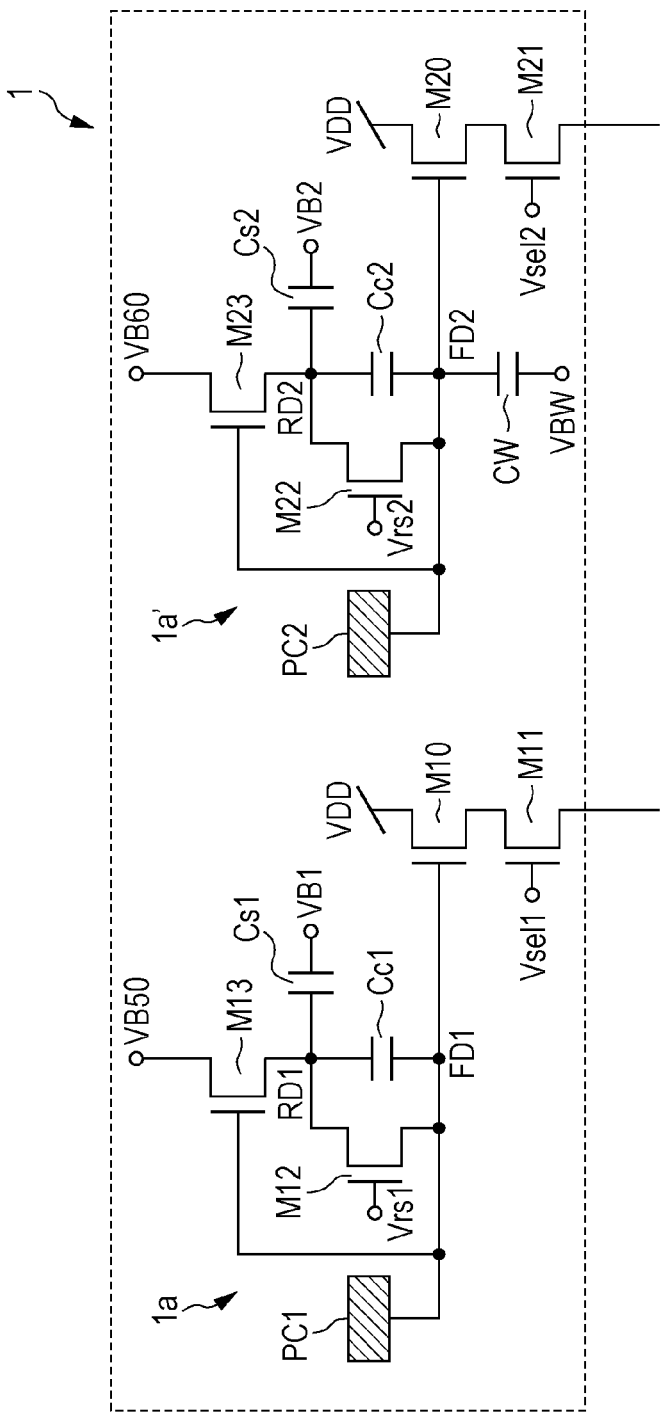
FIG. 23G is a schematic view illustrating another circuit configuration of the unit pixel according to a variation of exemplary First Embodiment.
Figure 23H:
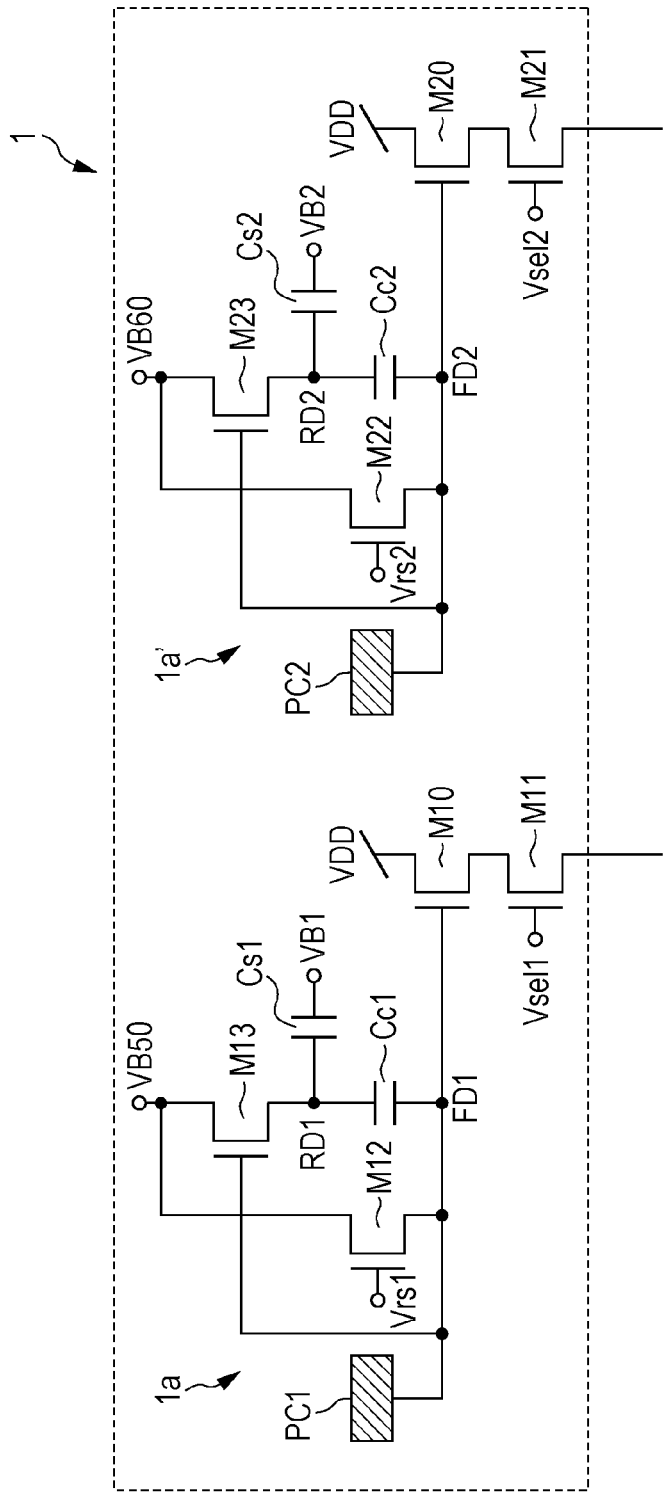
FIG. 23H is a schematic view illustrating another circuit configuration of the unit pixel according to a variation of exemplary First Embodiment.
Figure 23I:
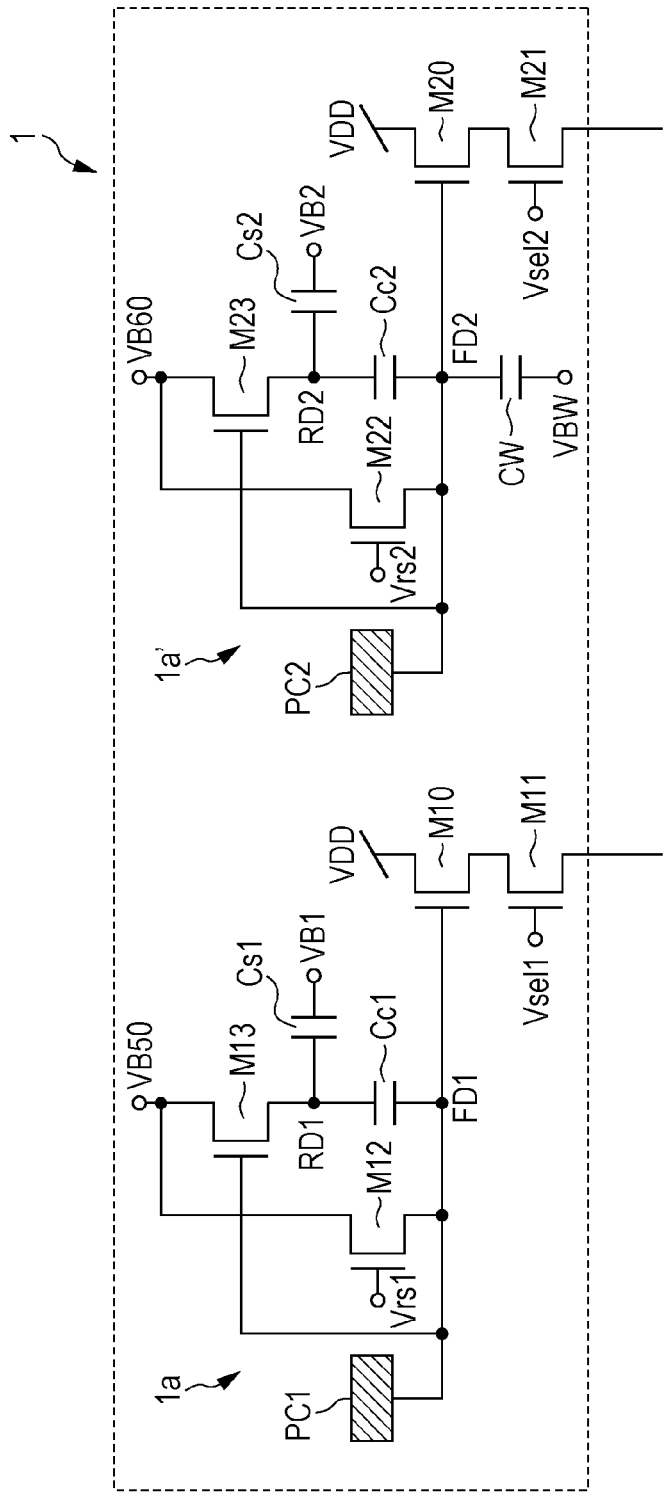
FIG. 23I is a schematic view illustrating another circuit configuration of the unit pixel according to a variation of exemplary First Embodiment.

For example, in the circuit configuration illustrated in FIG. 19A, the first selection transistor M11 is also involved in formation of a feedback path in addition to the function of switching a state of connection with the vertical signal line 9. Specifically, during noise suppression, a bias control signal VB30 that is supplied to the first selection transistor M11 is set to an intermediate electric potential between a high level and a low level. In this state, the first amplifier transistor M10, the first selection transistor M11, and an electric current source IB11A constitute an inverting amplifier that forms cascode connection. This makes it possible to markedly improve the gain of the inverting amplifier. As a result, noise of the first imaging cell 1a can be reduced by a degree corresponding to the improvement of the gain.

FIGS. 20 through 23I illustrate other examples of the circuit configuration of the unit pixel 1 according to the variations of the present embodiment.

The configurations illustrated in FIGS. 20 through 23I correspond to the configurations illustrated in FIGS. 11, 12, 13, and 14A through 14I. These configurations are different in terms of the configuration of the first feedback circuit that suppresses noise in the first imaging cell 1a and operation of the first feedback circuit, and are identical in terms of configurations and operation of other elements.

In the circuit configurations illustrated in FIGS. 20 through 23I, the first feedback circuit is entirely present within a pixel. The first feedback circuit performs negative feedback via the first bandwidth control transistor M13 and the first capacitor Cc1. During the negative feedback, a gate of the first bandwidth control transistor M13 serves as an input terminal of an inverting amplifier and one of a source and a drain of the first bandwidth control transistor M13 serves as an output terminal of the inverting amplifier.

Figure 24:
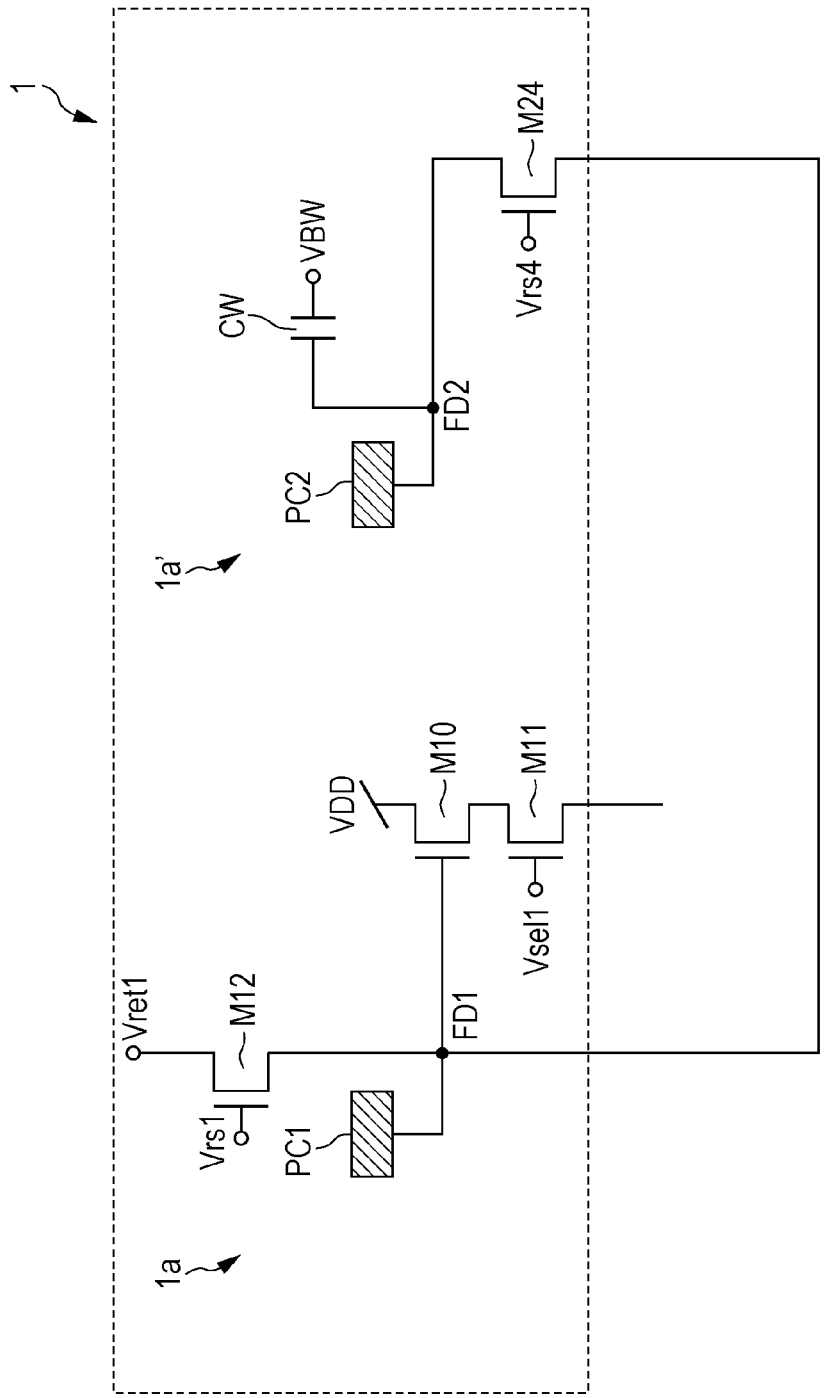
FIG. 24 is a schematic view illustrating another circuit configuration of the unit pixel according to a variation of exemplary First Embodiment.
Figure 25A:
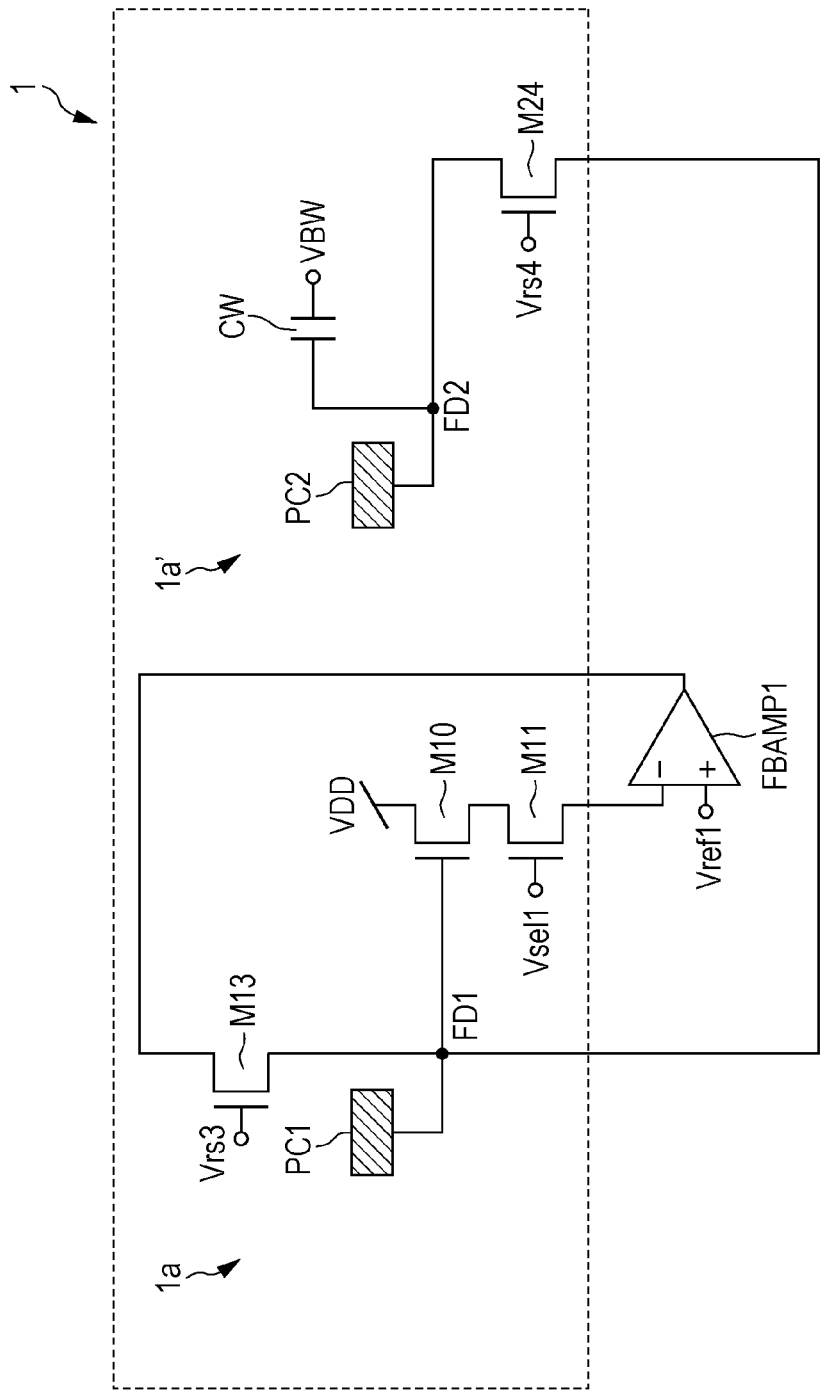
FIG. 25A is a schematic view illustrating another circuit configuration of the unit pixel according to a variation of exemplary First Embodiment.
Figure 25B:
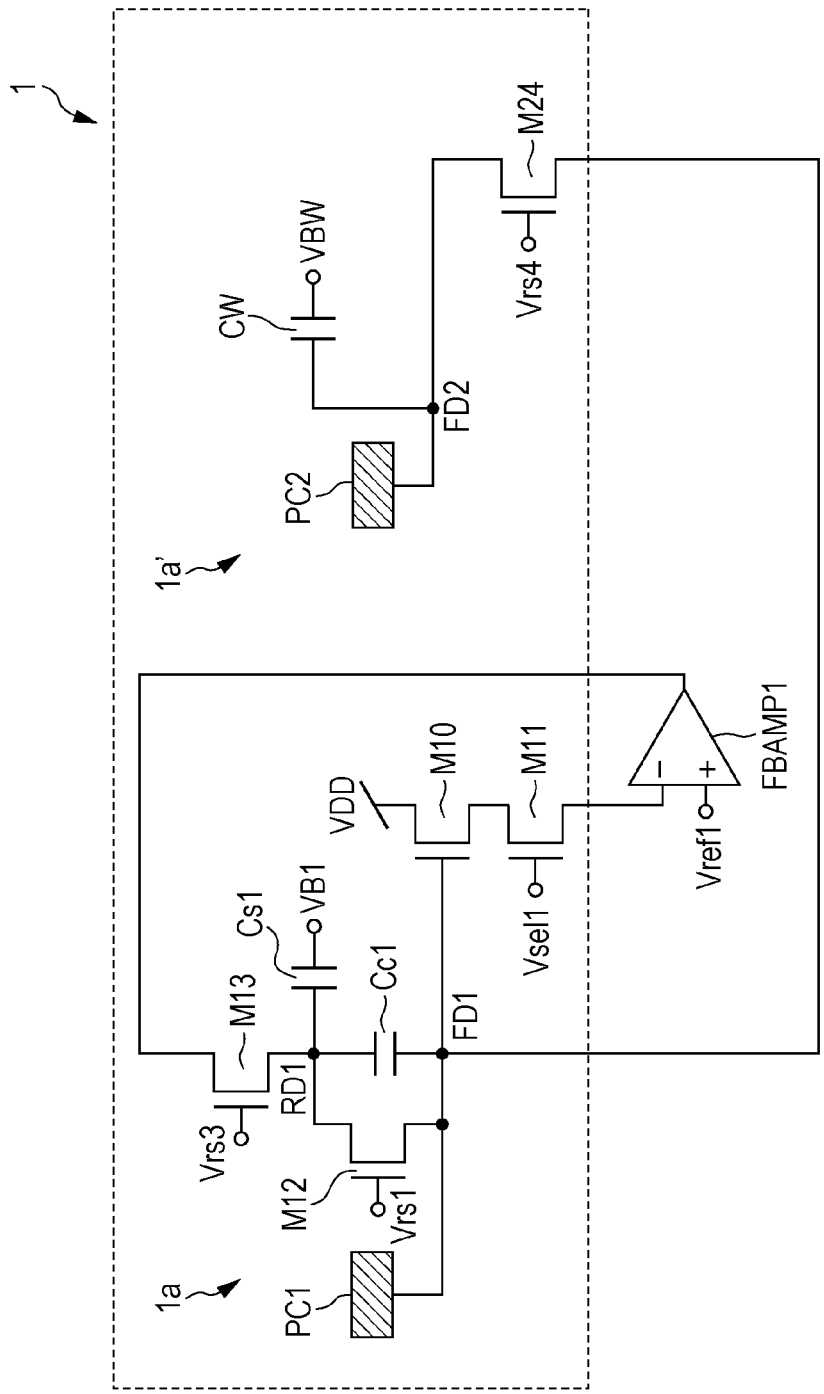
FIG. 25B is a schematic view illustrating another circuit configuration of the unit pixel according to a variation of exemplary First Embodiment.
Figure 25C:
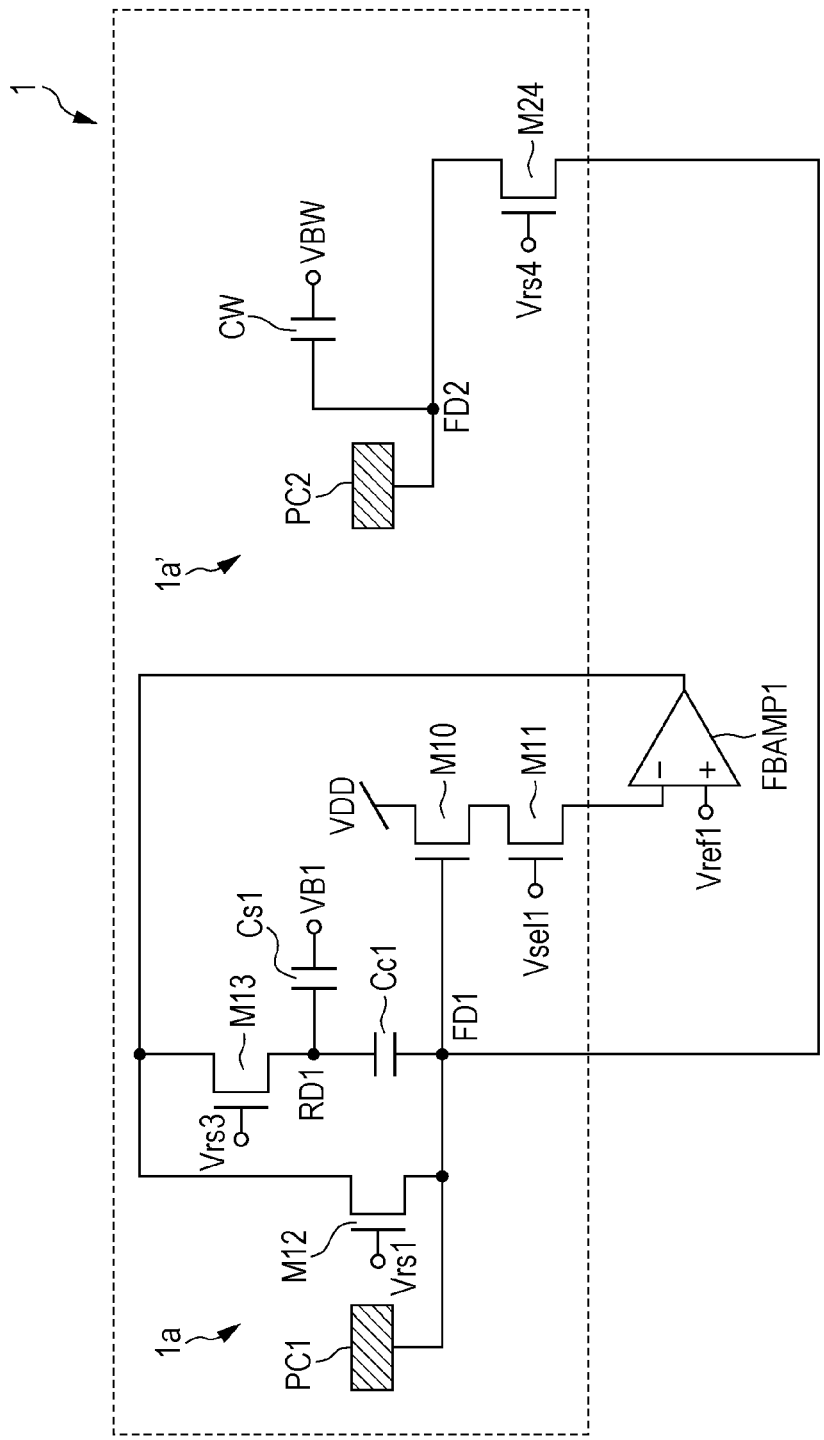
FIG. 25C is a schematic view illustrating another circuit configuration of the unit pixel according to a variation of exemplary First Embodiment.
Figure 25D:
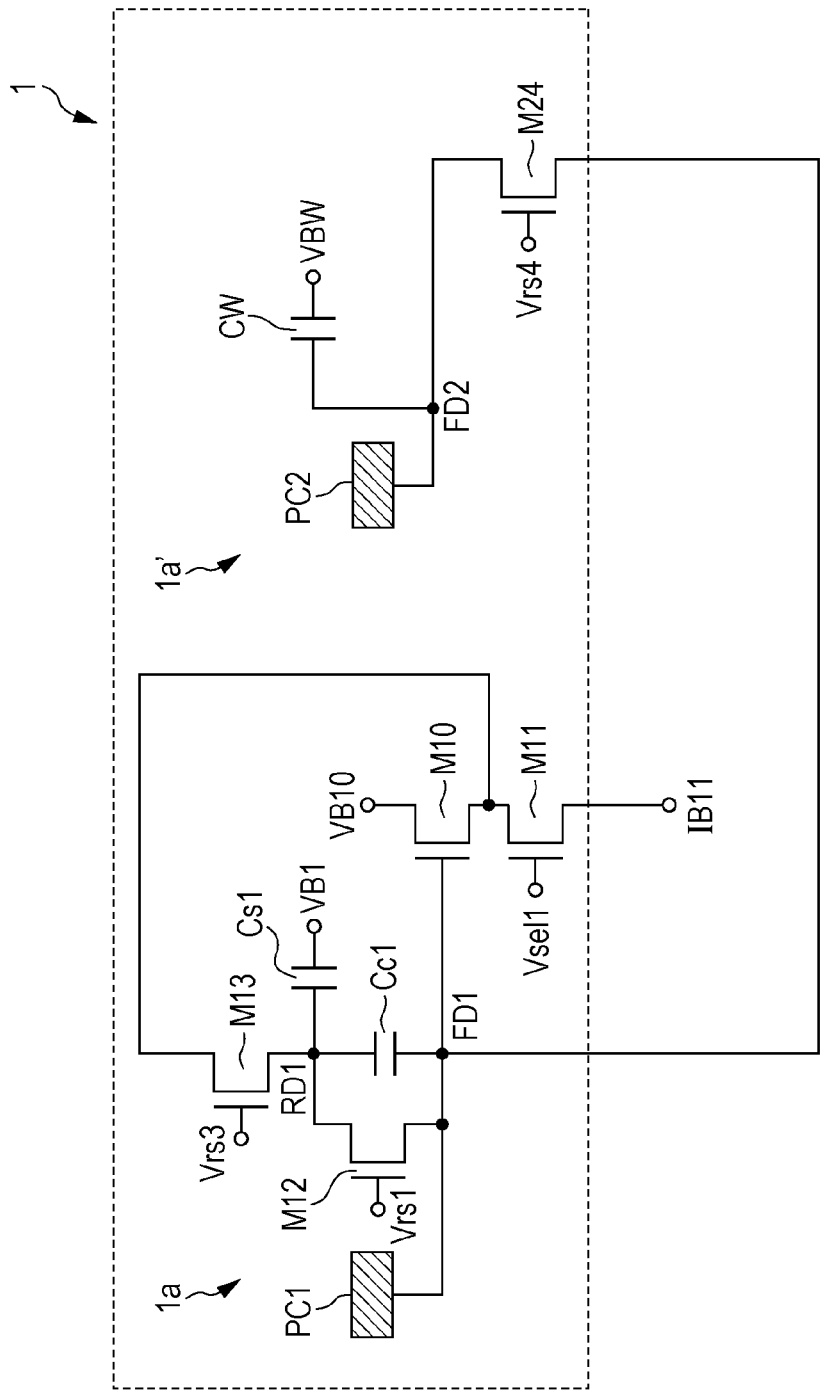
FIG. 25D is a schematic view illustrating another circuit configuration of the unit pixel according to a variation of exemplary First Embodiment.
Figure 25E:
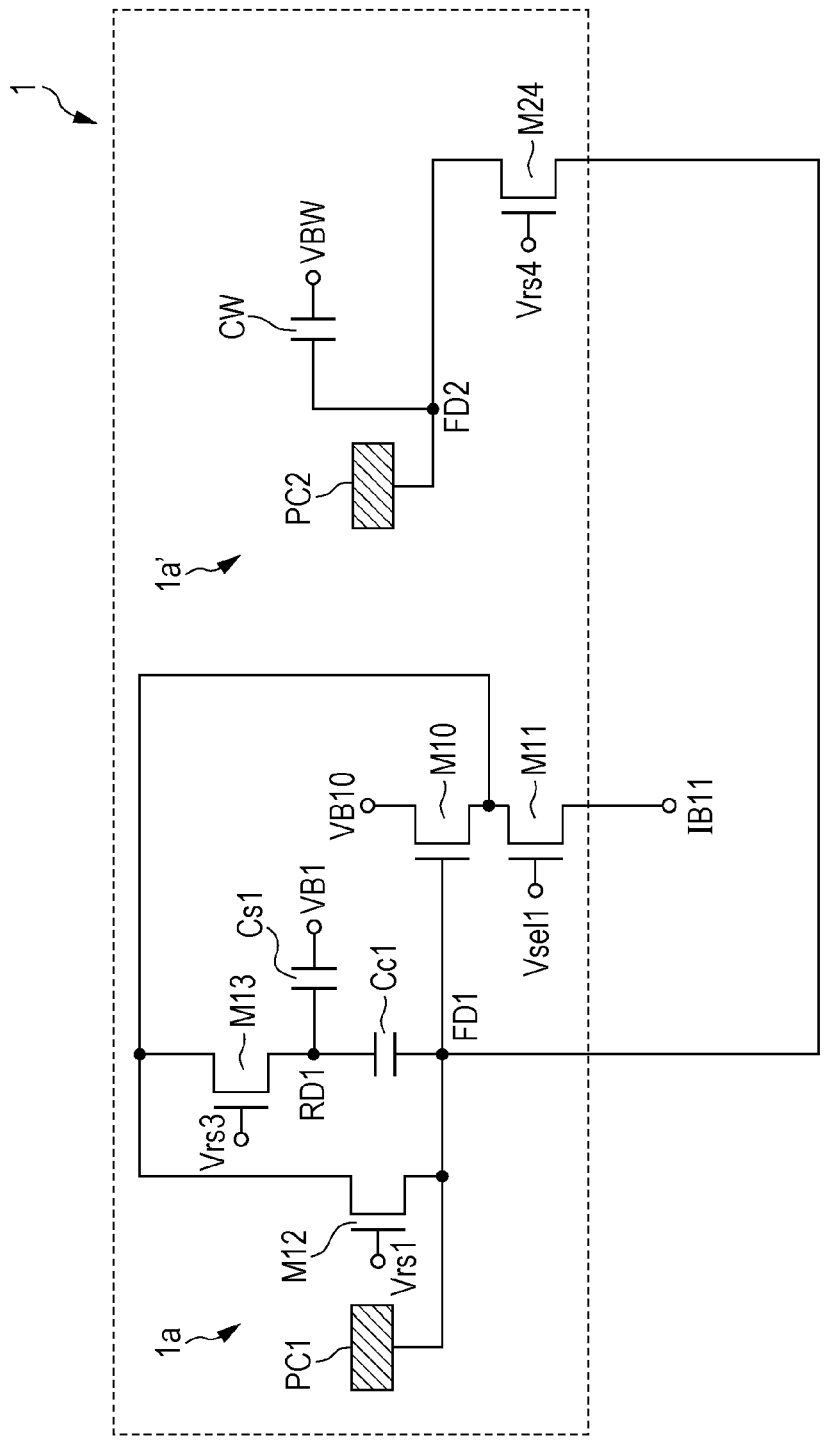
FIG. 25E is a schematic view illustrating another circuit configuration of the unit pixel according to a variation of exemplary First Embodiment.
Figure 25F:
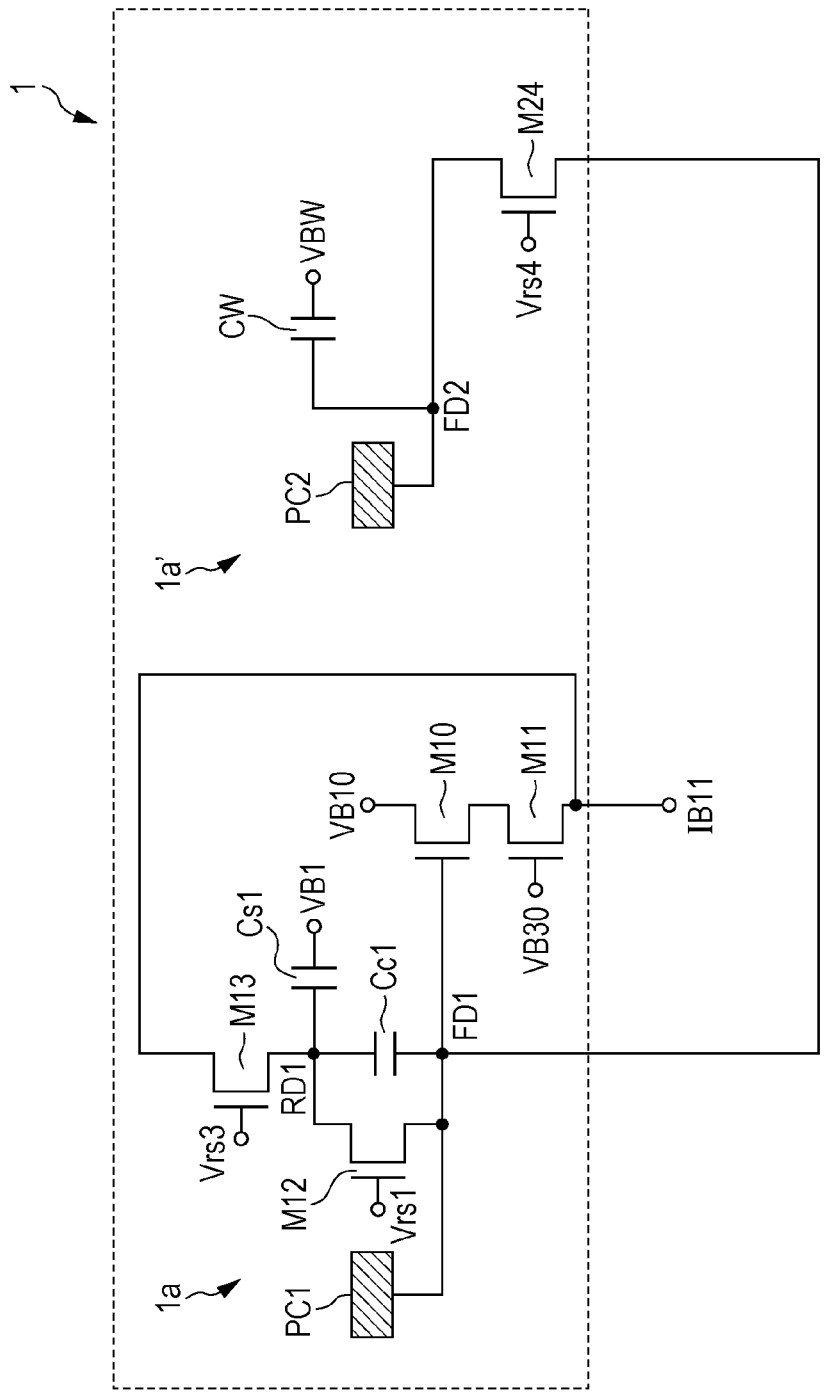
FIG. 25F is a schematic view illustrating another circuit configuration of the unit pixel according to a variation of exemplary First Embodiment.
Figure 25G:
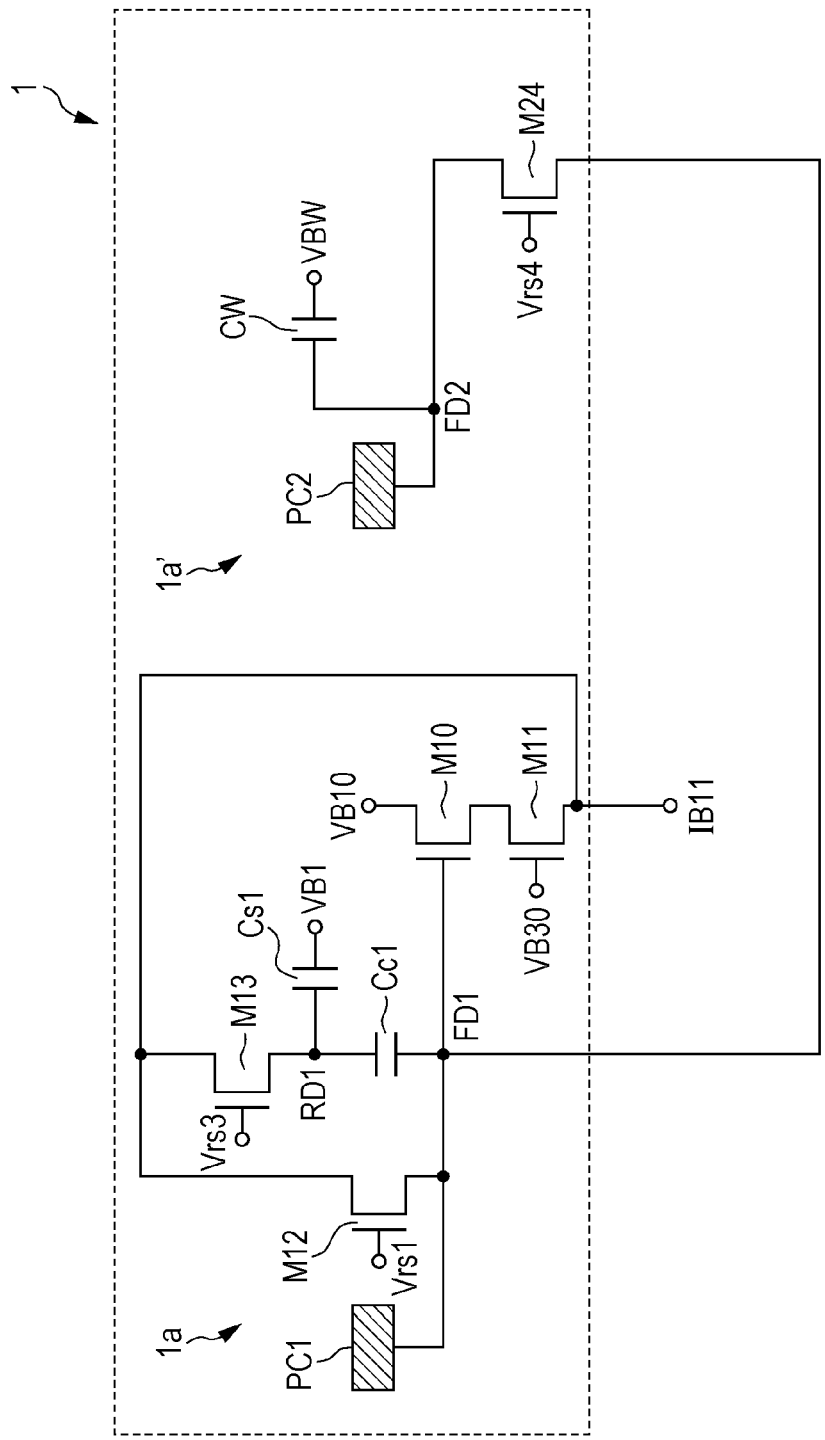
FIG. 25G is a schematic view illustrating another circuit configuration of the unit pixel according to a variation of exemplary First Embodiment.
Figure 25H:
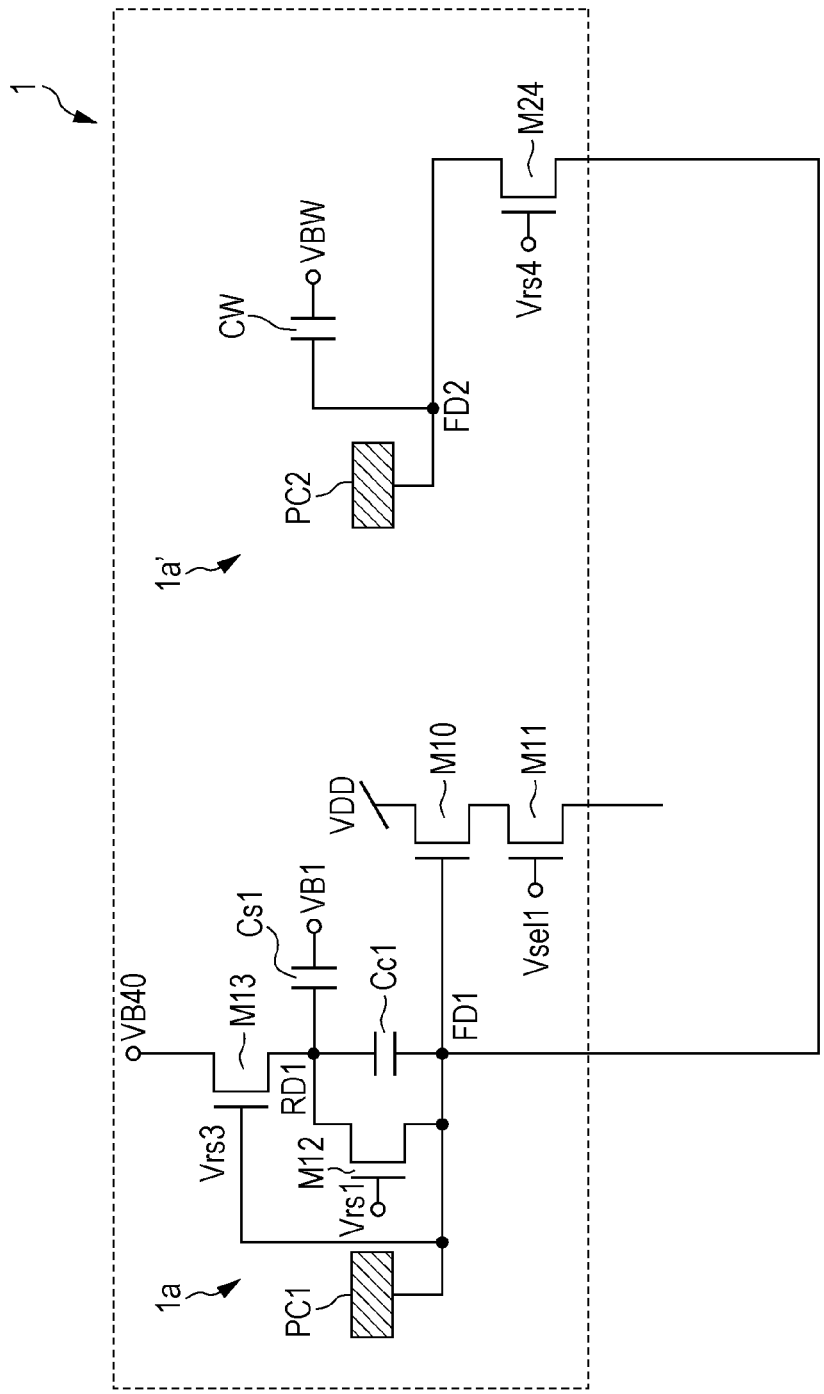
FIG. 25H is a schematic view illustrating another circuit configuration of the unit pixel according to a variation of exemplary First Embodiment.
Figure 25I:
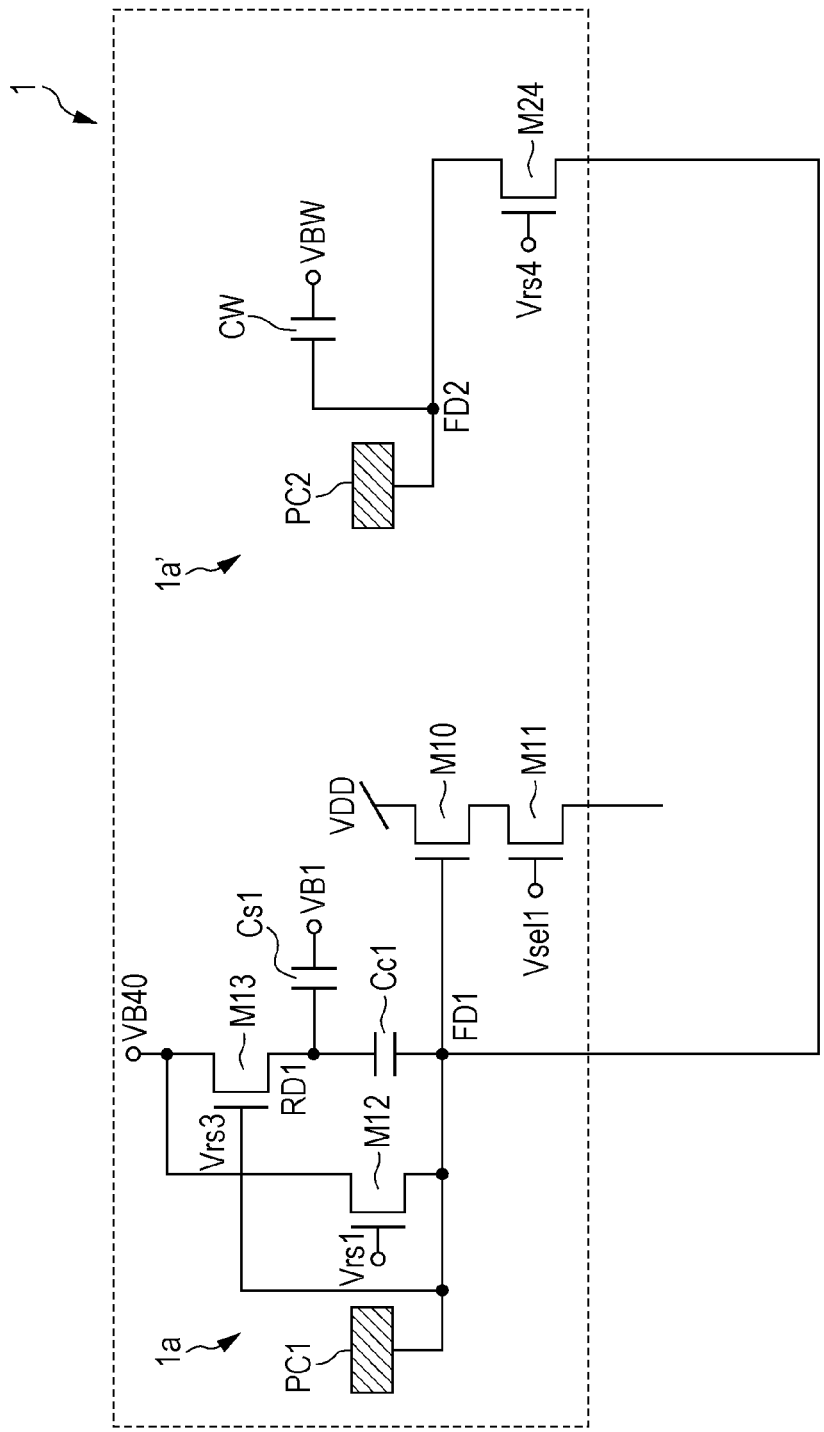
FIG. 25I is a schematic view illustrating another circuit configuration of the unit pixel according to a variation of exemplary First Embodiment.

FIGS. 24 through 25I illustrate other examples of the circuit configuration of the unit pixel 1 according to variations of the present embodiment. The second signal processing circuit P2 illustrated in FIGS. 24 through 25I include only a third reset transistor M24 and a fifth capacitor CW. An electric signal generated by the second photoelectric converter PC2 is read out from the first amplifier transistor M10. In these circuit configurations, the size of the unit pixel 1 is reduced assuming that an increase of kTC noise of the third reset transistor M24 does not pose a problem. Specifically, in the unit pixel 1, the first imaging cell 1a and the second imaging cell 1a' share an amplifier transistor and a selection transistor.

The present disclosure further encompasses a sensor using a photodiode as a photoelectric converter.

Figure 26:
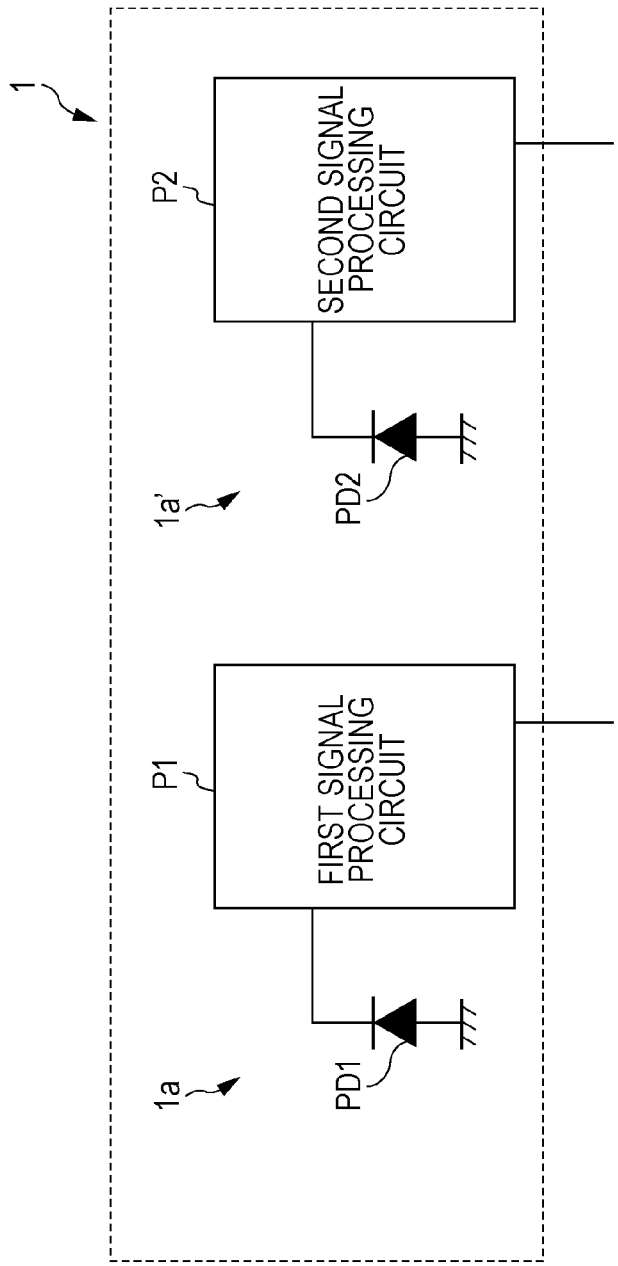
FIG. 26 is a schematic view illustrating a first signal processing circuit and a second signal processing circuit in a unit pixel in which each cell has a photodiode.
Figure 27:
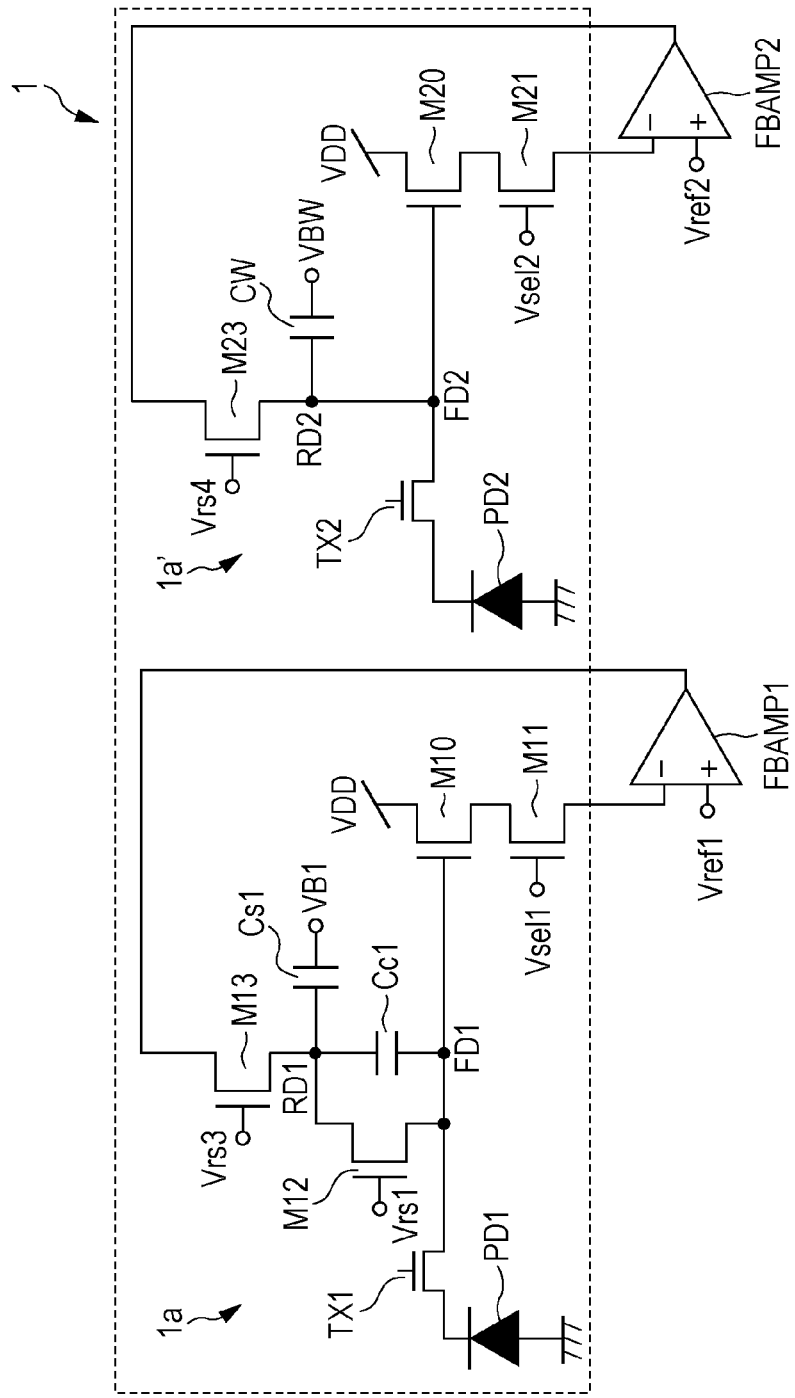
FIG. 27 is a schematic view illustrating a circuit configuration of a unit pixel in which each cell has a photodiode according to a variation of exemplary First Embodiment.

FIG. 26 illustrates the first signal processing circuit P1 and the second signal processing circuit P2 in the unit pixel 1 in which each cell has a photodiode. FIG. 27 illustrates an example of a circuit configuration of the unit pixel 1 in which each cell has a photodiode.

The circuit configuration illustrated in FIG. 27 corresponds to the circuit configuration illustrated in FIG. 9H. In the various variation described above, a photodiode can be used as a photoelectric converter. The following describes a typical example of the circuit configuration of the unit pixel 1 including a photodiode by taking the circuit configuration illustrated in FIG. 27 as an example.

The first imaging cell 1a includes a photodiode PD1 that is a photoelectric converter and a transfer transistor TX1 for transferring an electric charge generated by the photodiode PD1. The electric charge generated by the photodiode PD1 is transferred to FD1 by complete electric charge transfer through the transfer transistor TX1. The second imaging cell 1a' includes a photodiode PD2 that is a photoelectric converter and a transfer transistor TX2 for transferring an electric charge generated by the photodiode PD2. The electric charge generated by the photodiode PD2 is transferred to FD2 by complete electric charge transfer through the transfer transistor TX2. The second imaging cell 1a' has a 4-transistor type pixel circuit configuration. The configurations of the first signal processing circuit P1 and the second signal processing circuit P2 are identical to those described above except for the transfer transistor. Although the transfer transistor TX1 and the transfer transistor TX2 are used in the circuit configuration illustrated in FIG. 27, the transfer transistor TX1 and the transfer transistor TX2 are not essential.

In the example illustrated in FIG. 27, the size of the photodiode PD1 is the same as the size of the photodiode PD2, but an amount of photoelectric conversion of the photodiode PD1 is different from an amount of photoelectric conversion of the photodiode PD2. However, for example, sensitivity of the first imaging cell 1a can be further increased by making a light receiving area of the photodiode PD1 of the first imaging cell 1a larger than a light receiving area of the photodiode PD2 of the second imaging cell 1a'.

As described above, an imaging device according to the present disclosure may be a sensor using a photodiode as a photoelectric converter. An imaging device according to the present disclosure can be suitably used for an on-board camera for sensing. Optimum sensing data can be acquired by causing the first signal processing circuit P1 and the second signal processing circuit P2 to operate under the aforementioned operation condition.

Second Embodiment

A camera system 204 according to the present embodiment is described with reference to FIG. 28.

Figure 28:
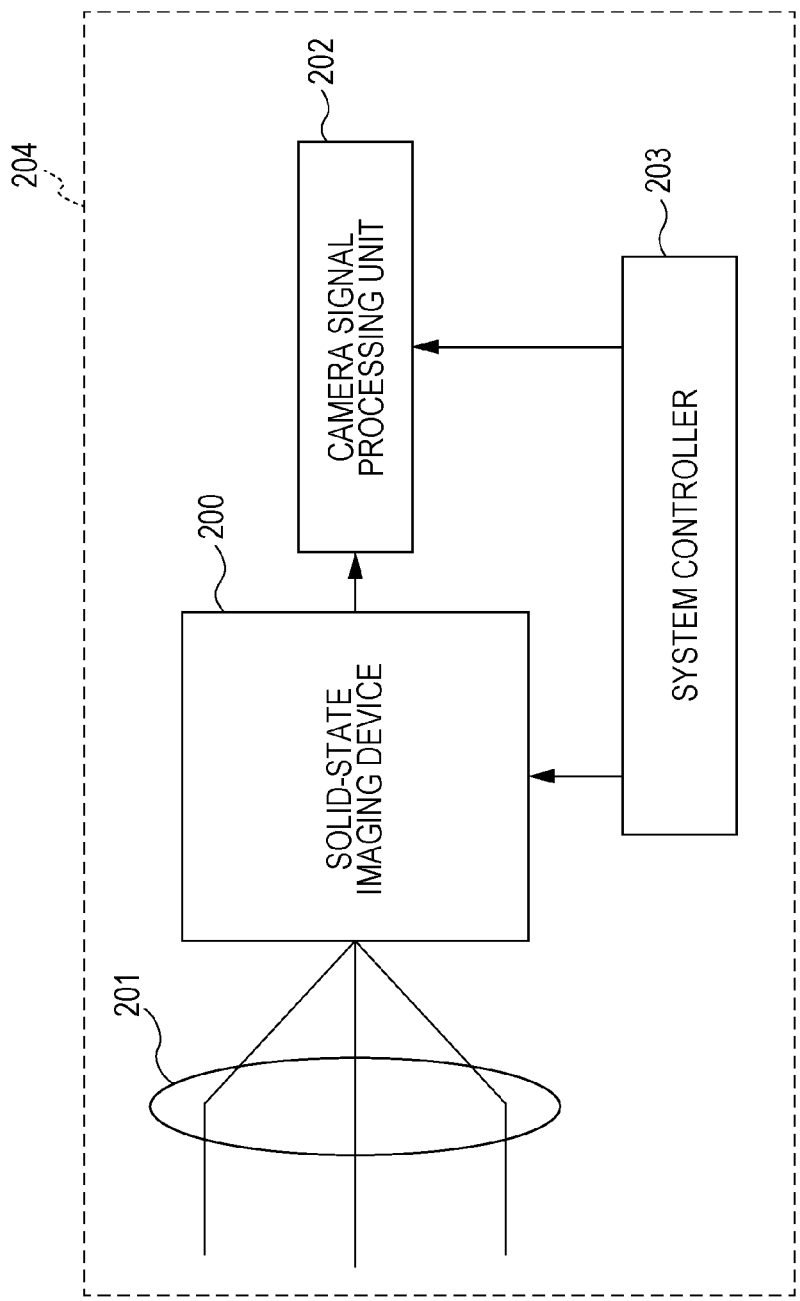
FIG. 28 is a system configuration diagram illustrating a system configuration of a camera system according to exemplary Second Embodiment.

FIG. 28 illustrates a system configuration of the camera system 204 according to the present embodiment. The camera system 204 includes a lens optical system 201, an imaging device 200, a system controller 203, and a camera signal processing unit 202.

The lens optical system 201 includes, for example, an autofocus lens, a zoom lens, and a diaphragm. The lens optical system 201 collects light onto an imaging surface of the imaging device 200. The imaging device 100 having any of the circuit configurations according to First Embodiment can be widely used as the imaging device 200.

The system controller 203 controls the whole camera system 204. The system controller 203 can be, for example, realized by a microcomputer.

The camera signal processing unit 202 functions as a signal processing circuit that processes an output signal from the imaging device 200. The camera signal processing unit 202 performs processes such as gamma correction, color interpolation, spatial interpolation, and auto white balance. The camera signal processing unit 202 can be realized, for example, by a digital signal processor (DSP).

The camera signal processing unit 202 can acquire imaging data from the imaging device 200 and perform sensing based on the imaging data. For example, the camera signal processing unit 202 can calculate a distance to a following vehicle by sensing. As described above, the camera signal processing unit 202 may detect a specific subject in the acquired imaging data and start sensing in response to the detection.

According to a camera system according to the present embodiment, it is possible to provide a camera system that can acquire optimum sensing data by using the imaging device 100 according to First Embodiment and realize low electric power consumption as the whole system.

An imaging device according to the present disclosure is applicable to various camera systems and sensor systems such as a digital still camera, a camera for medical use, a monitoring camera, an on-board camera, a digital single-lens reflex camera, and a digital mirrorless interchangeable lens camera.

What is claimed is:

1. An imaging device comprising:
a first imaging cell including
 a first photoelectric converter that generates a first signal by photoelectric conversion, and
 a first circuit that is electrically connected to the first photoelectric converter and detects the first signal; and
a second imaging cell including
 a second photoelectric converter that generates a second signal by photoelectric conversion, and a second circuit that is electrically connected to the second photoelectric converter and detects the second signal, wherein sensitivity of the first imaging cell is higher than sensitivity of the second imaging cell, a frame rate of the first circuit is lower than a frame rate of the second circuit, and the first circuit is configured to reduce first random noise that occurs when the first signal is reset once, and an amount of reducing the first random noise by the first circuit is greater than an amount of reducing second random noise that occurs when the second signal is reset once by the second circuit.

2. The imaging device according to claim 1, wherein the first circuit is configured to reduce random noise more than the second circuit.

3. The imaging device according to claim 1, wherein a number of capacitors included in the first circuit is larger than a number of capacitors included in the second circuit.

4. The imaging device according to claim 1, wherein
the first photoelectric converter includes a first pixel electrode and a first photoelectric conversion region on the first pixel electrode,
the second photoelectric converter includes a second pixel electrode and a second photoelectric conversion region on the second pixel electrode,
the first circuit includes a first amplifier transistor that detects the first signal, a gate of the first amplifier transistor being electrically connected to the first pixel electrode,
the second circuit includes a second amplifier transistor that detects the second signal, a gate of the second amplifier transistor being electrically connected to the second pixel electrode, and
a gate width of the first amplifier transistor is larger than a gate width of the second amplifier transistor.

5. The imaging device according to claim 1, wherein
the first photoelectric converter includes a first pixel electrode and a first photoelectric conversion region on the first pixel electrode,
the second photoelectric converter includes a second pixel electrode and a second photoelectric conversion region on the second pixel electrode,
the first circuit includes a first reset transistor that resets the first signal, one of a source and a drain of the first reset transistor being electrically connected to the first pixel electrode,
the second circuit includes a second reset transistor that resets the second signal, one of a source and a drain of the second reset transistor being electrically connected to the second pixel electrode, and
a gate length of the first reset transistor is larger than a gate length of the second reset transistor.

6. The imaging device according to claim 1, wherein
the second photoelectric converter includes a second pixel electrode and a second photoelectric conversion region on the second pixel electrode, and
the second circuit includes a first capacitor that is electrically connected to the second pixel electrode, the first capacitor accumulating the second signal.

7. The imaging device according to claim 1, further comprising a first feedback circuit including an inverting amplifier, wherein
the first photoelectric converter includes a first pixel electrode and a first photoelectric conversion region on the first pixel electrode, the first circuit includes a first amplifier transistor that detects the first signal and a first reset transistor that resets the first signal, a gate of the first amplifier transistor being electrically connected to the first pixel electrode, one of a source and a drain of the first reset transistor being electrically connected to the first pixel electrode, and
the first feedback circuit forms a feedback path for negatively feeding back an electric potential of the first pixel electrode via the first amplifier transistor, the inverting amplifier, and the first reset transistor.

8. The imaging device according to claim 7, wherein
the first circuit further includes a first capacitor, a second capacitor having a capacitance value larger than the first capacitor, and a first bandwidth control transistor; one end of the first capacitor being electrically connected to the first pixel electrode, one end of the second capacitor being electrically connected to the other end of the first capacitor, the other end of the second capacitor being set to a reference electric potential, one of a source and a drain of the first bandwidth control transistor being electrically connected to the other end of the first capacitor, and
the first feedback circuit forms a feedback path for negatively feeding back an electric potential of the first pixel electrode via the first amplifier transistor, the inverting amplifier, the first bandwidth control transistor, and the first capacitor.

9. The imaging device according to claim 8, wherein the other one of the source and the drain of the first reset transistor is electrically connected to the one of the source and the drain of the first bandwidth control transistor.

10. The imaging device according to claim 8, wherein the other one of the source and the drain of the first reset transistor is electrically connected to the other one of the source and the drain of the first bandwidth control transistor.

11. The imaging device according to claim 1, further comprising a first feedback circuit, wherein
the first photoelectric converter includes a first pixel electrode and a first photoelectric conversion region on the first pixel electrode,
the first circuit includes a first amplifier transistor that detects the first signal, a first reset transistor that resets the first signal, a first capacitor, a second capacitor having a larger capacitance value than the first capacitor, and a first bandwidth control transistor, a gate of the first amplifier transistor being electrically connected to the first pixel electrode, one of a source and a drain of the first reset transistor being electrically connected to the first pixel electrode, one end of the first capacitor being electrically connected to the first pixel electrode, one end of the second capacitor being electrically connected to the other end of the first capacitor, the other one of the second capacitor being set to a reference electric potential, one of a source and a drain of the first bandwidth control transistor being electrically connected to the other end of the first capacitor,
one of a source and a drain of the first amplifier transistor is electrically connected to the other one of the source and the drain of the first bandwidth control transistor, and
the first feedback circuit forms a feedback path for negatively feeding back an electric potential of the first pixel electrode via the first amplifier transistor, the first bandwidth control transistor, and the first capacitor.

12. The imaging device according to claim 1, further comprising a first feedback circuit, wherein the first photoelectric converter includes a first pixel electrode and a first photoelectric conversion region on the first pixel electrode, the first circuit includes a first amplifier transistor that detects the first signal, a first reset transistor that resets the first signal, a first capacitor, a second capacitor having a larger capacitance value than the first capacitor, a first bandwidth control transistor, and a first selection transistor, a gate of the first amplifier transistor being electrically connected to the first pixel electrode, one of a source and a drain of the first reset transistor being electrically connected to the first pixel electrode, one end of the first capacitor being electrically connected to the first pixel electrode, one end of the second capacitor being electrically connected to the other end of the first capacitor, the other end of the second capacitor being set to a reference electric potential, one of a source and a drain of the first bandwidth control transistor being electrically connected to the other end of the first capacitor, one of a source and a drain of the first selection transistor being electrically connected to one of a source and a drain of the first amplifier transistor, the other one of the source and the drain of the first selection transistor being electrically connected to the other one of the source and the drain of the first bandwidth control transistor, and the first feedback circuit forms a feedback path for negatively feeding back an electric potential of the first pixel electrode via the first amplifier transistor, the first selection transistor, the first bandwidth control transistor, and the first capacitor.

13. The imaging device according to claim 1, wherein the first photoelectric converter includes a first pixel electrode and a first photoelectric conversion region on the first pixel electrode, the first circuit includes a first amplifier transistor that detects the first signal, a first reset transistor that resets the first signal, a first capacitor, a second capacitor having a larger capacitance value than the first capacitor, a first bandwidth control transistor, and a first feedback circuit, a gate of the first amplifier transistor being electrically connected to the first pixel electrode, one of a source and a drain of the first reset transistor being electrically connected to the first pixel electrode, one end of the first capacitor being electrically connected to the first pixel electrode, one end of the second capacitor being electrically connected to the other end of the first capacitor, the other end of the second capacitor being set to a reference electric potential, one of a source and a drain of the first bandwidth control transistor being electrically connected to the other end of the first capacitor, a gate of the first bandwidth control transistor being electrically connected to the first pixel electrode, and the first feedback circuit forms a feedback path for negatively feeding back an electric potential of the first pixel electrode via the first bandwidth control transistor and the first capacitor.

14. The imaging device according to claim 1, wherein a number of saturation electrons of the second imaging cell is larger than a number of saturation electrons of the first imaging cell.

15. The imaging device according to claim 1, wherein a number of frames imaged by the first imaging cell per unit time is different from a number of frames imaged by the second imaging cell per unit time.

16. The imaging device according to claim 1, wherein a number of transistors included in the first circuit is larger than a number of transistors included in the second circuit.

17. An imaging device comprising:
a first imaging cell including
a first photoelectric converter that generates a first signal by photoelectric conversion, and
a first circuit that is electrically connected to the first photoelectric converter and detects the first signal; and
a second imaging cell including
a second photoelectric converter that generates a second signal by photoelectric conversion, and
a second circuit that is electrically connected to the second photoelectric converter and detects the second signal, wherein
sensitivity of the first imaging cell is higher than sensitivity of the second imaging cell,
an operation frequency of the first circuit is higher than an operation frequency of the second circuit,
a specific subject is detected from an image acquired by the second imaging cell; and
sensing using data acquired by the first imaging cell is started in response to detection of the specific subject.

18. The imaging device according to claim 17, wherein a number of saturation electrons of the second imaging cell is larger than a number of saturation electrons of the first imaging cell.

19. An imaging device comprising:
a first imaging cell including
a first photoelectric converter that generates a first signal by photoelectric conversion, and
a first circuit that is electrically connected to the first photoelectric converter and detects the first signal; and
a second imaging cell including
a second photoelectric converter that generates a second signal by photoelectric conversion, and
a second circuit that is electrically connected to the second photoelectric converter and detects the second signal, wherein
sensitivity of the first imaging cell is higher than sensitivity of the second imaging cell,
an operation frequency of the first circuit is higher than an operation frequency of the second circuit,
a specific subject is detected from an image acquired by the first imaging cell, and
sensing using data acquired by the second imaging cell is started in response to detection of the specific subject.

20. The imaging device according to claim 19, wherein a number of saturation electrons of the second imaging cell is larger than a number of saturation electrons of the first imaging cell.

21. An imaging device comprising:
a first imaging cell including
a first photoelectric converter that generates a first signal by photoelectric conversion, and
a first circuit that is electrically connected to the first photoelectric converter and detects the first signal; and
a second imaging cell including
a second photoelectric converter that generates a second signal by photoelectric conversion, and
a second circuit that is electrically connected to the second photoelectric converter and detects the second signal, wherein sensitivity of the first imaging cell is higher than sensitivity of the second imaging cell,
a number of capacitors included in the first circuit is larger than a number of capacitors included in the second circuit, and
a frame rate of the first circuit is different from a frame rate of the second circuit.

\* \* \* \* \*